United States Patent
Itatani et al.

(10) Patent No.: US 6,627,377 B1
(45) Date of Patent: Sep. 30, 2003

(54) POSITIVE PHOTOSENSITIVE POLIYMIDE COMPOSITION

(75) Inventors: Hiroshi Itatani, Yokohama (JP); Shunichi Matsumoto, Kamakura (JP)

(73) Assignee: PI R&D Co., Ltd., Yokohama (JP)

(*) Notice: Subject to any disclaimer, the term of this patent is extended or adjusted under 35 U.S.C. 154(b) by 0 days.

(21) Appl. No.: 09/529,382

(22) PCT Filed: Oct. 12, 1998

(86) PCT No.: PCT/JP98/04577

§ 371 (c)(1),
(2), (4) Date: Jun. 26, 2000

(87) PCT Pub. No.: WO99/19771

PCT Pub. Date: Apr. 22, 1999

(30) Foreign Application Priority Data

| Oct. 13, 1997 | (JP) | 09-315781 |
| Oct. 16, 1997 | (JP) | 09-320266 |
| Dec. 2, 1997 | (JP) | 09-365491 |
| Dec. 22, 1997 | (JP) | 09-370187 |
| Nov. 17, 1997 | (JP) | 09-352987 |
| Nov. 17, 1997 | (JP) | 09-353988 |
| Nov. 25, 1997 | (JP) | 09-363044 |
| Nov. 25, 1997 | (JP) | 09-363045 |
| Nov. 26, 1997 | (JP) | 09-363378 |
| Jan. 5, 1998 | (JP) | 10-31933 |
| Mar. 16, 1998 | (JP) | 10-108410 |

(51) Int. Cl.[7] ............................................. G03F 7/004
(52) U.S. Cl. ...................... 430/270.1; 430/326; 430/905
(58) Field of Search .............................. 430/905, 270.1, 430/326

(56) References Cited

U.S. PATENT DOCUMENTS

| 5,302,489 A | * | 4/1994 | Shu .............................. 430/191 |
| 5,399,655 A | * | 3/1995 | Simmons, III ............... 528/128 |
| 5,502,143 A | | 3/1996 | Oie et al. |

FOREIGN PATENT DOCUMENTS

| JP | A3209478 | 9/1991 |
| JP | 4046345 | 2/1992 |
| JP | A4110348 | 4/1992 |
| JP | A4284455 | 10/1992 |
| JP | A4363361 | 12/1992 |
| JP | 5045882 | 2/1993 |
| JP | 8044062 | 2/1996 |
| JP | A8104808 | 4/1996 |
| JP | 8104808 | * 4/1996 |

OTHER PUBLICATIONS

Derwent abstarct and machine translation of examples and description of JP 8104808, Apr. 1996.*

* cited by examiner

*Primary Examiner*—Rosemary Ashton
(74) *Attorney, Agent, or Firm*—Birch, Stewart, Kolasch & Birch, LLP

(57) ABSTRACT

A photosensitive polyimide composition which is soluble in an organic solvent, which is excellent in adhesiveness, heat resistance, mechanical properties and flexibility, which shows the property of highly sensitive positive-type photoresist that is soluble in alkali upon irradiation with light is disclosed. The polyimide composition of the present invention contains a photoacid generator and a solvent-soluble polyimide which shows positive-type photosensitivity in the presence of said photoacid generator.

46 Claims, No Drawings

POSITIVE PHOTOSENSITIVE POLIYMIDE COMPOSITION

TECHNICAL FIELD

The present invention relates to a positive photosensitive polyimide composition, insulation film formed therefrom and to a method for forming insulation film pattern using the same.

BACKGROUND ART

Photosensitive resin compositions are classified into A) polarity-changing type wherein the polarity of the exposed regions is changed so that the solubility thereof is changed, B) cutting type wherein chemical bonds are cut by exposure and the exposed regions are solubilized, and C) cross-linking type wherein cross-linking reaction proceeds so that exposed regions are insolubilized. The polarity-changing type may be used as either positive working or negative working composition depending on the composition of the developing solution. The cutting type may be used as positive working composition, and the cross-linking type may be used as negative working composition in theory. The cross-linking type photosensitive materials have a disadvantage in carrying out microscopic processing with high resolution that the exposed regions are swollen by the developing with an organic solvent.

In recent years, the molding materials used for overcoating flexible printed circuits, interlayer insulation films of multilayer substrates, insulation films and passivation films of solid elements in semiconductor industry, as well as the interlayer insulation materials of semiconductor integrated circuits and multilayer printed circuit boards are demanded to have good heat resistance. Further, the need to attain higher densification and higher integration demands photosensitive heat-resisting materials.

The semiconductor substrates which are used as semiconductor integrated parts in microelectronic industry are covered with photoresists. Photoresist relief structures are formed by forming images and subsequent development of the photoresist layers. The relief structures are used as the masks for preparing circuit patterns on the semiconductor substrates. By this processing cycle, the relief structure of a microchip can be transferred to a substrate.

Photoresists include two different types, that is, positive working photoresist and negative working photoresist. These are different in that the exposed regions of the positive working photoresist is removed by development so that the non-developed regions are left on the substrate, while the exposed regions of the negative working photoresist are left as the relief structure. The positive working photoresists have intrinsically high image resolutions so that they are suited for production of VLSIs (large scale integrated circuits).

Conventional positive working photoresists contain a type of novolak resin which is soluble in aqueous alkali and a photosensitive quinone diazide which decreases the solubility of the resin in alkali. When the photoresist layer is irradiated, the quinone diazide is photoexcited so as to be converted to carboxylic acid, so that the solubility in alkali of the exposed regions is increased. Thus, by developing the photoresist with an aqueous alkali, a positive working photoresist relief structure is obtained (U.S. Pat. No. 36,664,735 etc).

The characteristics of the photoresist compositions used in industries are the solubility of the photoresist in the solvent to be applied, the photosensitization rate of the photoresist, the developing contrast, the solubility of the developing solution acceptable from the view point of environment, adhesiveness of the photoresist, dimensional stability at high temperatures, and abrasion resistance.

The photoresist relief structures obtained by the exposure and development are usually subjected to heat treatment (postbake) at a temperature of 120° C. to 180° C. The purpose of this treatment is to promote the adhesiveness of the photoresist with the substrate, curing of the photoresist structure, and removal of all of the remaining volatile components to decrease the erosion in the subsequent etching step.

However, in plasma etching, the substrates are subjected to a temperature higher than 200° C. The photoresists containing as the base a novolak resin and a stabilizing improver cannot be thermally stabilized at a temperature of not lower than 180° C.

Polyimide resins are resistant to high temperature of about 400° C. and are stable to chemicals. Therefore, they are useful in forming heat-resisting photoresist layers, Conventional polyimide photoresists are negative-type photoresists. The system of the negative-type photoresists is based on polyamic acid polymer having photoreactive side chains. However, this basic material has problems in that it has a poor storage stability, a very slow sensitizing rate, and an excess structural shrinkage after development and curing (the rate of shrinkage after baking is about 60%). With this composition, to attain a high resolution, exposure of about 10 minutes is necessary. Further, high concentration solutions thereof for forming thick films have especially poor storage stabilities.

With positive-type photoresists, high resolution is attained, exposure time is short and developing properties with alkali are excellent. Positive working high temperature type photoresist having phenol group was developed. A polyoxazole precursor was synthesized by the reaction between 3,3'-dihydroxy-4,4'-diaminobiphenyl and isophthalic acid dichloride. This composition is mixed with o-quinone diazide or naphthoquinone diazide to form a high sensitive positive working photosensitive polyoxazole precursor, and polyoxazole having a heat resistance and mechanical properties comparable to those of polyimide membrane is formed after processing (U.S. Pat. No. 4,339,521 and U.S. Pat. No. 4,395,482).

A solvent-soluble polyimide was synthesized by the reaction of hexafluoro-2,2-bis(hydroxyaminophenol)propane with hexafluoro-2,2-bis-(dicarboxyphenyl)propane dianhydride (6FDA) or with 3,4,3',4'-benzophenone tetracarboxylic acid dianhydride (BTDA) or with 5,5'-oxy-bis-1,3-isobenzofurandione (4,4'-oxydiphtalic acid dianhydride), and positive working photosensitive polyimides were prepared by mixing the polyimides and o-naphthoquinone diazide, respectively. In this method (Japanese Laid-open Patent Application (Kokai) No. 64-60630 and U.S. Pat. No. 4,927,736), the fluorine atom-containing polyimides are soluble in polar solvents. A novel method in which polyimide solutions are directly formed by heating the polyimide at 140 to 160° C. in the presence of p-toluene sulfonic acid as a catalyst was employed. However, to separate the catalyst and the polyimide, a method in which the polyimide solution is poured into methanol to recover the polyimide resin as precipitates and the precipitates are re-dissolved, is employed, which method is unsuitable for industrial application.

Phenol group or carboxyl group is protected with tetrahydro-2H-pyranyl group to vanish the solubility in alkali. By adding a photoacid generator to the resultant and by irradiating the resulting composition with light, an acid is generated. By this acid, the block of the hydroxyl group or carboxyl group is decomposed so that the material is converted to soluble in alkali. By carrying out heat treatment after exposure, a plurality of blocks are catalytically removed by the acid, so that an amplification effect is obtained, thereby the composition is highly sensitized (T. Omote et al.; Macromol., 23, 4788 (1990), K. Naitoh et al.; Polym. Adv. Technol. 4, 294 (1993), K. Naitoh et al.; J. Photopolym. Sci. Technol. 4, 294 (1993), T. Yamaoka et al.; Photosensitive Polyimides Fundamental & Application, 177–211, Technomic Publish Company Inc. USA(1995)).

A positive-type photosensitive polyamic acid was reported, wherein the carboxyl group of polyamic acid is converted to ester of 2-nitrobenzyl alcohol to prevent dissolution in alkali, and upon irradiation with light, the ester of the 2-nitrobenzyl group is decomposed to generate a carboxylic acid so that the compound is converted to soluble in alkali (S. Kubota et al.; J. Macromol. Sci. Chem. A24 (10) 1407 (1987), Ao Yamaoka et al.; Polyfile 2, 14(1990)).

DISCLOSURE OF THE INVENTION

An object of the present invention is to provide a photosensitive polyimide composition which is soluble in organic solvents, which excels in adhesiveness, heat resistance, mechanical properties and flexibility, which shows properties of alkali-soluble highly sensitive positive-type photoresist upon irradiation with light.

The present inventors intensively studied to discover that, by combining a solvent-soluble polyimide and a photoacid generator, a highly sensitive positive-type photosensitive polyimide composition which is alkali-soluble upon irradiation with light is obtained, and that the insulation film made of the positive-type photosensitive polyimide composition excels in adhesiveness, heat resistance, mechanical properties and flexibility, thereby completing the present invention.

That is, the present invention provides a positive-type photosensitive polyimide composition comprising photoacid generator and solvent-soluble polyimide which shows positive-type photosensitivity in the presence of the photoacid generator. The present invention also provides a positive-type photosensitive resin film prepared by making the above-mentioned composition, according to the present invention, dissolved in a solvent, into the form of film. The present invention also provides a polyimide insulation film having a pattern, which is prepared by coating, on a substrate, the above-mentioned composition, according to the present invention, dissolved in a solvent, drying the composition, exposing an image pattern on the composition to irradiation with light or electron beam, and removing the exposed regions with an alkaline developing solution. The present invention further provides a method for forming a polyimide insulation film pattern comprising coating the composition on a substrate, according to the present invention, drying the composition, exposing an image pattern on the composition to irradiation with light or electron beam, and removing the exposed regions with an alkaline developing solution.

By the present invention, positive-type photosensitive polyimide compositions which are alkali-soluble upon irradiation with light were provided. The positive-type photosensitive polyimide compositions according to the present invention have high sensitivities. That is, with the polyimide compositions according to the present invention, very high imaging resolutions are attained. The insulation films made from the positive-type photosensitive polyimide compositions according to the present invention are excellent in adhesiveness, heat resistance, mechanical properties and flexibility. Therefore, the insulation films are of polyimide having high heat resistance, electric insulation and adhesiveness, so that they may be widely used in the field of production of semiconductors, electronic parts and the like.

BEST MODE FOR CARRYING OUT THE INVENTION

As mentioned above, the positive-type photosensitive polyimide composition according to the present invention comprises a photoacid generator and a solvent-soluble polyimide which shows positive-type photosensitivity in the presence of the photoacid generator.

The term "photoacid generator" herein means a compound which generates an acid upon irradiation with light or electronic beam. Since the polyimide is decomposed by the action of the acid and is soluble in alkalis, the photoacid generator employed in the present invention is not restricted and any compound which generates an acid upon irradiation with light or electron beam may be employed. Preferred examples of the photoacid generator include photosensitive quinone diazide compounds and onium salts.

Preferred examples of the photosensitive quinone diazide compounds include esters of 1,2-naphthoquinone-2-diazide-5-sulfonic acid and 1,2-naphthoquinone-2-diazide-4-sulfonic acid, the counterparts of the esters being low molecular aromatic hydroxyl compounds such as 2,3,4-trihydroxybenzophenone, 1,3,5-trihydroxybenzene, 2-methylphenol, 4-methylphenol and 4,4'-hydroxy-propane. Preferred examples of the onium salts include aryl diazonium salts such as 4(N-phenyl)aminophenyl diazonium salt; diaryl halonium salts such as diphenyl iodonium salt; triphenyl sulfonium salts such as bis{4-(diphenylsulfonio) phenyl}sulfide, and bis-hexafluoroantimonate, but the preferred onium salts are not restricted to these.

The polyimide contained in the polyimide composition according to the present invention consists essentially of one or more aromatic diamine components and one or more aromatic acid components, and is produced by direct imidation reaction between one or more aromatic diamines and one or more aromatic tetracarboxylic dianhydrides.

Preferred examples of the aromatic diamine components (described in the form of monomers) constituting the polyimide contained in the polyimide composition according to the present invention include 4,4'-diaminodiphenyl ether, 3,4'-diaminodiphenyl ether, bis(4-phenoxy)1,4-benzene, bis (4-phenoxy)1,3-benzene, bis(3-phenoxy)1,3-benzene, 2,2-bis(4-aminophenyl)propane, 1,1,1,3,3,3-hexafluoro-2-bis(4-aminophenyl)propane, 4,4'-diaminophenylmethane, bis(4-aminophenoxy)4,4'-diphenyl, 2,2-bis{(4-aminophenoxy) phenyl}propane, 2,2-bis{(4-aminophenoxy) phenyl}hexafluoropropane, 1,3-diaminobenzene, 1,4-diaminobenzene, 2,4-diaminotoluene, 3,3'-dimethyl-4,4'-diaminobiphenyl, 2,2'-bis(trifluoromethyl)benzidine, α,α'-bis(4-aminophenyl)-1,4-diisopropylbenzene, bis(4-aminophenoxy)-1,3-(2,2-dimethyl)propane and diaminosiloxane. These aromatic diamine components may be employed individually or in combination.

Preferred examples of the aromatic acid components (described in the form of monomers) constituting the polyimide contained in the polyimide composition according to the present invention include 3,4,3',4'-benzophenone tetracarboxylic dianhydride, 3,4,3',4'-biphenyltetracarboxylic dianhydride, pyromellitic dianhydride, 3,4,3',4'-biphenyl ether tetracarboxylic dianhydride, 1,2,5,6-naphthalene tetracarboxylic dianhydride, 2,3,5,6-pyridine tetracarboxylic dianhydride, 3,4,3',4'-biphenylsulfone tetracarboxylic dianhydride, bicyclo(2,2,2)-oct-7-ene-2,3,5,6-tetracarboxylic dianhydride, 4,4'-{2 and 2,2-trifluoro-1-(trifluoromethyl)ethylidene}bis(1,2-benzene dicarboxylic dianhydride). These aromatic acid components may be employed individually or in combination.

It is preferred to employ one or more aromatic diamines, which have one or more carbonyl groups, nitro groups, methoxy groups, sulfonic groups, sulfide groups, anthracene groups or fluorene groups (hereinafter referred to as "photosensitive aromatic diamine"), as the one or more aromatic diamines constituting the polyimide, because they are easily photoexcited upon irradiation with UV after adding a photoacid generator, so that images can be formed with high sensitivity and high resolution with smaller dose of irradiation.

As the preferred photosensitive aromatic diamines, firstly, dialkyl-diamino-bisphenyl sulfone and dialkoxy-diamino-biphenyl sulfone such as 3,3'-dimethyl-4,4'-diamino-biphenylsulfone and 3,3'-dimethoxy-4,4'-diamino-biphenylsulfone are exemplified. The polyimides containing such biphenyl sulfones are linear polymers having high mechanical strengths and high moduli of elasticity, so that they are studied as highly elastic polyimide fibers, and also as gas separation membranes because they can be made into films. They can be used as fibers or films, and also as photosensitive films. As shown in the Examples below, these polyimides containing biphenyl sulfone do not show photosensitivity even if Michler's ketone which is a sensitizer or a radical generator is added. It was discovered, however, that they are soluble in alkalis by irradiation with light after adding a quinone diazide compound. Even if the molecular weight (based on polystyrene) is changed to 30,000, 50,000 and 100,000, the polyimides are soluble in alkalis. From this fact, it is thought that the quinone diazide is photodecomposed to generate a radical and simultaneously to be converted to indene acid, and the product interacts with the polyimide groups and biphenyl sulfone groups, so that the polyimide is converted to be alkali-soluble. That is, by UV irradiation, the quinone diazide compound is photodecomposed and indene acid is further generated. As a result, the alkyl group or alkoxy group on the biphenyl group is activated so that the sulfone bond is cleaved, and indene acid is added thereto, thereby increasing the solubility of the polyimide in alkalis.

Additional preferred examples of the photosensitive aromatic diamines include 9,9-bis(aminophenyl)fluorene and 9,9-bis(aminoalkyl-phenyl)fluorene. The polyimides containing such fluorenes are linear polymers having high mechanical strengths and high moduli of elasticity, so that they are polyimides having excellent film properties, and having excellent properties when formed into gas separation membranes. They can be used as fibers or films, and also as photosensitive films. As shown in Examples below, these polyimides do not show photosensitivity even if Michler's ketone which is a sensitizer or a radical generator is added. It was discovered, however, they are converted to be soluble in alkalis by irradiation with light after adding a quinone diazide compound. Even if the molecular weight (based on polystyrene) is changed to 30,000, 50,000 and 100,000, they interact with the radical and the acid produced by photolysis of the quinone diazide to form alkali-soluble polyimides, which give clear positive-type images. More particularly, 9,9-bis(aminophenyl)fluorene is synthesized from fluorenone and aniline in the presence of an acid catalyst (Beilstein 13,III,548a). Fluorenone is a photosensitizer which is used as widely as Michler's ketone and benzanthrone. Although fluorenone-containing polyimides are sensitized by irradiation with light, they are usually not photodecomposed. It was discovered, however, if a quinone diazide co-exists, the quinone diazide generates a radical by irradiation with light, and radical becomes indene acid that interacts with the polyimide, so that the bis(aminophenyl) fluorene-containing polyimides are soluble in alkalis. This is presumably because that the SP3 carbon structure at the 9-position of the bis(aminophenyl)fluorene group in the polyimide chain is temporarily stabilized by resonance and is changed to SP2 carbon structure, so that the aniline group is eliminated and the polyimide chain is cleaved. Various fluorenone derivatives are known. For example, there are 2-nitro compounds, 2,7-dinitro compounds and 7-chloro compounds. Similarly, as for aniline, various derivatives such as 2-methylaniline and 2-methoxyaniline are known. From the above-described fluorenone derivatives and the aniline derivatives, various 9,9-bis(aminophenyl)fluorene derivatives are produced in the presence of an acid catalyst. These derivatives also constitute positive-type photosensitive compositions. By using benzathrone compounds in place of the fluorenone, positive-type photosensitive polyimide compositions are also obtained.

Additional preferred examples of the photosensitive aromatic diamines are nitro aromatic diamines. In 1,4-diamino-2-nitrobenzene and/or 3,3'-dinitro-4,4'-diaminobiphenyl, the O atom of nitro radical interacts with the N atom of imide bond. Nitro group and benzene ring are excited by electron resonance upon irradiation with light, and the oxygen atom in the nitro group acts on the N atom in the imide group to increase the electron effect. It is presumed that the proton generated from the diazoquinone by light irradiation attacks the N atom in the imide bond to cut the imide bond to generate amide bond, and thus the polyimide is soluble in alkalis. Preferred examples of the nitro aromatic diamines include 1,4-diamino-2-nitrobenzene, 1,5-diamino-2-nitrobenzene, 3-nitro-4,4'-diaminobiphenyl, 3,3'-dinitro-4, 4'-diaminobiphenyl and the like. Among these, 1,4-diaminonitrobenzene and 3,3-dinitro-4,4'-diaminobiphenyl are especially preferred.

Another preferred example of the photosensitive aromatic diamines is 1,5-diaminoanthraquinone. In 1,5-diaminoanthraquinone-containing polyimides, the anthraquinone is easily photoexcited. It is presumed that the carbonyl radical of imide bond exerts electron effect to carbonyl radical in anthraquinone, that the proton generated from the diazoquinone by light irradiation attacks the N atom in the imide bond to cut the imide bond to generate amide bond, so that the polyimide is soluble in alkalis. Anthraquinone is also a photosensitizer and positive-type patterns are effectively formed with small dose of energy irradiation. Compounds which have similar action to that of 1,5-diaminoanthraquinone include 2,4-diaminoacetophenone, 2,4-diaminobenzophenone, 2-amino-4'-aminobenzophenone, 2-amino-5-aminofluorenone and the like, and these compounds may be employed. Preferably, 1,5-diaminoanthraquinone is used.

Additional preferred examples of the photosensitive aromatic diamines include diphenyl sulfide group-containing diamines such as 4,4'-diaminodiphenyl sulfide. In this case, the diphenyl sulfide group is contained in the main chain. It is presumed that the diphenyl sulfide in the main chain of the polyimide generates an acid upon irradiation with light in the presence of a quinone diazide and the acid is bound to the sulfide group so as to convert the sulfide group to thiol, which is alkali-soluble. The diphenyl sulfide groups in the main chain of the polyimide may be those originated from a diamino compound such as 4,4'-diaminodiphenyl sulfide, 3,4'-diaminodiphenyl sulfide, 4,4'-diamino-3,3'-dimethyl sulfide, bis(4-aminophenoxyphenyl) sulfide, thionine or the like. Among these, 4,4'-diaminodiphenyl sulfide which is easily available and which is highly effective is preferred.

Additional preferred examples of the photosensitive aromatic diamines are diphenyl disulfide group-containing diamines such as 4,4'-diaminodiphenyl disulfide. In this case, the diphenyl disulfide is contained in the main chain. It is thought that the polyimides containing diphenyl disuslfide in the main chain easily bind to the proton generated from the quinone diazide by irradiation with light so as to be converted to two thiol molecules. In fact, disulfide compounds are more easily cleaved than sulfide compounds and give sharper patterns. The diphenyl disulfide in the polyimide main chain may be originated from a diamino compound such as 4,4'-diaminodiphenyl disulfide, 3,4'-diaminodiphenyl disulfide, 4,4'-diamino-3,3'-dimethyl disulfide, bis(4-aminophenoxyphenyl)disulfide, thionine or the like. Among these, 4,4'-diaminodiphenyl disulfide which is easily available and which is highly effective is preferred.

Another preferred example of the photosensitive aromatic diamines is 9,10-bis(4-aminophenyl)anthracene. Solvent-soluble positive-type photosensitive polyimides containing 9,10-bis(4-aminophenyl)anthracene in the main chains are linear polymers having high mechanical strengths and high moduli of elasticity, so that they are studied as highly elastic polyimide fibers, and also as gas separation membranes because they can be made into films. They can be used as fibers or films, and also as photosensitive films. Anthraquinone is easily photoexcited upon irradiation with light, so that it is widely used as a sensitizer. It is presumed that 9,10-bis(4-aminophenyl)anthracene group is sensitized and activated upon irradiation with light, and if a quinone diazide exists, it interacts with the acid generated by the photolysis of the quinone diazide, so that the aminophenyl groups on the 9- and 10-positions are attacked by the proton so as to be eliminated from the anthracene group, thereby generating anthraquinone. It is presumed that, as a result, the polyimide is soluble in alkalis, so that clear positive-type images can be formed. As can be seen from the fact that anthraquinone is known as a sensitizer, the photosensitizing effect of this system is large, so that it is not necessary to co-employ a separate sensitizer. Positive-type patterns are effectively formed by irradiation of small energy for a short time.

Additional preferred examples of the photosensitive aromatic diamines are aromatic amines having biphenyl sulfone, such as 3,3'-diaminodiphenyl sulfone, 4,4'-diaminodiphenyl sulfone, bis-{4-(3-aminophenoxy)biphenyl}sulfone and bis{4-(4-aminophenoxy)biphenyl}sulfone. In this case, the biphenyl sulfone are contained in the main chain of the polyimide. The polyimides containing biphenyl sulfone are linear polymers having high mechanical strengths and high moduli of elasticity, so that they are studied as highly elastic polyimide fibers, and also as gas separation membranes because they can be made into films. They can be used as fibers or films, and also as photosensitive films. It was discovered as shown in the Examples below, that they are soluble in alkalis by irradiation with light after adding a quinone diazide compound. Even if the molecular weight (based on polystyrene) is changed to 40,000, 100,000 and 150,000, the polyimides are converted to be soluble in alkalis. From this fact, it is thought that the quinone diazide is photodecomposed to generate a radical and simultaneously to be converted to indene acid, and they interact with biphenyl sulfone photo-excited by irradiation with light so as to decompose the biphenyl sulfone to phenyl sulfonic acid, so that the polyimide is alkali-soluble. By UV irradiation, the quinone diazide compound is photodecomposed and indene acid is further generated. It is presumed that, as a result, the biphenyl group is activated and the sulfone bond is cleaved by the action of indene acid to produce phenyl sulfonic acid, thereby increasing the solubility of the polyimide in alkalis.

Additional preferred examples of the photosensitive aromatic diamines include bis{4-(4-aminophenoxy)phenyl}sulfone, bis{4-(3-aminophenoxy)phenyl}sulfone, o-tolidine sulfone, 4,4'-diaminobenzophenone, 3,3'-diaminobenzophenone, 2-nitro-1,4-diaminobenzene, 3,3'-dinitro-4,4'-diaminobiphenyl, 3,3'-dimethoxy-4,4'-diaminobiphenyl and 1,5-diaminonaphthalene.

The above-mentioned various photosensitive aromatic diamines may be employed individually or in combination.

By employing an aromatic diamine into which hydroxyl group, pyridine group, oxycarbonyl group or tertiary amine group is introduced (hereinafter also referred to as "alkali-solubility-increasing aromatic diamine"), the aromatic diamine is bound to or interacts with the acid produced by the photoacid generator, so that positive-type images are more easily formed by alkali treatment.

As the preferred alkali-solubility-increasing aromatic diamines, firstly, diaminopyridine and diaminoacridinium are exemplified. Weakly basic pyridine groups contained in the polyimide main chain forms acid-base bond with the acid generated by UV irradiation of diazonaphthoquinone so that the polyimide becomes soluble in alkalis. The diaminopyridine in the main chain of the polyimide may be 2,6-diaminopyridine, 3,5-diaminopyridine, 3,5-diamino-2,4-dimethylpyridine and the like. Preferably, 2,6-diaminopyridine or 3,5-diaminopyridine is employed. As the compounds having pyridine ring, diaminoacridium may be used. For example, acriflavin, Acridine Yellow, proflavin and the like may be employed, and acriflavin is preferred.

Additional preferred examples of the alkali-solubility-increasing aromatic diamines are hydroxyl group-containing or alkoxyl group-containing aromatic diamines which are diaminodihydroxybenzene, diaminodihydroxybiphenyl or diaminodialkoxybiphenyl. These hydroxyl group-containing or alkoxyl group-containing aromatic diamines are preferably contained as one component in the polyimide containing not less than two types of aromatic diamine components. Preferred examples of these aromatic diamines include 1,4-diamino-2-hydroxybenzene, 3,3'-dihydroxy-4,4'-diaminobiphenyl and 3,3'-dimethoxy-4,4'-diaminobiphenyl. The hydroxyl groups and the methoxy groups in the polyimide main chain are bound to the acid produced by the light irradiation of the quinone diazide so that the polyimide is soluble in alkalis.

Another preferred example of the alkali-solubility-increasing aromatic diamines is 1,4-bis(3-aminopropyl)piperazine (hereinafter referred to as "diaminopiperazine"). This is preferably contained in the polyimide main chain together with other aromatic diamine(s). The diaminopiperazine contained in the polyimide main chain together with the aromatic diamine(s) is a highly basic compound having two tertiary amines. Therefore, the piperazine group is bound to the carboxylic acid generated by light irradiation of the diazonaphthoquinone so as to form acid-base bond, so that the polyimide is soluble in alkalis.

Another preferred example of the alkali-solubility-increasing aromatic diamines is 3,9-bis(3-aminopropyl)2,4, 8,10tetraoxaspiro-(5,5)-undecane. This is preferably contained in the polyimide main chain together with other aromatic diamine(s). Diaminotetraoxaspiroundecane is known to be decomposed by an acid to aldehyde and alcohol. It is presumed that the tetraoxaspiro group in the polyimide main chain of the polyimide containing diaminotetraoxaspiroundecane is decomposed by the action of the carboxylic acid generated by the light irradiation so that the polyimide is soluble in alkalis, thereby the polyimide shows the characteristics of positive-type photosensitive photoresists.

Additional preferred examples of the alkali-solubility-increasing aromatic diamines are acid amides of diaminobenzoic acid. In this case, the polyimide main chain preferably contains not less than two types of aromatic diamine components and one of them is acid amide of diaminobenzoic acid. Preferred examples of the acid amide of diaminobenzoic acid are morpholine amide and N-methylpiperazine amide of 3,5-diaminobenzoic acid. However, the acid amide of diaminobenzoic acid is not restricted thereto, and aliphatic primary, secondary and tertiary amines may be employed, and alcohols and aliphatic amines containing these bases may also be employed. Here, the number of carbon atoms in "aliphatic amine" is not restricted, but about 2 to 6 is usually preferred.

Additional preferred examples of the alkali-solubility-increasing aromatic diamine are 3,5-diaminobenzoic acid and 2-hydroxy-1,4-diaminobenzene.

The above-described various photosensitive diamines, may be employed individually or in combination.

Use of the above-described photosensitive aromatic diamine and/or alkali-solubility-increasing aromatic diamine is not indispensable, and the polyimides constituted by the combination of the above-mentioned one or more aromatic diamine components and the one or more aromatic acid components may be employed. Especially, in cases where electron beam is used for exposure, good positive-type images may be formed with high sensitivity even without using the photosensitive aromatic diamine and/or the alkali-solubility-increasing aromatic diamine.

The diamine component of the polyimide may be constituted by the above-mentioned photosensitive aromatic diamine and/or alkali-solubility-increasing aromatic diamine alone, or the polyimide may contain the photosensitive aromatic diamine and/or alkali-solubility-increasing aromatic diamine together with the one or more of the above-described aromatic diamine components. The content of the photosensitive aromatic diamines and/or the alkali-solubility-increasing aromatic diamines based on the total aromatic diamine components is preferably 30 to 100 mol %, more preferably 50 to 100 mol %.

It should be noted that in the above-described various compounds and components containing alkyl groups or the alkyl moiety-containing groups, the number of carbon atoms in the alkyl groups or the alkyl moieties is preferably 1 to 6 unless otherwise specified. Further, as the aromatic ring, unless otherwise specified, benzene ring, naphthalene ring and anthracene ring as well as hetero rings of these rings are preferred.

The polyimide in the composition according to the present invention is solvent-soluble. The term "solvent-soluble" means that the polyimide can be dissolved in N-methyl-2-pyrrolidone (NMP) at a concentration of not less than 5% by weight, preferably not less than 10% by weight.

The polyimide in the composition according to the present invention preferably has a weight average molecular weight based on polystyrene of 25,000 to 400,000, more preferably 30,000 to 200,000. If the weight average molecular weight is within the range of 25,000 to 400,000, good solubility in solvent good film-forming properties, high film strength and high insulation may be attained. Further, in addition to satisfaction of the above-mentioned range of the molecular weight, it is preferred that the thermal decomposition initiation temperature be not lower than 450° C. from the view point of heat resistance.

The polyimide in the composition according to the present invention may be produced by direct imidation reaction between the aromatic diamine and the aromatic tetracarboxylic dianhydride. In the production of the conventional negative-type polyimide photoresists, a polyamic acid having photoreactive side chains are used. The polyamic acid is easily decomposed at room temperature, so that the storage stability is poor. Further, the photosensitive polyamic acid requires heat treatment at 250 to 350° C. so as to carry out imidation reaction. In contrast, the polyimide in the composition according to the present invention is directly produced by the imidation reaction between the aromatic diamine and the aromatic tetracarboxylic dianhydride in solution, but not a polyamic acid, so that the production process thereof is largely different from that of the conventional negative-type polyimides.

The direct imidation reaction between the aromatic diamine and the aromatic tetracarboxylic dianhydride may be carried out using a catalytic system utilizing the following equilibrium reaction between a lactone, base and water.

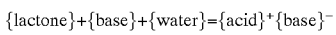

$$\{lactone\}+\{base\}+\{water\}=\{acid\}^+\{base\}^-$$

A polyimide solution may be obtained by using the $\{acid\}^+\{base\}^-$ system as a catalyst and heating the reaction mixture at 140–180° C. The water produced by the imidation reaction is eliminated from the reaction system by azeotropic distillation with toluene. When the imidation in the reaction system is completed, $\{acid\}^+\{base\}^-$ is converted to the lactone and the base, and they lose the catalytic activity and are removed from the reaction system. The polyimide solution produced by this process can be industrially used as it is as a polyimide solution with high purity because the above-mentioned catalytic substances are not contained in the polyimide solution after the reaction.

Examples of the reaction solvent which may be used in the above-mentioned imidation reaction include, in addition to the above-mentioned toluene, N-methyl-2-pyrrolidone, dimethylformamide, dimethylacetamide, dimethylsulfoxide, sulfolane, tetramethylurea and the like.

As the lactone, γ-valerolactone is preferred. As the base, pyridine and/or methylmorpholine is(are) preferred.

The mixing ratio (acid/diamine) between the aromatic acid dianhydride and the aromatic diamine subjected to the imidation reaction is preferably about 1.05 to 0.95 in terms of molar ratio. Further, the concentration of the acid dianhydride based on the total reaction mixture is preferably about 4 to 16% by weight, the concentration of the lactone is preferably about 0.2 to 0.6% by weight, the concentration of the base is preferably about 0.3 to 0.9% by weight, and the concentration of the toluene is preferably about 6 to 15% by weight at the initiation of the reaction. The reaction time is not restricted and varies depending on the molecular weight of the polyimide to be produced and the like, and usually about 2 to 10 hours. It is preferred to carry out the reaction under stirring.

It should be noted that the production process per se of the polyimide using the binary catalytic system comprising the lactone and the base is known, and described in, for example, U.S. Pat. No. 5,502,143.

By carrying out the above-described imidation reaction sequentiality in two steps using different acid dianhydrides and/or different diamines, polyimide block copolymers can be produced. By the conventional process for producing polyimide through polyamic acid, only random copolymers can be produced as copolymers. Since polyimide block copolymers can be produced selecting arbitrary acids and/or diamines, desired properties or functions such as adhesiveness, dimensional stability, low dielectric constant and the like can be given to the polyimide. In the composition of the present invention, such a polyimide copolymer may also be employed.

A preferred process for producing the polyimide block copolymers include the process wherein a polyimide oligomer is produced using the acid catalyst generated by the above-described lactone and the base, and using either one of the aromatic diamine component or the tetracarboxylic dianhydride in excess, and then the aromatic diamine and/or the tetracarboxylic dianhydride is(are) added (the molar ratio of the total aromatic diamines to the total tetracarboxylic dianhydride is 1.05 to 0.95), thereby carrying out two-step polycondensation.

The photosensitive polyimide composition according to the present invention preferably contains the photoacid generator in an amount of 10 to 50% by weight based on the weight of the polyimide.

The photosensitive polyimide composition according to the present invention may be in the form of solution suited for application on substrates. In this case, as the solvent, a polar solvent such as N-methyl-2-pyrrolidone, dimethylformamide, dimethylacetamide, dimethylsulfoxide, sulfolane, tetramethylurea or the like; which is used as the solvent for the imidation reaction, may be employed. The concentration of the polyimide in the solution may preferably be 5% to 50% by weight, more preferably 10% to 40% by weight. Since the polyimide obtained by the direct imidation using the catalytic system comprising the lactone and the base is obtained in the form of solution in which the polyimide is dissolved in the polar solvent, and since the concentration of the polyimide in the obtained solution is within the preferred range mentioned above, the polyimide solution produced by the above-described process may advantageously be used as it is. If desired, however, the produced polyimide solution may be diluted with diluent. As the diluent, a solvent which does not largely decrease the solubility, such as dioxane, dioxolane, γ-butyrolactone, cyclohexanone, propylene glycol monomethyl ether acetate, methyl lactate, anisole, ethyl acetate or the like may be employed, although the diluent is not restricted to these.

To make the composition of the present invention fitted to each final use, the sensitivity of the pattern resolution may be increased by giving a photosensitizer to the photosensitive polyimide of the present invention. Although not restricted, examples of the photosensitizer include Michler's ketone, benzoin ether, 2-methylanthraquinone, benzophenone and the like. Further, modifiers which are added to the ordinary photosensitive polyimides, such as coupling agents, plasticizers, film-forming resins, surfactants, stabilizers, spectrum sensitivity-adjusters and the like may be added.

By applying the photosensitive polyimide composition of the present invention in the form of solution on a substrate, drying the composition, selectively exposing the composition, and developing the resultant, a polyimide membrane having an arbitrary pattern on the substrate can be formed. Alternatively, by forming a polyimide film from the polyimide composition by a conventional method such as extrusion, adhering the film on a substrate, selectively exposing the film and developing the resultant, a polyimide membrane having an arbitrary desired pattern on the substrate may be formed. Since such a polyimide membrane is resistant to heat and insulative, it may be used as an insulation membrane or dielectric layer in semiconductor devices as it is. Alternatively, it may be used as a photoresist for selectively exposing the substrate.

Examples of the substrate to which the photosensitive polyimide of the present invention is applied include semiconductor disks, silicon wafers, germanium, gallium arsenide, glass, ceramics, copper foil, printed boards and the like.

Coating of the composition may be carried out usually by dipping, spraying, roll coating, spin coating or the like. As for the adhesive films, products having uniform thickness may be usually obtained by employing thermocompression bonding. By employing these methods, the photosensitive polyimide according to the present invention may be effectively used for forming coating layers with a thickness of 0.1 to 200 μm, or for forming relief structures.

The thin membranes in multilayered circuits used as temporary photoresists or as insulation layers or dielectric layers may preferably have a thickness of about 0.1 to 5 μm. In cases where the membrane is used as a thick layer such as immobile layer, the thickness thereof may preferably be 10 to 200 μm in order to protect the semiconductor memories from α-ray.

It is preferred to carry out preheating at a temperature of 80 to 120° C. after applying the photosensitive polyimide to the substrate. In this case, an oven or heating plate is used, and an infrared heater is preferably employed as the heater. The drying time in this case may be about 5 to 20 minutes.

Thereafter, the photosensitive polyimide layer is subjected to irradiation. Usually, UV light is used, but high energy radiation, such as X-ray, electron beam or high power oscillation beam from an extra-high pressure mercury lamp may be employed. Although irradiation or exposure is carried out through a mask, the surface of the photosensitive polyimide layer may also be irradiated withthe radiation beam. Usually, irradiation is carried out using a UV lamp which emits a light having a wavelength of 250 to 450 nm, preferably 300 to 400 nm. The exposure may be carried out using a single color ray or multiple color rays. It is preferred to use a commercially available irradiation apparatus, such as contact and interlayer exposing apparatus, scanning projector or wafer stepper.

After the exposure, by treating the photosensitive layer with a developer which is an aqueous alkaline solution, the irradiated regions of the photoresist layer can be removed, thereby a pattern is obtained. The treatment may carried out by dipping the photoresist layer or spraying the developer under, pressure to the photoresist layer so as to dissolve the exposed regions of the substrate. Examples of the alkali to be used as the developer include, although not restricted, aminoalcohols such as aminoethanol, methyl morpholine, potassium hydroxide, sodium hydroxide, sodium carbonate, dimethylaminoethanol, hydroxytetramethyl ammonium and the like. Although the concentration of the alkali in the developer is not restricted, it is usually about 30 to 5% by weight.

The development time varies depending on the energy of exposure, strength of the developer, manner of development, preheating temperature, temperature of the treatment with the developer and the like. Usually, with the development by dipping, the development time is about 1 to 10 minutes, and with the development by spraying, the development time is usually about 10 to 60 seconds. The development is stopped by dipping the developed layer in an inactive solvent such as isopropanol or deionized water, or by spraying such a solvent.

By using the positive-type photosensitive polyimide composition according to the present invention, polyimide coating layers having a layer thickness of 0.5 to 200 μm, and relief structures having sharp edges may be formed.

Since the polyimide in the composition of the present invention is composed of complete linear polyimide, it is not changed in water or heating, and its storage stability is good. Therefore, it can be used as photosensitive films. Further, after forming the pattern by development, unlike the polyamic acid molecules, the postbake at 250 to 450° C. is not necessary, and only drying under heat at 120 to 200° C. to evaporate the solvent is carried out. Further, the polyimide membrane after forming the pattern is tough, resistant to high temperature and excellent in mechanical properties.

As for the photoresists comprising a novolak photosensitive material and a diazonaphthoquinone, it is said that both the resolution and sensitivity are excellent when the molecular'weight of the novolak is not more than 10,000, and is uniformed within the range of 5000 to 10,000.

Similarly, the resolution and photosensitivity of the positive-type photosensitive polyimides, as well as the heat resistance, chemical resistance and mechanical strength, are variable depending on the molecular weight and the molecular weight distribution. There is a tendency that the larger the molecular weight and the smaller the carboxylic acid content, the longer the development time and the dipping time in the alkali solution.

The present invention will now be described more concretely by way of examples. It should be noted, however, the following examples are presented for the illustration purpose only and should not be interpreted in any restrictive way. It is apparent for those skilled in the art that photosensitive polyimides having various characteristics are obtained by combination of various acid dianhydrides and aromatic diamines.

EXAMPLE 1

A stainless steel anchor agitator and reflux condenser were attached to a 1-liter three-necked separable flask, the condenser comprising a trap and a cooling tube having balls and mounted on the trap. To this flask, 22.21 g (50 mmol) of 4,4'-{2,2,2-trifluoro-1-(trifluoromethyl)ethylidene}bis(1,2-benzenedicarboxylic dianhydride) (commercial product of Hoechst-Celanese, molecular weight: 444.25, hereinafter referred to as "6FDA"), 25.93 g (50 mmol) of 2,2-bis{4-(4-aminophenoxy)phenyl}hexafluoropropane (hereinafter referred to as "HFBAPP"), 1.0 g (10 mmol) of γ-valerolactone, 1.6 g (20 mmol) of pyridine, 185 g of N-methylpyrrolidone, and 30 g of toluene were added. After stirring the mixture at 180 rpm at room temperature under nitrogen atmosphere for 0.5 hours, the mixture was heated at 180° C. and stirred at 180 rpm for 2.0 hours. In the reaction, toluene-water azeotrope was removed.

The polymer concentration thus obtained was 20% by weight. The molecular weight of this polyimide was measured by high performance liquid chromatography (produced by Tosoh Corporation). The molecular weights based on polystyrene were: Number Average Molecular Weight (Mn): 57,800; Weight Average Molecular Weight (Mw): 108,100; Z Average Molecular Weight (Mz): 192,300; Mw/Mn=1.87; Mz/Mn=3.33. More particularly, the molecular weights were measured as follows: That is, the molecular weights were measured by using high performance liquid chromatography produced by Tosoh Corporation. As the developing solution, LiBr-containing dimethylformamide was used. The molecular weight in terms of styrene was measured, and the number average molecular weight (Mn), weight average molecular weight (Mw), Z average molecular weight (Mz), Mw/Mn ratio and Mz/Mn ratio were measured.

EXAMPLE 2

The procedure was run the same way as Example 1.

To the separable three-necked flask, 14.71 g (50 mmol) of 3,4,3',4'-biphenyltetracarboxylic dianhydride (commercial product of Ube Industries, Ltd., hereinafter referred to as "BPDA"), 5.00 g (25 mmol) of 2,3-diaminodiphenyl ether, 10.27 g (25 mmol) of 2,2-bis{4-(4-aminophenoxy)phenyl}propane (hereinafter referred to as "BAPP"), 0.5 g of γ-valerolactone (5 mmol), 0.8 g (10 mmol) of pyridine, 113 g of N-methylpyrrolidone and 30 g of toluene were added. After stirring the mixture at 180 rpm at room temperature under nitrogen atmosphere for 0.5 hours, the mixture was heated at 180° C. and stirred at 180 rpm for 0.5 hours. In the reaction, toluene-water azeotrope was removed.

The polymer concentration thus obtained was 20% by weight. The molecular weights based on polystyrene measured as in Example 1 were: Number Average Molecular Weight (Mn): 26,000; Weight Average Molecular Weight (Mw): 42,900; Z Average Molecular Weight (Mz): 60,800; Mw/Mn=1.65; Mz/Mn=2.33.

EXAMPLE 3

The procedure was run the same way as Example 1.

To the separable three-necked flask, 8.89 g (20 mol) of 6FDA, 5.19 g (10 mmol) of HFBAPP, 0.3 g (3 mmol) of γ-valerolactone, 0.5 g (6 mmol) of pyridine, 70 g of N-methylpyrrolidone and 20 g of toluene were added. After stirring the mixture at 180 rpm at room temperature under nitrogen atmosphere for 0.5 hours, the mixture was heated at 180° C. and stirred at 180 rpm for 1 hour. In the reaction, toluene-water azeotrope was removed.

After cooling at room temperature, 2.94 g (10 mmol) of BPDA, 6.40 g (20 mmol) of 2,2'-bis(trifluoromethylbenzidine), 57 g of N-methylpyrrolidone and 10 g of toluene were added and the mixture was stirred at room temperature for 1 hour, followed by stirring the mixture at 180° C. at 180 rpm for 3.75 hours. In the reaction, toluene-water azeotrope was removed.

The polymer concentration thus obtained was 15% by weight. The molecular weights based on polystyrene measured as in Example 1 were: Number Average Molecular Weight (Mn): 24,800; Weight Average Molecular Weight (Mw): 41,700; Z Average Molecular Weight (Mz): 63,300; Mw/Mn=1.68; Mz/Mn=2.65.

EXAMPLE 4

The procedure was run the same way as Example 3.

To the separable three-necked flask, 9.67 g (30 mmol) of 3,4,3',4'-benzophenone tetracarboxylic dianhydride (hereinafter referred to as "BTDA"), 4.89 g (40 mmol) of 2,4-diaminotoluene, 8,80 g (10 mmol) of diaminosiloxane (commercial product of Shin-etsu Chemical Co., Ltd., amine value: 440), 1.0 g (10 mmol) of γ-valerolactone, 1.6 g (20 mmol) of pyridine, 60 g of N-methylpyrrolidone and 30 g of toluene were added. After stirring the mixture at 180 rpm at room temperature under nitrogen atmosphere for 0.5 hours, the mixture was heated at 180° C. and stirred at 180 rpm for 1 hour. In the reaction, toluene-water azeotrope was removed.

After cooling at room temperature, 14.71 g (50 mmol) of BPDA, 4.00 g (20 mmol) of 3,4'-diaminodiphenyl ether, 4.105 g (10 mmol) of BAPP, 70 g of N-methylpyrrolidone and 30 g of toluene were added and the mixture was stirred at room temperature for 25 minutes, followed by stirring the mixture at 180° C. at 180 rpm for 4 hours. After the reaction, 43 g of N-methylpyrrolidone was added.

The polymer concentration thus obtained was 20% by weight. The molecular weights based on polystyrene measured as in Example 1 were: Number Average Molecular Weight (Mn): 31,700; Weight Average Molecular Weight (Mw): 56,400; Z Average Molecular Weight (Mz): 88,900; Mw/Mn=1.78; Mz/Mn=2.81.

EXAMPLE 5

Preparation of Photosensitive Composition and Formation of Pattern by Selective Exposure (1) Preparation of Photosensitive Composition Photosensitive compositions were prepared by mixing the components shown in Table 1 below and filtering the mixture through a filter having 3 $\mu$m diameter of pores.

TABLE 1

| Components | Composition | | | |
| --- | --- | --- | --- | --- |
| | I | II | III | IV |
| Polyimide Solution | Example 1 | Example 2 | Example 3 | Example 4 |
| Weight | 15 g | 15 g | 20 g | 15 g |
| (Polyimide Content) | 3 g | 3 g | 3 g | 3 g |
| 1,2-naphthoquinone-2-diazide-5-sulfonic acid-o-cresol ester | 0.9 g | 0.9 g | 0.9 g | 0.9 g |

(2) Formation of Images

Each of the above-described photosensitive compositions was spin-coated on 5 cm diameter of surface-treated copper foil (commercial product of Nippon Denkai, 18 $\mu$m thickness). Thereafter, photosensitive layer was dried at 90° C. for 10 minutes in an infrared light oven. The thickness of this photosensitive layer was about 10 $\mu$m.

On this photosensitive layer, a test pattern (through holes and line-and-space pattern having diameters and widths of 10, 15, 20, 25, - - - , and 200 $\mu$m, respectively) was placed, and the photosensitve layer was irradiated at a dose of exposure at which images are obtained using 2 kW extra-high pressure mercury lamp apparatus (JP-2000G, commercial product of Oak Seisakusho). The wavelength range was 320 to 390 nm and the peak was 360 nm (these conditions were consistent in the following examples too). The dose of UV light and the developing time are shown in Table 2 below.

TABLE 2

| Composition | I | II | III | IV |
| --- | --- | --- | --- | --- |
| Dose of UV Light (mJ) | 1000 | 500 | 1000 | 1000 |
| Developing Time (minutes) | 25 | 5 | 3 | 7 |

The developer was a mixture of 30 g of aminoethanol, 30 g of N-methylpyrrolidone and 30 g of water. The photosensitive layer after the irradiation was dipped in the developer for the above-described time period, washed with deionized water, dried with an infrared oven, and the resolution was observed. The thickness of this polyimide photosensitive layer after drying at 90° C. for 30 minutes was about 9 $\mu$m.

With all of the compositions I, II, III and IV, as for the through hole patterns in the photosensitive layer, formation of through holes having sharp and circular sections having a diameter of 15 $\mu$m was confirmed. As for the line-and-space pattern, formation of images of lines having a width of 15 $\mu$m was confirmed.

EXAMPLE 6

The procedure was run the same way as Example 1.

A stainless steel anchor agitator and reflux condenser were attached to a 1-liter three-necked separable flask, the condenser comprising a trap and a cooling tube having balls and mounted on the trap.

17.77 g (40 mmol) of 6FDA, 8.65 g (20 mmol) of M-BAPS, 4.25 g (20 mmol) of 3,3'-dimethylbenzidine, 0.4 g (4 mmol) of γ-valerolactone, 0.6 g (8 mmol) of pyridine, 117 g of N-methylpyrrolidone and 30 g of toluene were added. After stirring the mixture at 180 rpm at room temperature under nitrogen atmosphere for 0.5 hours, the mixture was heated at 180° C. and stirred at 180 rpm for 4.75 hours. In the reaction, toluene-water azeotrope was removed.

The polymer concentration thus obtained was 20% by weight. The molecular weights based on polystyrene measured as in Example 1 were: Number Average Molecular Weight (Mn): 67,300; Weight Average Molecular Weight (Mw): 128,300; Z Average Molecular Weight (Mz): 219,500; Mw/Mn=1.90; Mz/Mn=3.26.

EXAMPLE 7

The procedure was run the same way as Example 6.

To the separable three-necked flask, 13.09 g (60 mmol) of pyromellitic dianhydride, 14.89 g (60 mmol) of bicyclo(2,2,2)-oct-7-ene-2,3,5,6-tetracarboxylic dianhydride (hereinafter referred to as "BCD"), 61.9 g (120 mmol) of m-BAPS, 1.2 g (12 mmol) of γ-valerolactone, 1.2 g (24 mmol) of pyridine, 302 g of N-methylpyrrolidone and 50 g of toluene were added. After stirring the mixture at 180 rpm at room temperature under nitrogen atmosphere for 0.5 hours, the mixture was heated at 180° C. and stirred at 180 rpm for 3.75 hours. In the reaction, toluene-water azeotrope was removed.

The polymer concentration thus obtained was 20% by weight. The molecular weights based on polystyrene measured as in Example 1 were: Number Average Molecular Weight (Mn): 71,100; Weight Average Molecular Weight (Mw): 113,600; Z Average Molecular Weight (Mz): 167,100; Mw/Mn=1.60; Mz/Mn=2.35.

EXAMPLE 8

The procedure was run as the same way as Example 3.

To the separable three-necked flask, 9.67 g (3.0 mol) of BTDA, 9.13 g (60 mmol) of 3,5-diaminobenzoic acid, 1.2 g (12 mmol) of γ-valerolactone, 2.4 g (24 mmol) of pyridine, 150 g of N-methylpyrrolidone and 30 g of toluene were added. After stirring the mixture at 180 rpm at room temperature under nitrogen atmosphere for 0.5 hours, the mixture was heated at 180° C. and stirred at 180 rpm for 1 hour. In the reaction, toluene-water azeotrope was removed. After cooling at room temperature, 29.00 g (90 mmol) of BPDA, 12.98 g (30 mmol) of m-BAPS, 10.46 g (30 mmol) of 9;9-bis(4-aminophenyl)fluorene, 118 g of N-methylpyrrolidone and 20 g of toluene were added and the mixture was stirred at room temperature for 0.45 hours, followed by stirring the mixture at 180° C. at 180 rpm for 2.60 hours. In the reaction, toluene-water azeotrope was removed.

The polymer concentration thus obtained was 20% by weight. The molecular weights based on polystyrene measured as in Example 1 were: Number Average Molecular Weight (Mn): 29,900; Weight Average Molecular Weight (Mw): 77,400; Z Average Molecular Weight (Mz): 175,400; Mw/Mn=2.59; Mz/Mn=5.86.

EXAMPLE 9

The procedure was run the same way as Example 3.

To the separable three-necked flask, 12.89 g (40 mol) of BTDA, 8.65 g (20 mmol) of m-BAPS, 0.4 g (4 mmol) of γ-valerolactone, 0.64 g (8 mmol) of pyridine, 77 g of N-methylpyrrolidone and 30 g of toluene were added. After stirring the mixture at 180 rpm at room temperature under nitrogen atmosphere for 0.5 hours, the mixture was heated at 180° C. and stirred at 180 rpm for 1 hour. In the reaction, toluene-water azeotrope was removed. After cooling the resultant to room temperature, 2.16 g (10 mmol) of 3,3'-dihydroxy-4,4'-diaminobiphenyl, 2.00 g (10 mmol) of 3,4'-diaminodiphenyl ether, 20 g of N-methylpyrrolidone and 10 g of toluene were added and the mixture was stirred at room temperature for 0.45 hours, followed by stirring the mixture at 180° C. at 180 rpm for 1.0 hour. In the reaction, toluene-water azeotrope was removed.

The polymer concentration thus obtained was 15% by weight. The molecular weights based on polystyrene measured by high performance liquid chromatography (commercial product of Tosoh Corporation) were: Number Average Molecular Weight (Mn): 32,300; Weight Average Molecular Weight (Mw): 140,200; Z Average Molecular Weight (Mz): 442,000; Mw/Mn=4.34; Mz/Mn=13.68.

EXAMPLE 10

The procedure was run the same way as Example 5.
(1) Preparation of Photosensitive Composition Photosensitive compositions were prepared by mixing the components shown in Table 3 below and filtering the mixture through a filter having 3 μm diameter of pores.

TABLE 3

| Components | Composition | | |
|---|---|---|---|
| | V | VI | VII |
| Polyimide Solution | Example 7 | Example 8 | Example 9 |
| Weight | 15 g | 20 g | 15 g |
| (Polyimide Content) | 3 g | 3 g | 3 g |
| 1,2-naphthoquinone-2-diazide-5-sulfonic acid-o-cresol ester | 0.9 g | 0.9 g | 0.9 g |

(2) Method of Formation of Images

Each of the above-described photosensitive compositions was spin-coated on 5 cm diameter of a surface of a surface-treated copper foil (commercial product of Nippon Denkai, 18 μm thickness). Thereafter, the photosensitive layer was dried at 90° C. for 10 minutes in an infrared oven. The thickness of this photosensitive layer was about 10 μm.

On this photosensitive layer, a test pattern (through holes and line-and-space pattern having diameters and widths of 10, 15, 20, 25, - - -, and 200 μm, respectively) was placed, and the photosensitive layer was irradiated at a dose of exposure at which images are obtained using 2 kW extra-high pressure mercury lamp apparatus (JP-2000G, commercial product of Oak Seisakusho). The dose of UV light and the developing time are shown in Table 4 below.

TABLE 4

| Composition | V | VI | VII |
|---|---|---|---|
| Dose of UV Light (mJ) | 500 | 500 | 500 |
| Developing Time (minutes) | 15 | 8 | 8 |

The developer was a mixture of 30 g of aminoethanol, 70 g of N-methylpyrrolidone and 30 g of water.

The photosensitive layer after the irradiation was dipped in this developer for the above-described time period, washed with deionized water, dried with an infrared lamp, and the resolution was observed. The thickness of this polyimide layer after drying at 90° C. for 30 minutes was about 9 μm.

With all of the compositions V, VI and VII, as for the through hole patterns in polyimide photosensitve layer, formation of through holes having sharp and circular sections having a diameter of 15 μm was confirmed. As for the line-and-space pattern, formation of images of lines having a width of 15 μm was confirmed.

EXAMPLE 11

The procedure was run the same way as Example 3.

To the separable three-necked flask, 19.33 g (60 mmol) of BTDA, 14.97 g (90 mmol) of 4,4'-diaminodiphenyl sulfide, 1.5 g (15 mmol) of γ-valerolactone, 2.4 g (30 mmol) of pyridine, 150 g of N-methylpyrrolidone and 30 g of toluene were added.

After stirring the mixture at 180 rpm at room temperature under nitrogen atmosphere for 0.5 hours, the mixture was heated at 180° C. and stirred at 180 rpm for 1 hour. After the reaction, toluene-water azeotrope was removed.

After cooling the resultant to room temperature, 26.48 g (90 mmol) of BPDA, 6.4 g (30 mmol) of 3,3'-dihydroxybenzidine, 12.98 g (30 mmol) of m-BAPS, 85 g of N-methylpyrrolidone and 30 g of toluene were added and the mixture was stirred at room temperature for 25 minutes, followed by stirring the mixture at 180° C. at 180 rpm for 2 hours. After the reaction, 79 g of N-methylpyrrolidone was added.

The polymer concentration thus obtained was 20% by weight. The molecular weights based on polystyrene measured as in Example 1 were: Number Average Molecular Weight (Mn): 24,000; Weight Average Molecular Weight (Mw): 48,500; Z Average Molecular Weight (Mz): 82,100; Mw/Mn=2.02; Mz/Mn=3.41.

EXAMPLE 12

The procedure was run the same way as Example 3.

To the separable three-necked flask, 9.67 g (30 mol) of BTDA, 9.13 g (60 mmol) of 3,5-diaminobenzoic acid, 1.2 g (12 mmol) of γ-valerolactone, 2.0 g (24 mmol) of pyridine, 150 g of N-methylpyrrolidone and 30 g of toluene were added. After stirring the mixture at 180 rpm at room temperature under nitrogen atmosphere for 0.5 hours, the mixture was heated at 180° C. and stirred at 180 rpm for 1 hour. After the reaction, toluene-water azeotrope was removed.

After cooling at room temperature, 29.00 g (90 mmol) of BTDA, 12.98 g (30 mmol) of m-BAPS, 6.49 g (30 mmol) of 3,3'-dihydroxybenzidine, 102 g of N-methylpyrrolidone and 20 g of toluene were added and the mixture was stirred at room temperature for 0.45 hours, followed by stirring the mixture at 180° C. at 180 rpm for 2.50 hours. In the reaction, toluene-water azeotrope was removed.

The polymer concentration thus obtained was 20% by weight. The molecular weights based on polystyrene measured as in Example were: Number Average Molecular Weight (Mn): 24,000; Weight Average Molecular Weight (Mw): 45,700; Z Average Molecular Weight (Mz): 82,300; Mw/Mn=1.90; Mz/Mn=3.42.

EXAMPLE 13

The procedure was run the same way as Example 12.

To the separable three-necked flask, 2.18 g (10 mmol) of pyromellitic dianhydride, 6.40 g (20 mmol) of 2,2'-di-trifluoromethyl-benzidine, 0.4 g (4 mmol) of γ-valerolactone, 0.8 g (10 mmol) of pyridine, 86 g of N-methylpyrrolidone and 20 g of toluene were added. After stirring the mixture at 180 rpm at room temperature under nitrogen atmosphere for 0.5 hours, the mixture was heated at 180° C. and stirred at 180 rpm for 1.0 hour. After the reaction, toluene-water azeotrope was removed.

After cooling at room temperature, 8.83 g (30 mmol) of BPDA, 4.79 g (11.67 mmol) of BAPP, 1.52 g (10 mmol) of 3,5-diaminobenzoic acid, 30 g of N-methylpyrrolidone and 10 g of toluene were added and the mixture was stirred at room temperature for 0.5 hours, followed by stirring the mixture at 180° C. at 180 rpm for 3 hours. In the reaction, toluene-water azeotrope was removed.

The polymer concentration thus obtained was 15% by weight. The molecular weights based on polystyrene measured as in Example 1 were: Number Average Molecular Weight (Mn): 17,800; Weight Average Molecular Weight (Mw): 31,100; Z Average Molecular Weight (Mz): 48,200; Mw/Mn=1.74; Mz/Mn=2.70.

EXAMPLE 14

The procedure was run the same way as Example 3.

To the separable three-necked flask, 2.94 g (10 mol) of BPDA, 6.40 g (20 mmol) of 2,2'-di-trifluoromethyl-benzidine, 0.3 g (3 mmol) of γ-valerolactone, 0.48 g (6 mmol) of pyridine, 78 g of N-methylpyrrolidone and 20 g of toluene were added. After stirring the mixture at 180 rpm at room temperature under nitrogen atmosphere for 0.5 hours, the mixture was heated at 180° C. and stirred at 180 rpm for 1 hour. After the reaction, toluene-water azeotrope was removed.

After cooling at room temperature, 5.88 g (20 mmol) of BPDA, 2.74 g (6.67 mmol) of BAPP, 0.76 g (5 mmol) of 3,5-diaminobenzoic acid, 20 g of N-methylpyrrolidone and 10 g of toluene were added and the mixture was stirred at room temperature for 0.5 hours. Then 0.33 g (3.33 mmol) of maleic anhydride and 10 g of N-methylpyrrolidone were added and the mixture was stirred at room temperature for 0.5 hours, followed by stirring the mixture at 180° C. at 180 rpm for 3 hours. In the reaction, toluene-water azeotrope was removed.

The polymer concentration thus obtained was 15% by weight. The molecular weights based on polystyrene measured as in Example 1 were: Number Average Molecular Weight (Mn): 17,000; Weight Average Molecular Weight (Mw): 28,000; Z Average Molecular Weight (Mz): 42,300; Mw/Mn=1.54; Mz/Mn=2.48.

EXAMPLE 15

Operations basically similar to those in Example 5 were carried out.

(1) Preparation of Photosensitive Composition

Photosensitive compositions were prepared by mixing the components shown in Table 5 below and filtering the mixture through a filter having 3 μm diameter of pores.

TABLE 5

| | Composition | | | |
|---|---|---|---|---|
| Components | VIII | IX | X | XI |
| Polyimide Solution | Example 11 | Example 12 | Example 13 | Example 14 |
| Weight (Polyimide Content) | 15 g 3 g | 15 g 3 g | 20 g 3 g | 15 g 3 g |
| 1,2-naphtho-quinone-2-diazide-5-sulfonic acid-o-cresol ester | 0.9 g | 0.9 g | 0.9 g | 0.9 g |

(2) Method of Formation of Images

Each of the above-described photosensitive compositions was spin-coated on 5 cm diameter of surface-treated copper foil (commercial product of Nippon Denkai, 18 μm thickness). Thereafter, the photosensitive layer was dried at 90° C. for 10 minutes in an infrared oven. The thickness of this photosensitive layer was about 10 μm.

On this photosensitive layer, a test pattern (through holes and line-and-space pattern having diameters and widths of 10, 15, 20, 25, - - - , and 200 μm, respectively) was placed, and the photosensitive layer was irradiated at a dose of exposure at which images are obtained using 2 kW extra-high pressure mercury lamp apparatus (JP-2000G, commercial product of Oak Seisakusho). The dose of UV light and the developing time are shown in Table 6 below.

TABLE 6

| Composition | VIII | IX | X | XI |
|---|---|---|---|---|
| Dose of UV Light (mJ) | 500 | 500 | 500 | 700 |
| Developing Time (minutes) | 1 | 1 | 5 | 11 |

The developer was a mixture of 30 g of aminoethanol, 30 g of N-methylpyrrolidone and 30 g of water.

The photosensitive layer after the irradiation was dipped in this solution for the above-described period, washed with deionized water, dried with an infrared lamp, and the resolution was observed. The thickness of this polyimide layer after drying at 90° C. for 30 minutes was about 9 μm.

With all of the compositions VIII, IX, X and XI, as for the through hole patterns in the polyimide photosensitive layer, formation of through holes having sharp and circular sections having a diameter of 15 μm was confirmed. As for the line-and-space pattern, formation of images of lines having a width of 15 μm was confirmed.

EXAMPLE 16

A stainless steel anchor agitator and reflux condenser were attached to a 1-liter three-necked separable flask, the condenser comprising a trap and a cooling tube having balls and mounted on the trap. While dipping the flask in a silicone bath to heat the flask under stirring and under nitrogen gas flow, 32.23 g (1.00 mol) of 3,4,3',4'-benzophenone tetracarboxylic dianhydride (commercial product of Himie Linz Ges. m.b.H, Molecular Weight: 322.23, hereinafter referred to as "BTDA"), 21.63 g (50 mmol) of bis-4-(3-aminophenoxy)phenylsulfone (commercial product of Wakayama Seika Co., Ltd., Molecular Weight: 432.5), 13.27 g (50 mmol) of 3,3'-diamino-4,4'-dimethylbiphenylsulfone (commercial product of Wakayama Seika Co., Ltd., Molecular Weight: 274.3, hereinafter referred to as "o-tolidine sulfone"), 1.0 g (10 mmol) of γ-valerolactone, 1.6 g (20 mmol) of pyridine, 257 g of N-methylpyrrolidone and 60 g of toluene were added. After stirring the mixture at 200 rpm at room temperature under nitrogen atmosphere for 30 minutes, the mixture was heated at 180° C. (the bath temperature) and stirred at 180 rpm for 4.5 hours. The reaction completed while removing the toluene-water azeotrope (14 ml).

The polymer concentration thus obtained was 20% by weight. The molecular weights based on polystyrene measured as in Example 1 were: Number Average Molecular Weight (Mn): 26,760; Weight Average Molecular Weight (Mw): 39,540; Z Average Molecular Weight (Mz): 57,160; Mw/Mn=1.48. This polyimide was poured into methanol to convert it to powders which were subjected to thermal analysis. The thermal decomposition temperature of the polyimide was 484° C.

EXAMPLE 17

The procedure was run the same way as Example 16.

A stainless steel anchor agitator and reflux condenser were attached to a 1-liter three-necked separable flask, the condenser comprising a trap and a cooling tube having balls and mounted on the trap. While heating the flask under nitrogen gas flow and under stirring, 17.77 g (40 mmol) of 6FDA (commercial product of Hoechst-Celanese), 8.65 g (20 mmol) of bis{4-(3-aminophenoxy)phenyl}sulfone, 5.49 g (20 mmol) of o-tolidine sulfone, 0.5 g (5 mmol) of γ-valerolactone, 0.8 g (10 mmol) of pyridine, 122 g of N-methylpyrrolidone and 30 g of toluene were added. After stirring the mixture at 200 rpm at room temperature under nitrogen atmosphere for 30 minutes, the mixture was heated at 180° C. and stirred at 180 rpm for 6.15 hours. In the reaction, toluene-water azeotrope was removed.

The polymer concentration thus obtained was 20% by weight. The molecular weights based on polystyrene measured as in Example 1 were: Number Average Molecular Weight (Mn): 66,590; Weight Average Molecular Weight (Mw): 102,450; Z.Average Molecular Weight (Mz): 148,540; Mw/Mn=1.54. This polyimide was poured into methanol to convert it to powders which were subjected to thermal analysis. The thermal decomposition temperature of the polyimide was 431° C. and 506° C.

EXAMPLE 18

The procedure was run the same way as Example 16.

While heating the flask under nitrogen gas flow and under stirring, 17.77 g (40 mmol) of 6FDA, 8.21 g (20 mmol) of 2,2-bis-4(4'-aminophenoxy)phenylpropane (commercial product of Wakayama Seika Co., Ltd., Molecular Weight: 410.5), 5.49 g (20 mmol) of o-tolidine sulfone, 0.5 g (5 mmol) of γ-valerolactone, 0.8 g (10 mmol) of pyridine, 120 g of N-methylpyrrolidone and 30 g of toluene were added in the flask.

After stirring the mixture at 180 rpm at room temperature under nitrogen atmosphere for 30 minutes, the mixture was heated at 180° C. and stirred at 180 rpm for 3.15 hours. In the reaction, toluene-water azeotrope was removed.

The polymer concentration thus obtained was 20% by weight. The molecular weights based on polystyrene measured as in Example 1 were: Number Average Molecular Weight (Mn): 54,400; Weight Average Molecular Weight (Mw): 74,800; Z Average Molecular Weight (Mz): 100,200; Mw/Mn=1.37.

EXAMPLE 19

(1) Preparation of Photosensitive Composition

Photosensitive compositions were prepared by mixing the components shown in Table 7 below and filtering the mixture through a filter having 3 μm diameter of pores.

TABLE 7

|  | Composition | | |
| --- | --- | --- | --- |
| Components | XII | XIII | XIV |
| Polyimide Solution | Example 16 | Example 17 | Example 18 |
| Weight | 15 g | 15 g | 15 g |
| (Polyimide Content) | 3 g | 3 g | 3 g |
| naphthoquinonediazide-1,2,5-o-cresol ester | 0.9 g | 0.9 g | 0.9 g |

(2) Method of Formation of Images

Each of the above-described photosensitive compositions XII, XIII and XIV was spin-coated on 5 cm diameter of a surface-treated copper foil (commercial product of Nippon Denkai, 18 μm thickness). Thereafter, the photosensitive layer was dried at 90° C. for 10 minutes in an infrared oven. The thickness of this photosensitive layer was about 10 μm.

On this photosensitive layer, a test pattern (through holes and line-and-space pattern having diameters and widths of 10, 15, 20, 25, - - - , and 200 μm, respectively) was placed, and the photosensitive layer was irradiated at a dose of exposure at which images are obtained using 2 kW extra-high pressure mercury lamp apparatus (JP-2000G, commercial product of Oak Seisakusho).

The composition XII was irradiated with an energy of 300 mJ and then developed under the following conditions. The developer was a mixture of 40 g of N-methylpyrrolidone, 25 g of aminoethanol, 25 g of methanol and 10 g of water. The photosensitive layer after the irradiation was dipped in this solution for 5 minutes, washed with deionized water, dried with an infrared lamp, and the resolution was observed. The thickness of this polyimide photosensitive layer after drying at 90° C. for 30 minutes was about 9 μm.

As for the through hole patterns in the polyimide photosensitive layer, formation of through holes having sharp and circular sections having a diameter of 15 μm was confirmed. As for the line-and-space pattern, formation of images of lines having a width of 10 μm was confirmed.

This polyimide photosensitive layer was heated with infrared oven at 150° C. for 30 minutes. After this heat treatment, the thickness of the photosensitive layer was 8 μm, so that the thickness was not substantially changed. The polyimide photosensitive layer was then heated with infrared oven at 260° C. for 30 minutes, and the thickness of the layer 6 μm.

The adhesion between the polyimide layer and the copper foil was evaluated by cross cut test. The coating layer was cross cut with a knife such that each lattice had a size of 1 mm×1 mm and was tried to peeled off with a cellophane-tape. As a result, 100/100 lattices remained adhered (no lattices peeled off), so that the adhesion between the polyimide layer and the copper foil was sufficiently high, which can be used in practice.

The thermal decomposition temperature of this polyimide membrane was 484° C., so that it showed good heat resistance in the high temperature range.

EXAMPLE 20

Operations basically similar to those in Example 4 were carried out.

The composition XIII was irradiated with an energy of 500 mJ and then developed under the following conditions. The developer was a mixture of 40 g of N-methylpyrrolidone, 25 g of aminoethanol, 25 g of methanol and 10 g of water. The photosensitive layer after the irradiation was dipped in this solution for 2 minutes, washed with deionized water, dried with an infrared lamp, and the resolution was observed. The thickness of this polyimide layer after drying at 90° C. for 30 minutes was about 20 $\mu$m.

As for the through hole patterns in the polyimide photosensitive layer, formation of through holes having sharp and circular sections having a diameter of 20 $\mu$m was confirmed. As for the line-and-space pattern, formation of images of lines having a width of 10 $\mu$m was confirmed.

EXAMPLE 21

Operations basically similar to those in Example 4 were carried out.

The composition XIV was irradiated with an energy of 300 mJ and then developed under the following conditions. The developer was a mixture of 40 g of N-methylpyrrolidone, 25 g of aminoethanol, 25 g of methanol and 10 g of water. The photosensitive layer after the irradiation was dipped in this solution for 3 minutes, washed with deionized water, dried with an infrared lamp, and the resolution was observed. The thickness of this polyimide layer after drying at 90° C. for 30 minutes was about 11 $\mu$m.

As for the through hole patterns in the photosensitive polyimide layer, formation of through holes having sharp and circular sections having a diameter of 15 $\mu$m was confirmed. As for the line-and-space pattern, formation of images of lines having a width of 10 $\mu$m was confirmed.

COMPARATIVE EXAMPLE 1

To 25 g of the polyimide solution (polyimide 5 g) of Example 16, 1.5 g of Michler's ketone was added and the resultant was mixed with a mixer. The mixture was coated on a copper foil by spin coating to a thickness of about 10 $\mu$m after drying. The coated layer was irradiated in the similar manner as in Example 19. Images were not formed by irradiation of 500 mJ. Images were slightly formed by irradiation of 2500 mJ.

COMPARATIVE EXAMPLE 2

To 25 g of the polyimide solution (polyimide 5 g) of Example 16, 0.5 g of 2,6-bis(azidebenzylidene)4-methylcylohexanone and 1.5 g of Michler's ketone were added and the resultant was mixed with a mixer. The mixture was coated on a copper foil by spin coating to 10 $\mu$m of thickness after drying. The coated layer was irradiated in the similar manner as in Example 19. Posi-typed images were not formed by irradiation of 2500 mJ.

EXAMPLE 22

In 25 g of the polyimide solution (polyimide 5 g) of Example 16, 1.5 g of Michler's ketone and 1.5 of naphthoquinone diazide-1,2,5-o-cresol ester were added and the resultant was mixed with a mixer. The mixture was coated on a copper foil by spin coating to 10 $\mu$m of thickness after drying. The coated layer was irradiated in the similar manner as in Example 19. Sensitive images were obtained by irradiation of 300 mJ.

EXAMPLE 23

In 25 g of the polyimide solution (polyimide 5 g) of Example 16, 1.5 g of naphthoquinone diazide-1,2,5-o-cresol ester was added and was mixed with a mixer to obtain a uniform solution. As in Example 19, the mixture was coated on a copper foil by spin coating to 10 $\mu$m of thickness after drying. The resulting polyimide layer was dried at 90° C. for 10 minutes and then irradiated with UV light of 300 mJ, immediately followed by treatment with a developer. As a result, in about 30 seconds, images emerged, and the polyimide layer was washed with water. After drying, the polyimide layer was treated at 150° C. for 30 minutes. In the through hole test, although formation of holes with a diameter of 20 $\mu$m was confirmed, the sharpness of the holes was poor.

On the other hand, after irradiation with light, the coated layer was heated at 150° C. for 10 minutes in an infrared oven, developed and heated at 150° C. for 30 minutes. Then the polyimide layer was treated with the developer for 5 minutes and then washed with water. With a positive-type test mask, formation of holes with a diameter of 15 $\mu$m was confirmed, but formation of holes with a diameter of 10 $\mu$m was not confirmed. When a negative-type test mask was used, the regions corresponding to the holes were observed as sharp projections with a diameter of 10 $\mu$m, so that formation of images of 10 $\mu$m size was confirmed.

EXAMPLE 24

A stainless steel anchor agitator and reflux condenser were attached to a 1-liter three-necked separable flask, the condenser comprising a trap and a cooling tube having balls and mounted on the trap. While heating the flask under nitrogen gas flow and under stirring, 17.77 g (40 mmol) of 6FDA (commercial product of Hoechst-Celanese), 8.65 g (20 mmol) of m-BAPS, 6.97 g (20 mmol) of 9,9-bis(4-aminophenyl)fluorene (commercial product of Wakayama Seika Co., Ltd., hereinafter referred to as "FDA"), 0.4 g (4 mmol) of $\gamma$-valerolactone., 0.6 g (8 mmol) of pyridine, 128 g of N-methylpyrrolidone and 30 g of toluene were added in the flask. After stirring the mixture at 200 rpm at room temperature under nitrogen atmosphere for 30 minutes, the mixture was heated at 180° C. and stirred at 180 rpm for 5.85 hours. In the reaction, toluene-water azeotrope was removed.

The polymer concentration thus obtained was 20% by weight. The molecular weights based on polystyrene measured as in Example 1 were: Number Average Molecular Weight (Mn): 49,700; Weight Average Molecular Weight (Mw): 85,200; Z Average Molecular Weight (Mz): 123,000; Mw/Mn=1.71. This polyimide was poured into methanol to convert it to powders which were subjected to thermal analysis. The thermal decomposition temperature of the polyimide was 540° C.

EXAMPLE 25

(1) Preparation of Photosensitive Composition

A photosensitive composition was prepared by mixing 15 g (polyimide content: 3 g) of the polyimide solution obtained in Example 24 and 0.9 g of 1,2-naphthoquinone-2-diazide-5-sulfonic acid-o-cresol ester, and filtering the mixture through a filter having 3 $\mu$m diameter of pores.

(2) Formation of Images

The above-described photosensitive composition was spin-coated on 5 cm of diameter of surface-treated copper foil (commercial product of Nippon Denkai, 18 $\mu$m thickness). Thereafter, the coated layer was dried at 90° C.

for 10 minutes in an infrared oven. The thickness of this photosensitive layer was about 10 μm.

On this photosensitive layer, a test pattern (through holes and line-and-space pattern having diameters and widths of 10, 15, 20, 25, - - - , and 200 μm, respectively) was placed, and the coating layer was irradiated at a dose of exposure at which images are obtained using 2 kW extra-high pressure mercury lamp apparatus (JP-2000G, commercial product of Oak Seisakusho).

The photosensitive layer was irradiated with an energy of 300 mJ and then developed under the following conditions. The developer was a mixture of 40 g of N-methylpyrrolidone, 25 g of aminoethanol, 25 g of methanol and 10 g of water. The coating layer after the irradiation was dipped in this solution for 1 minute and 25 seconds, washed with deionized water, dried with an infrared lamp, and the resolution was observed. The thickness of this polyimide layer after drying at 90° C. for 30 minutes was about 9 μm.

As for the through hole patterns in the coating polyimide layer, formation of through holes having sharp and circular sections having a diameter of 15 μm was confirmed. As for the line-and-space pattern, formation of images of lines having a width of 10 μm was confirmed.

COMPARATIVE EXAMPLE 3

In 15 g of the polyimide solution obtained in Example 24, 0.9 g of Michler's ketone was added and the mixture was well mixed to obtain a uniform solution. The composition was irradiated with UV light of 2500 mJ, and then treated in the same manner as in Example 25, but images were not obtained.

COMPARATIVE EXAMPLE 4

In 15 g of the polyimide solution obtained in Example 24, 0.9 g of Michler's ketone and 0.3 g of 2,6-bis(4-azidebenzilidene)-4-methylcyclohexanone were added and the mixture was well mixed to obtain a uniform solution. The composition was irradiated with UV light of 2500 mJ, and then treated in the same manner as in Example 25, but posi-typed images were not obtained.

EXAMPLE 26

The procedure was run the same way as Example 24.

A stainless steel anchor agitator and reflux condenser were attached to a 1-liter three-necked separable flask, the condenser comprising a trap and a cooling tube having balls and mounted on the trap. While heating the flask under nitrogen gas flow and under stirring, 12.89 g (40 mol) of BTDA, 8.65 g (20 mmol) of bis{4-(3-aminophenoxy)phenyl}sulfone, 6.97 g (20 mmol) of 9,9-bis(4-aminophenyl)fluorene, 0.4 g (4 mmol) of γ-valerolactone, 0.6 g (8 mmol) of pyridine, 108 g of N-methylpyrrolidone and 30 g of toluene were added in the flask. After stirring the mixture at 200 rpm at room temperature under nitrogen atmosphere for 30 minutes, the mixture was heated at 180° C. (bath temperature) and stirred at 180 rpm for 2 hours. While removing the toluene-water azeotrope (14 ml) accumulated in the trap, the reaction completed.

The polymer concentration thus obtained was 20% by weight. The molecular weights based on polystyrene measured as in Example 1 were: Number Average Molecular Weight (Mn): 32,300; Weight Average Molecular Weight (Mw): 83,100; Z Average Molecular Weight (Mz): 196,000; Mw/Mn=2.58. This polyimide was poured into methanol to convert it to powders which were subjected to thermal analysis. The thermal decomposition temperature of the polyimide was 549° C.

EXAMPLE 27

(1) Preparation of Photosensitive Composition

A photosensitive composition was prepared by mixing 15 g (polyimide content: 3 g) of the polyimide solution obtained in Example 26 and 0.9 g of 1,2-naphthoquinone-2-diazide-5-sulfonic acid-o-cresol ester, and filtering the mixture through a filter having 3 μm diameter of pores.

(2) Formation of Images

The above-described photosensitive composition was spin-coated on 5 cm diameter of a surface-treated copper foil (commercial product of Nippon Denkai, 18 μm thickness). Thereafter, the coated layer was dried at 90° C. for 10 minutes in an infrared oven. The thickness of this photosensitive layer was about 10 μm.

On this photosensitive layer, a test pattern (through holes and line-and-space pattern having diameters and widths of 10, 15, 20, 25, - - - , and 200 μm, respectively) for positive-type photomask was placed, and the coating layer was irradiated at a dose of exposure at which images are obtained using 2 kW extra-high pressure mercury lamp apparatus (JP-2000G, commercial product of Oak Seisakusho).

The photosensitive layer was irradiated with an energy of 300 mJ and then developed under the following conditions. The developer was a mixture of 40 g of N-methylpyrrolidone, 25 g of aminoethanol, 25 g of methanol and 10 g of water. The coating layer after the irradiation was dipped in this solution for 3 minutes, washed with deionized water, dried with an infrared lamp, and the resolution was observed. The thickness of this polyimide layer after drying at 90° C. for 30 minutes was about 9 μm.

As for the through hole patterns in the coating polyimide layer, formation of through holes having sharp and circular sections having a diameter of 20 μm was confirmed. As for the line-and-space pattern, formation of images of lines having a width of 15 μm was confirmed.

EXAMPLE 28

The starting mixture having the same composition as in Example 26 was stirred at 200 rpm at room temperature under nitrogen atmosphere for 30 minutes, the mixture was heated at 180° C. (bath temperature) and stirred at 180 rpm for 2.4 hours. While removing the toluene-water azeotrope (14 ml) accumulated in the trap, the reaction completed.

The polymer concentration thus obtained was 20% by weight. The molecular weights based on polystyrene measured as in Example 1 were: Number Average Molecular Weight (Mn): 46,800; Weight Average Molecular Weight (Mw): 214,000; Z Average Molecular Weight (Mz): 738,000; Mw/Mn=4.57, Mz/Mn=15.74.

The obtained composition was irradiated with light and then developed in the same manner as in Example 26. After irradiation with light of 500 mJ, the photosensitive layer was dipped in the same solution for 12 minutes and washed with water. As for the line-and-space pattern, formation of sharp images of lines having a width of 15 μm was confirmed.

EXAMPLE 29

(1) Preparation of 9,9-bis(3-methyl-4-aminophenyl)fluorene

In the same apparatus as used in Example 24, 10 g (55.5 mmol) of fluorenone, 20kg (186 mmol) of o-tolidine, 3 g (15.8 mmol) of p-toluenesulfonic acid monohydrate, 100 g of sulfolane and 20 g of toluene were added and the mixture was allowed to react at 180° C. for 2 hours. To the reaction product, 400 mL of 10% aqueous potassium hydroxide solution and 200 mL of water were added, and precipitates were formed. The precipitates were recovered by decantation and washed with hot water 4 times. The resultant was then further washed twice with hot water and then dried under reduced pressure.

(2) Preparation of Polyimide

In the same apparatus as used in Example 24, 7.53 g (20 mmol, Molecular Weight: 376.5) of the compound described above, 12.89 g (40 mmol) of BTDA, 8.65 g (20 mmol) of m-BAPS, 0.4 g (4 mmol) of γ-valerolactone, 0.6 g (8 mmol) of pyridine, 111 g of N-methylpyrrolidone and 30 g of toluene were added, and the mixture was allowed to react at 180° C. at 180 rpm for 3.7 hours as in Example 24.

(3) Preparation of Photosensitive Composition and Formation of Images 15 g of this reaction solution and 15 g of the reaction solution of Example 26 were mixed, and 1.8 g of naphthoquinone diazide sulfonic acid-o-cresol ester was added thereto, followed by making the mixture to a uniform solution. By the operations similar to those in Example 25, after irradiation with light of 100 mJ, and after development for 30 seconds, good images were obtained with high resolution.

EXAMPLE 30

The procedure was run the same way as Example 24.

25.7 g (80 mmol) of BTDA, 13.94 g (40 mmol) of FDA, 0.8 g (8 mmol) of γ-valerolactone, 1.2 g (16 mmol) of pyridine, 113 g of N-methylpyrrolidone and 30 g of toluene were added, and the mixture was allowed to react at 180° C. at 180 rpm for 1 hour as in Example 24.

After cooling the mixture at room temperature, 16.42 g (40 mm of 2,2-bis{4-(4-aminophenoxy)phenyl}propane, 100 g of N-methylpyrrolidone and 20 g of toluene were added and the resulting mixture was allowed to react at room temperature for 1 hour, and then heated at 180° C. at 180 rpm for 1.5 hours. After the reaction, 30 g of N-methylpyrrolidone was added to obtain a polyimide solution having a concentration of 18%, with which a strong film formed by placing an aliquot of this solution on a glass plate and drying the solution at 130° C.

The molecular weights based on polystyrene measured as in Example 1 were: Number Average Molecular Weight (Mn): 26,300; Weight Average Molecular Weight (Mw): 131,700; Z Average Molecular Weight (Mz) 445,200; Mw/Mn=5.00; Mz/Mn=15.91. The thermal decomposition temperature of the polyimide was 559° C.

In 20 g of the reaction solution, 2.8 g of naphthoquinone diazide sulfonic acid-o-cresol ester was added and the mixture was made to a uniform solution. As in Example 25, the photosensitive layer was subjected to irradiation with light of 300 mJ, heated at 170° C. for 5 seconds, dipped in the developer for 2.5 minutes, washed with water and dried with infrared light. The resolution was determined using a negative-type mask and a positive-type mask. As a result, sharp circular holes with a diameter of 10 μm and sharp line images with a width of 10 μm were obtained with a sensitive resolution as posi-typed good images.

EXAMPLE 31

A stainless steel anchor agitator and reflux condenser were attached to a 1-liter three-necked separable flask, the condenser comprising a trap and a cooling tube having balls and mounted on the trap. While heating the flask under nitrogen gas flow and under stirring, 32.22 g (100 mmol) of BTDA, 5.45 g (50 mmol) of 2,6-diaminopyridine (commercial product of Aldrich), 21.625 g (50 mmol) of m-BAPS, 1.0 g (10 mmol) of γ-valerolactone, 1.6 g (20 mmol) of pyridine, 223 g of N-methylpyrrolidone and 30 g of toluene were added. After stirring the mixture at 180 rpm at room temperature under nitrogen atmosphere for 30 minutes, the mixture was heated at 180° C. and stirred at 180 rpm for 3.5 hours. In the reaction, toluene-water azeotrope was removed.

The polymer concentration thus obtained was 20% by weight. The molecular weights based on polystyrene measured as in Example 1 were: Number Average Molecular Weight (Mn): 10,500; Weight Average Molecular Weight (Mw): 15,800; Z Average Molecular Weight (Mz):22,600; Mw/Mn=1.51; Mz/Mn=2.15.

EXAMPLE 32

(1) Preparation of Photosensitive Composition

A photosensitive composition was prepared by mixing 15 g (polyimide content: 3 g) of the polyimide solution obtained in Example 31 and 0.9 g of 1,2-naphthoquinone-2-diazide-5-sulfonic acid-o-cresol ester, and filtering the mixture through a filter having 3 μm diameter of pores.

(2) Formation of Images

The above-described photosensitive composition was spin-coated on 5 cm diameter of surface-treated copper foil (commercial product of Nippon Denkai, 18 μm thickness). Thereafter, the coated layer was dried at 90° C. for 10 minutes in an infrared oven. The thickness of this photosensitive layer was about 10 μm.

On this photosensitive lawyer, a test pattern (through holes and line-and-space pattern having diameters and widths of 10, 15, 20, 25, - - - , and 200 μm, respectively) for positive-type photomask was placed, and the coating layer was irradiated at a dose of exposure at which images are obtained using 2 kW extra-high pressure mercury lamp apparatus (JP-2000G, commercial product of Oak Seisakusho).

The photosensitive layer was irradiated with an energy of 300 mJ and then developed under the following conditions. The developer was a mixture of 40 g of N-methylpyrrolidone, 10 g of aminoethanol, 25 g of methanol and 25 g of water. The coating layer after the irradiation was dipped in this solution for 1 minute and 15 seconds, washed with deionized water, dried with an infrared lamp, and the resolution was observed. The thickness of this polyimide layer after drying at 90° C. for 30 minutes was about 9 μm.

As for the through hole patterns in the coating polyimide layer, formation of through holes having sharp and circular sections with a diameter of 15 μm was confirmed As for the line-and-space pattern, formation of images of lines having a width of 10 μm was confirmed.

EXAMPLE 33

The procedure was run the same way as Example 24.

While heating the flask under nitrogen gas flow and under stirring, 29.422 g (100 mmol) of BPDA, 5.45 g (50 mmol) of 2,6-diaminopyridine (commercial product of Aldrich), 29.975 g (50 mmol) of bis{4-(3-aminophenoxy) phenyl}hexafluoropropane (commercial product of Wakayama Seika Co., Ltd.), 1.0 g (10 mmol) of γ-valerolactone, 1.6 g (20 mmol) of pyridine, 229 g of N-methylpyrrolidone and 30 g of toluene were added in the flask. After stirring the mixture at 180 rpm at room temperature under nitrogen atmosphere for 30 minutes, the mixture was heated at 180° C. and stirred at 180 rpm for 2.0 hours. In the reaction, toluene-water azeotrope was removed.

The polymer concentration thus obtained was 20% by weight. The molecular weights based on polystyrene measured by high performance liquid chromatography (commercial product of Tosoh Corporation) were: Number Average Molecular Weight (Mn): 9,300; Weight Average Molecular Weight (Mw): 14,600; Z Average Molecular Weight (Mz): 21,300; Mw/Mn=1.55; Mz/Mn=2.26.

EXAMPLE 34

(1) Preparation of Photosensitive Composition

A photosensitive composition was prepared by mixing 15 g (polyimide content: 3 g) of the polyimide solution obtained in Example 33 and 0.9 g of 1,2-naphthoquinone-2-diazide-5-sulfonic acid-o-cresol ester, and filtering the mixture through a filter having 3 μm diameter of pores.

(2) Formation of Images

Photosensitive composition layer was prepared by the method described in Example 32(2).

On this photosensitive layer, a test pattern (through holes and line-and-space pattern having diameters and widths of 10, 15, 20, 25, - - - , and 200 μm, respectively), for positive-type photomask was placed, and the coating layer was irradiated at a dose of exposure at which images are obtained using 2 kW extra-high pressure mercury lamp apparatus (JP-2000G, commercial product of Oak Seisakusho).

The photosensitive layer was irradiated with an energy of 200 mJ and then developed under the following conditions. The developer was a mixture of 10 g of methanol, 20 g of 15% tetramethylammonium hydroxide solution and 40 g of water. The coating layer after the irradiation was dipped in this solution for 5 minutes, washed with deionized water, dried with an infrared lamp, and the resolution was observed. The thickness of this polyimide layer after drying at 90° C. for 30 minutes was about 9 μm.

As for the through hole patterns in the coating polyimide layer, formation of through holes having sharp and circular sections having a diameter of 15 μm was confirmed. As for the line-and-space pattern, formation of images of lines having a width of 10 μm was confirmed.

EXAMPLE 35

The procedure was run the same way as Example 31.

A stainless steel anchor agitator and reflux condenser were attached to a 1-liter three-necked separable flask, the condenser comprising a trap and a cooling tube having balls and mounted on the trap. While heating the flask under nitrogen gas flow and under stirring, 19.33 g (60 mmol) of BTDA, 3.66g (30 mmol) of 2,4-diaminotoluene, 1.0 g (10 mmol) of γ-valerolactone, 1.6 g (20 mmol) of pyridine, 100 g of N-methylpyrrolidone and 20 g of toluene were placed in the flask. After stirring the mixture at 180 rpm at room temperature under nitrogen atmosphere for 30 minutes, the mixture was heated at 180° C. and stirred at 180 rpm for 1 hour. In the reaction, toluene-water azeotrope was removed.

Thereafter, 8.827 g (30 mmol) of 3,4,3',4'-biphenyltetracarboxylic dianhydride, 3.274 g (30 mmol) of 2,6-diaminopyridine, 12.315 g (30 mmol) of 2,2-bis{4-(4-aminophenoxy)phenyl}propane (Wakayama Seika Co., Ltd.), 77 g of N-methylpyrrolidone and 10 g of toluene were added. After stirring the mixture at 180 rpm at room temperature under nitrogen atmosphere for 30 minutes, the mixture was heated to 180° C. and stirred at 180 rpm for 1 hour. In the reaction, toluene-water azeotrope was removed. This second step reaction was carried out for 2 hours and 10 minutes.

The polymer concentration thus obtained was 20% by weight. The molecular weights based on polystyrene measured as in Example 1 were: Number Average Molecular Weight (Mn): 12,300; Weight Average Molecular Weight (Mw): 20,000; Z Average Molecular. Weight (Mz): 29,900; Mw/Mn=1.62; Mz/Mn=2.42.

EXAMPLE 36

(1) Preparation of Photosensitive Composition

A photosensitive composition was prepared by mixing 15 g (polyimide content: 3 g) of the polyimide solution obtained in Example 35 and 0.9 g of 1,2-naphthoquinone-2-diazide-5-sulfonic acid-o-cresol ester, and filtering the mixture through a filter having 3 μm diameter of pores.

(2) Formation of Images

Photosensitive composition layer was prepared by the method described in Example 32(2).

On this photosensitive coating membrane, a test pattern (through holes and line-and-space pattern having diameters and widths of 10, 15, 20, 25, - - - , and 200 μm, respectively) for positive-type photomask was placed, and the coating layer was irradiated at a dose of exposure at which images are obtained using 2 kW extra-high pressure mercury lamp apparatus (JP-2000G, commercial product of Oak Seisakusho).

The photosensitive layer was irradiated with an energy of 100 mJ and then developed with the developer as used in Example 32. The coating layer was dipped in the solution for 1 minute, washed with deionized water, dried with an infrared lamp, and the resolution was observed. The thickness of this polyimide layer after drying at 90° C. for 30 minutes was 9 μm.

As for the through hole patterns in the coating polyimide layer, formation of through holes having sharp and circular sections having a diameter of 15 μm was confirmed. As for the line-and-space pattern, formation of images of lines having a width of 10 μm was confirmed.

EXAMPLE 37

Two-step reaction was carried out in a basically similar manner to Example 35.

A stainless steel anchor agitator and reflux condenser were attached to a 1-liter three-necked separable flask, the condenser comprising a trap and a cooling tube having balls and mounted on the trap. While heating the flask under nitrogen gas flow and under stirring, 9.93 g (40 mmol) of bicyclo(2,2,2)-oct-7-ene-2,3,5,6-tetracarboxylic dianhydride (commercial product of Aldrich), 4.00 g (20 mmol) of 3,4'-diaminodiphenyl ether, 0.6 g (10 mmol) of γ-valerolactone, 1.0 g (12 mmol) of pyridine, 76 g of N-methylpyrrolidone and 30 g of toluene were added in the flask. After stirring the mixture at 180 rpm at room temperature under nitrogen atmosphere for 30 minutes, the mixture was heated at 180° C. and stirred at 180 rpm for 1 hour. In the reaction, toluene-water azeotrope was removed.

Thereafter, 6.44 g (20 mmol) of BTDA, 2.18 g (20 mmol) of 2,6-diaminopyridine, 8.65 g (20 mmol) of bis{4-(3-aminophenoxy)phenyl}sulfone, 40 g of N-methylpyrrolidone and 10 g of toluene were added. After stirring the mixture at 180 rpm at room temperature under nitrogen atmosphere for 30 minutes, the mixture was heated at 180° C. and stirred at 180 rpm for 1 hour. In the reaction, toluene-water azeotrope was removed. This second step reaction was carried out for 3 hours.

The polymer concentration thus obtained was 20% by weight. The molecular weights based on polystyrene measured as in Example 1 were: Number Average Molecular Weight (Mn): 10,300; Weight Average Molecular Weight (Mw): 14,000; Z Average Molecular Weight (Mz): 18,600; Mw/Mn=1.36; Mz/Mn=1.81

EXAMPLE 38

(1) Preparation of Photosensitive Composition

A photosensitive composition was prepared by mixing 15 g (polyimide content: 3 g) of the polyimide solution obtained in Example 37 and 0.9 g of 1,2-naphthoquinone-2-diazide-5-sulfonic acid-o-cresol ester, and filtering the mixture through a filter having 3 µm diameter of pores.

(2) Formation of Images

Photosensitive composition layer was prepared by the method described in Example 32(2).

On this photosensitive coating membrane, a test pattern (through holes and line-and-space pattern having diameters and widths of 10, 15, 20, 25, - - - , and 200 µm, respectively) for positive-type photomask was placed, and the coating layer was irradiated at a dose of exposure at which images are obtained using 2 kW extra-high pressure mercury lamp apparatus (JP-2000G, commercial product of Oak Seisakusho).

The photosensitive layer was irradiated with an energy of 300 mJ and then developed with the developer having the following composition. That is, the developer was a mixture of 3 g of potassium hydroxide and 100 g of water. The coating layer was dipped in the solution for 3 minutes, washed with deionized water, dried with an infrared lamp, and the resolution was observed. The thickness of this polyimide membrane after drying at 90° C. for 30 minutes was 9 µm.

As for the through hole patterns in the coating polyimide layer, formation of through holes having sharp and circular sections having a diameter of 15 µm was confirmed. As for the line-and-space pattern, formation of images of lines having a width of 10 µm was confirmed.

EXAMPLE 39

A stainless steel anchor agitator and reflux condenser were attached to a 1-liter three-necked separable flask, the condenser comprising a trap and a cooling tube having balls and mounted on the trap 19.33 g (60 mol) of BTDA, 5.91 g (30 mmol) of 2,4-diaminophenol dichloride (commercial product of Tokyo Chemical Industry Co., Ltd.), 2.98 g (30 mmol) of bis{4-(3-aminophenoxy)phenyl}sulfone (Wakayama Seika Co., Ltd.), 1.0 g (10mmol) of γ-valerolactone, 10 g (100 mmol) of N-methylmorpholine, 144 g of N-methylpyrrolidone and 40 g of toluene were added.

After stirring the mixture at 180 rpm at room temperature under nitrogen atmosphere for 30 minutes, the mixture was heated at 180° C. (bath temperature) and stirred at 180 rpm for 0.5 hours. While removing the toluene-water azeotrope accumulated in the trap, the reaction completed.

The polymer concentration thus obtained was 20% by weight. The molecular weights based on polystyrene measured as in Example 1 were: Number Average Molecular Weight (Mn): 42,500; Weight Average Molecular Weight (Mw): 66,000; Z Average Molecular Weight (Mz): 1,007,500; Mw/Mn=3.91; Mz/Mn=11.96. This polyimide was poured into methanol and the resultant was filtered, followed by drying in an infrared oven at 300° C. for 30 minutes to convert it to powders.

EXAMPLE 40

The procedure was run the same way as Example 39.

26.66 g (60 mmol)of 6FDA, 5.91 g (30 µmmol) of 2,4-diaminophenol dichloride (commercial product of Tokyo Chemical Industry Co., Ltd.), 15.56 g (30 mmol) of 2,2-bis{4-(4-aminophenoxy)phenyl}hexafluoropropane (commercial product of Wakayama Seika Co., Ltd.), 1.0 g (10 mmol) of γ-valerolactone, 10 g (100 mmol) of N-methylmorpholine, 184 g of N-methylpyrrolidone and 40 g of toluene were added. After stirring the mixture at 200 rpm at room temperature under nitrogen atmosphere for 30 minutes, the mixture was heated at 180° C. and stirred at 180 rpm for 70 minutes 77 g of N-methylpyrrolidone was added. In the reaction, toluene-water azeotrope was removed.

The polymer concentration thus obtained was 15% by weight. The molecular weights based on polystyrene measured as in Example 1 were: Number Average Molecular Weight (Mn): 111,500; Weight Average Molecular Weight (Mw): 303,600; Z Average Molecular Weight (Mz): 682,400; Mw/Mn=2.72; Mz/Mn=6.12. An aliquot of this polyimide was poured into methanol to convert it to powders.

EXAMPLE 41

The procedure was run the same way as Example 39.

17.65 g (60 mol) of 3,4,3',4'-biphenyltetracarboxylic dianhydride, 5.91 g (30 mmol) of 2,4-diaminophenol dichloride, 12.32 g (30 mmol) of 2,2-bis{4-(4-aminophenoxy)phenyl}propane (Wakayama Seika Co., Ltd.), 1.0 g (10 mmol) of γ-valerolactone, 10 g (100 mmol) of N-methylmorpholine; 135g of N-methylpyrrolidone and 40 g of toluene were added. After stirring the mixture at 180 rpm at room temperature under nitrogen atmosphere for 30 minutes, the mixture was heated at 180° C. (bath temperature) and stirred at 180 rpm for 1 hour. While removing the toluene-water azeotrope accumulated in the trap, the reaction completed.

The polymer concentration thus obtained was 20% by weight. The molecular weights based on polystyrene measured as in Example 1 were: Number Average Molecular Weight (Mn): 31,700; Weight Average Molecular Weight (Mw): 57,200; Z Average Molecular Weight (Mz): 89,500; Mw/Mn=1.81; Mz/Mn=2.82. This polyimide was poured into methanol and the resultant was filtered, followed by drying in an infrared oven at 200° C. for 30 minutes to convert it to powders.

EXAMPLE 42

(1) Preparation of Photosensitive Compositions

Photosensitive compositions were prepared by mixing the components shown in Tables 9 and 10 below and filtering the mixtures through a filter having 3 µm diameter of pores.

TABLE 9

| | Composition | | |
|---|---|---|---|
| Components | XV | XVI | XVII |
| Polyimide Solution | Example 39 | Example 40 | Example 41 |
| Weight | 15 g | 20 g | 15 g |
| (Polyimide Content) | 3 g | 3 g | 3 g |
| 1,2-naphthoquinone-2-diazide-5-sulfonic acid-o-cresol ester | 0.9 g | 0.9 g | 0.9 g |

TABLE 10

| Components | Composition | | |
|---|---|---|---|
| | XVIII | XIX | XX |
| Polyimide Powder | Example 39 | Example 40 | Example 41 |
| Polyimide Weight | 3.0 g | 3.0 g | 3.0 g |
| 1,2-naphthoquinone-2-diazide-5-sulfonic acid-o-cresol ester | 0.9 g | 0.9 g | 0.9 g |
| N-methylpyrrolidone | 12 g | 12 g | 12 g |

(2) Formation of Images

Each of the above-described 6 photosensitive layers was spin-coated on 5 cm 5 diameter of a surface-treated copper foil (commercial product of Nippon Denkai, 18 μm thickness). Thereafter, the coated composition was dried at 90° C. for 10 minutes in an infrared hot air dryer. The thickness of this photosensitive layer was about 10 μm.

On this photosensitive coating layer, a test pattern (through holes and line-and-space pattern having diameters and widths of 10, 15, 20, 25, - - - , and 200 μm, respectively) for positive-type photomask was placed, and the coating layer was irradiated at a dose of exposure at which images are obtained using 2 kW extra-high pressure mercury lamp apparatus (JP-2000G, commercial product of Oak Seisakusho).

Each of the compositions XV–XX was irradiated with UV light with an appropriate dose shown in Table 11 below, and then developed under the conditions shown in Table 11. The coating layer after irradiation with UV light was dipped in this solution under the conditions shown in Table 11, washed with deionized water, dried with an infrared lamp, and the resolution was observed. The thickness of this polyimide layer after drying at 90° C. for 30 minutes was 9 μm.

TABLE 11

| Composition | XV | XVI | XVII | XVIII | XIX | XX |
|---|---|---|---|---|---|---|
| Dose of Irradiated UV Light (mJ) | 500 | 300 | 300 | 500 | 500 | 300 |
| Dipping Time (second) | 5 | 10 | 230 | 197 | 240 | 600 |
| Composition of Dipping Solution | 1 | 1 | 2 | 1 | 1 | 2 |

(Composition 1: 40 g of N-methylpyrrolidone, 10 g of aminoethanol, 25 g of methanol and 25 g of water)
(Composition 2: 3 g of potassium hydroxide and 100 g of water)

As for the through hole patterns in the coating polyimide layer, formation of through holes having sharp and circular sections having a diameter of 15 μm was confirmed. As for the line-and-space pattern, formation of images of lines having a width of 10 μm was confirmed.

EXAMPLE 43

The procedure was run the same way as Example 39.

11.77 g (40 mol) of 3,4,3',4'-biphenyltetracarboxylic dianhydride, 4.29 g (20 mmol) of 3,3'-dihydroxy-4,4'-diaminobiphenyl (Wakayama Seika Co., Ltd.), 5.85 g (20 mmol) of 1,3-bis(4-aminophenoxy)benzene (Wakayama Seika Co., Ltd.), 0.8 g (8 mmol) of γ-valerolactone, 1.6 g (20 mmol) of pyridine, 82 g of N-methylpyrrolidone and 40 g of toluene were added. After stirring the mixture at 180 rpm at room temperature under nitrogen atmosphere for 30 minutes, the mixture was heated at 180° C. (bath temperature) and stirred at 180 rpm for 1 hour. While removing the toluene-water azeotrope accumulated in the trap, the reaction completed. After the reaction, 34 g of N-methylpyrrolidone was added.

The polymer concentration thus obtained was 18% by weight. The molecular weights based on polystyrene measured as in Example 1 were: Number Average Molecular Weight (Mn): 31,800; Weight Average Molecular Weight (Mw): 59,600; Z Average Molecular Weight (Mz): 102,300; Mw/Mn=1.87; Mz/Mn=3.22. This polyimide solution was poured into methanol and the resultant was filtered, followed by drying in an infrared oven at 200° C. for 30 minutes to convert it to powders which were subjected to thermal analysis. The thermal decomposition temperature was 559° C.

EXAMPLE 44

The procedure was run the same way as Example 39.

12.87 g (40 mol) of 3,4,3',4'-biphenyltetracarboxylic dianhydride, 4.29 g (20 mmol) of 3,3'-dihydroxy-4,4'-diaminobiphenyl (Wakayama Seika Co., Ltd.), 8.65 g (20 mmol) of bis-{4-(3-aminophenoxy)phenyl}sulfone (Wakayama Seika Co., Ltd.), 0.8 g (8 mmol) of γ-valerolactone, 1.2 g (16 mmol) of pyridine, 98 g of N-methylpyrrolidone and 40 g of toluene were added. After stirring the mixture at 180 rpm at room temperature under nitrogen atmosphere for 30 minutes, the mixture was heated at 180° C. (bath temperature) and stirred at 180 rpm for 1.5 hours. While removing the toluene-water azeotrope accumulated in the trap, the reaction completed.

The polymer concentration thus obtained was 20% by weight. The molecular weights based on polystyrene measured as in Example 1 were: Number Average Molecular Weight (Mn): 19,000; Weight Average Molecular Weight (Mw): 35,800; Z Average Molecular Weight (Mz): 60,300; Mw/Mn=1.86; Mz/Mn=3.14. An aliquot of this polyimide was poured into methanol and the resultant was filtered, followed by drying in an infrared oven at 200° C. for 30 minutes to convert it to powders which were subjected to thermal analysis. The thermal decomposition temperature was 552° C.

EXAMPLE 45

The procedure was run the same way as Example 39.

17.77 g (40 mol) of 6FDA, 4.29 g (20 mmol) of 3,3'-dihydroxy-4,4'-diaminobiphenyl (Wakayama Seika Co., Ltd.), 8.65 g (20 mmol) of bis-{4-(3-aminophenoxy)phenyl}sulfone (Wakayama Seika Co., Ltd.), 0.8 g (8 mmol) of γ-valerolactone, 1.2 g (16 mmol) of pyridine, 117 g of N-methylpyrrolidone and 40 g of toluene were added. After stirring the mixture at 180 rpm at room temperature under nitrogen atmosphere for 30 minutes, the mixture was heated at 180° C. (bath temperature) and stirred at 180 rpm for 3.7 hours. While removing the toluene-water azeotrope accumulated in the trap, the reaction completed.

The polymer concentration thus obtained was 20% by weight. The molecular weights based on polystyrene measured as in Example 1 were: Number Average Molecular Weight (Mn): 111,600; Weight Average Molecular Weight (Mw): 196,000; Z Average Molecular Weight (Mz): 311,700; Mw/Mn=1.76; Mz/Mn=2.79. This polyimide was poured into methanol and the resultant was filtered, followed by drying in an infrared oven at 200° C. for 30 minutes to convert it to powders which were subjected to thermal analysis. The thermal decomposition temperature was 552° C.

EXAMPLE 46

(1) Preparation of Photosensitive Compositions

Photosensitive compositions were prepared by mixing the components shown in Table 12 below and filtering the mixtures through a filter having 3 μm diameter of pores.

TABLE 12

| Components Polyimide Solution | Composition | | |
|---|---|---|---|
| | XXI Example 43 | XXII Example 44 | XXIII Example 45 |
| Weight | 15 g | 15 g | 15 g |
| (Polyimide Content) | 2.7 g | 3 g | 3 g |
| 1,2-naphthoquinone-2-diazide-5-sulfonic acid-o-cresol ester | 0.9 g | 0.9 g | 0.9 g |

(2) Formation of Images

Each of the above-described photosensitive compositions (XXI, XXII and XXIII) was spin-coated on 5 cm diameter of surface-treated copper foil (commercial product of Nippon Denkai, 18 μm thickness) by spin coating method. Thereafter, the coated layer was dried at 90° C. for 10 minutes in an infrared oven. The thickness of this photosensitive layer was about 10 μm.

On this photosensitive coating layer, a test pattern (through holes and line-and-space pattern having diameters and widths of 10, 15, 20, 25, - - - , and 200 μm, respectively) for positive-type photomask was placed, and the coating layer was irradiated at a dose of exposure at which images are obtained using 2 kW extra-high pressure mercury lamp apparatus (JP-2000G, commercial product of Oak Seisakusho).

Each of the compositions XXI, XXII and XXIII was irradiated with UV light with an appropriate dose shown in Table 13 below, and then developed under the conditions shown in Table 13. The coating layer after irradiation with UV light was dipped in this solution under the conditions shown in Table 13, washed with deionized water, dried with an infrared lamp, and the resolution was observed. The thickness of this polyimide layer after drying at 90° C. for 30 minutes was 9 μm.

TABLE 13

| Composition | XXI | XXII | XXIII |
|---|---|---|---|
| Dose of Irradiated UV Light (mJ) | 200 | 300 | 300 |
| Dipping Time (second) | 60 | 5 | 60 |
| Composition of Dipping Solution | 3 | 3 | 3 |

(Composition 3: 20 g of aminoethanol, 10 g of glycerin and 50 g of water)

As for the through hole patterns in the coating polyimide layer, formation of through holes having sharp and circular sections having a diameter of 15 μm was confirmed. As for the line-and-space pattern, formation of images of lines having a width of 10 μm was confirmed.

The polyimide coating layer was then heated in infrared oven at 260° C. for 30 minutes, and the adhesion between the polyimide membrane and the copper foil was evaluated by cross cut test (1 mm×1 mm interval cross test). As a result, 100/100 lattices remained adhered, so that the adhesion between the polyimide layer and the copper foil was good.

EXAMPLE 47

The procedure was run the same way as Example 39.

12.89 g (40 mmol) of BTDA, 8.65 g (20 mmol) of bis-{4-(3-aminophenoxy)phenyl}sulfone, 0.4 g (4 mmol) of γ-valerolactone, 0.64 g (8 mmol) of pyridine, 77 g of N-methylpyrrolidone and 30 g of toluene were added. After stirring the mixture at 180 rpm at room temperature under nitrogen atmosphere for 30 minutes, the mixture was heated at 180° C. (bath temperature) and stirred at 180 rpm for 1 hour. While removing the toluene-water azeotrope accumulated in the trap, the reaction completed.

2.16 g (10 mmol) of 3,3'-dihydroxy-4,4'-diaminobiphenyl, 2.00 g (10 mmol) of 3,4'-diaminodiphenyl ether, 20 g of N-methylpyrrolidone and 10 g of toluene were added. After stirring the mixture at 180 rpm at room temperature under nitrogen atmosphere for 30 minutes, the mixture was heated at 180° C. (bath temperature) and stirred at 180 rpm for 1.0 hour. While removing the toluene-water azeotrope accumulated in the trap, the reaction completed. After the reaction, 41 g of N-methylpyrrolidone was added.

The polymer concentration thus obtained was 15% by weight. The molecular weights based on polystyrene measured as in Example 1 were: Number Average Molecular Weight (Mn): 32,300; Weight Average Molecular Weight (Mw): 140,200; Z Average Molecular Weight (Mz): 442,000; Mw/Mn=4.34; Mz/Mn=13.68. This polyimide solution was poured into methanol and the resultant was filtered, followed by drying in an infrared oven at 200° C. for 30 minutes to convert it to powders which were subjected to thermal analysis. The thermal decomposition temperature was 569° C.

EXAMPLE 48

The procedure was run the same way as Example 39.

9.93 g (40 mmol) of bicyclo(2,2,2)-oct-2,3,5,6-tetracarboxylic dianhydride (commercial product of Aldrich), 5.85 g (20 mmol) of 1,3-bis-(3-aminophenoxy) benzene (commercial product of Mitsui Toatsu Chemicals, Inc.), 0.4 g (4 mmol) of γ-valerolactone, 0.64 g (8 mmol) of pyridine, 55 g of N-methylpyrrolidone and 30 g of toluene were added. After stirring the mixture at 180 rpm at room temperature under nitrogen atmosphere for 30 minutes, the mixture was heated at 180° C. (bath temperature) and stirred at 180 rpm for 1.0 hour. In the reaction, toluene-water azeotrope accumulated in the trap was removed. After cooling the mixture, 4.32 g (20 mmol) of 3,3'-dihydroxy-4,4'-diaminobiphenyl, 20 g of N-methylpyrrolidone and 10 g of toluene were added. After stirring the mixture at 180 rpm at room temperature under nitrogen atmosphere for 30 minutes, the mixture was heated at 180° C. (bath temperature) and stirred at 180 rpm for 1.45 hours. The toluene-water azeotrope accumulated in the trap was removed.

The polymer concentration thus obtained was 20% by weight. The molecular weights based on polystyrene measured as in Example 1 were: Number Average Molecular Weight (Mn): 54,300; Weight Average Molecular Weight (Mw): 88,400; Z Average Molecular Weight (Mz): 130,400; Mw/Mn=2.16; Mz/Mn=2.40. This polyimide was poured into methanol and the resultant was filtered, followed by drying in an infrared oven at 200° C. for 30 minutes to convert it to powders which were subjected to thermal analysis. The thermal decomposition temperature was 457° C.

EXAMPLE 49

The procedure was run the same way as Example 47.

Operations basically similar to those in Example 47 were carried out.

29.42 g (100 mmol) of biphenyltetracarboxylic dianhydride, 41.6 g (50 mmol) of diaminosilane (commercial product of Shin-etsu Chemical Co., Ltd., amine equivalent: 416), 1.5 g (15 mmol) of γ-valerolactone, 2.4 g (30 mmol) of pyridine, 200 g of N-methylpyrrolidone and 100 g of toluene were added.

After stirring the mixture at 180 rpm at room temperature under nitrogen atmosphere for 30 minutes, the mixture was heated at 180° C. (bath temperature) and stirred at 180 rpm for 1 hour. While removing the toluene-water azeotrope accumulated in the trap, the reaction completed.

In this mixture, 16.11 g (50 mmol) of BTDA, 10.72 g (50 mmol) of 3,3'-dihydroxy-4,4'-diaminobiphenyl, 10.01 g (50 mol) of 3,4'-diaminodiphenyl ether, 210 g of N-methylpyrrolidone and 20 g of toluene were added. After stirring the mixture at 180 rpm at room temperature under nitrogen atmosphere for 30 minutes, the mixture was heated at 180° C. (bath temperature) and stirred at 180 rpm for 3.0 hours. While removing the toluene-water azeotrope accumulated in the trap, the reaction completed.

The polymer concentration thus obtained was 10% by weight. The molecular weights based on polystyrene measured as in Example 1 were: Number Average Molecular Weight (Mn): 33,000; Weight Average Molecular Weight (Mw): 66,300; Z Average Molecular Weight (Mz): 116,700; Mw/Mn=2.0; Mz/Mn=3.53.

EXAMPLE 50

The operations similar to those in Example 46 were carried out for the polyimides obtained in Examples 47, 48 and 49.

(1) Preparation of Photosensitive Compositions

Photosensitive compositions were prepared by mixing the components shown in Table 14 below and filtering the mixtures through a filter having 3 μm diameter of pores.

TABLE 14

| | Composition | | |
|---|---|---|---|
| Components | XXIV | XXV | XXVI |
| Polyimide Solution | Example 47 | Example 48 | Example 49 |
| Weight | 20 g | 15 g | 30 g |
| (Polyimide Content) | 3 g | 3 g | 3 g |
| 1,2-naphthoquinone-2-diazide-5-sulfonic acid-o-cresol ester | 0.9 g | 0.9 g | 0.9 g |

(2) Formation of Images

Each of the above-described photosensitive compositions (XXIV, XXV and XXVI) was spin-coated on 5 cm diameter of surface-treated copper foil (commercial product of Nippon Denkai, 18 μm thickness). Thereafter, the coated layer was dried at 90° C. for 10 minutes in an infrared oven. The thickness of this photosensitive layer was about 10 μm.

On this photosensitive layer, a test pattern (through holes and line-and-space pattern having diameters and widths of 10, 15, 20, 25, - - -, and 200 μm, respectively) for positive-type photomask was placed, and the coating layer was irradiated at a dose of exposure at which images are obtained using 2 kW extra-high pressure mercury lamp apparatus (JP-2000G, commercial product of Oak Seisakusho).

Each of the compositions XXIV, XXV and XXVI was irradiated with UV light with an appropriate dose shown in Table 15 below, and then developed under the conditions shown in Table 15. The coating layer after irradiation with UV light was dipped in this solution under the conditions shown in Table 15, washed with deionized water, dried with an infrared lamp, and the resolution was observed. The thickness of this polyimid layer after drying at 90° C. for 30 minutes was 9 μm.

TABLE 15

| Composition | XXIV | XXV | XXVI |
|---|---|---|---|
| Dose of Irradiated UV Light (mJ) | 300 | 300 | 300 |
| Dipping Time (second) | 170 | 30 | 4 |
| Composition of Dipping Solution | 1 | 1 | 3 |

(Composition 1: 40 g of N-methylpyrrolidone, 10 g of aminoethanol, 25 g of methanol and 25 g of water)
(Composition 3: 20 g of aminoethanol, 10 g of glycerin and 50 g of water).

As for the through hole patterns in the coating polyimide layer, formation of through holes having sharp and circular sections having a diameter of 15 μm was confirmed. As for the line-and-space pattern, formation of images of lines having a width of 10 μm was confirmed.

EXAMPLE 51

The procedure was run the same way as Example 39.

38.67 g (120 mmol) of BTDA, 11.00 g (90 mmol) of 2,4-diaminotoluene, 7.33 g (30 mmol) of 3,3'-dimethoxy-4,4'-diaminobiphenyl (commercial product of Wakayama Seika Co., Ltd.), 1.2 g (12 mmol) of γ-valerolactone, 1.9 g (24 mmol) of pyridine, 211 g of N-methylpyrrolidone and 40 g of toluene were added. After stirring the mixture at 180 rpm at room temperature under nitrogen atmosphere for 30 minutes, the mixture was heated at 180° C. (bath temperature) and stirred at 180 rpm for 3.0 hours. In the reaction, toluene-water azeotrope accumulated in the trap was removed. Toluene-water azeotrope accumulated in the trap was removed.

The polymer concentration thus obtained was 20% by weight. The molecular weights based on polystyrene measured as in Example 1 were: Number Average Molecular Weight (Mn): 20,360; Weight Average Molecular Weight (Mw): 40,200; Z Average Molecular Weight (Mz): 72,200; Mw/Mn=1.98; Mz/Mn=3.55.

EXAMPLE 52

26.66 g (60 mmol) of 6FDA, 10.37 g (20 mmol) of bis-{4-(3-aminophenoxy)phenyl}hexafluoropropane (commercial product of Wakayama Seika Co., Ltd.), 4.89 g (20 mmol) of 3,3'-dimethoxy-4,4'-diaminobiphenyl, 4.25 g (20 mmol) of 3,3'-dimethyl-4,4'-diaminobiphenyl, 0.6 g (6 mmol) of γ-valerolactone, 1.0 g (12 mmol) of pyridine, 176 g of N-methylpyrrolidone and 40 g of toluene were added. After stirring the mixture at 180 rpm at room temperature under nitrogen atmosphere for 30 minutes, the mixture was heated at 180° C. (bath temperature) and stirred at 180 rpm for 1.75 hours. While removing the toluene-water azeotrope accumulated in the trap, the reaction completed.

The polymer concentration thus obtained was 20% by weight. The molecular weights based on polystyrene measured as in Example 1 were: Number Average Molecular Weight (Mn): 23,600; Weight Average Molecular Weight (Mw): 34,400; Z Average Molecular Weight (Mz): 49,600; Mw/Mn=1.45; Mz/Mn=2.06.

EXAMPLE 53

The operations similar to those in EXAMPLE 42 were carried out for the polyimides obtained in Examples 51 and 52;

(1) Preparation of Photosensitive Compositions

Photosensitive compositions were prepared by mixing the components shown in Table 16 below and filtering the mixtures through a filter having 3 μm diameter of pores.

TABLE 16

| Components | Composition | |
|---|---|---|
| | XXVII | XXVIII |
| Polyimide Solution | Example 51 | Example 52 |
| Weight | 15 g | 15 g |
| (Polyimide Content) | 3 g | 3 g |
| 1,2-naphthoquinone-2-diazide-5-sulfonic acid-o-cresol ester | 0.9 g | 0.9 g |

(2) Formation of Images

Each of the above-described photosensitive compositions (XXVII and XXVIII) was spin-coated on 5 cm diameter of a surface-treated copper foil (commercial product of Nippon Denkai, 18 μm thickness). Thereafter, the coated layer was dried at 90° C. for 10 minutes in an infrared oven. The thickness of this photosensitive layer was about 10 μm.

On this photosensitive layer, a test pattern (through holes and line-and-space pattern having diameters and widths of 10, 15, 20, 25, - - - , and 200 μm, respectively) for positive-type photomask was placed, and the coating layer was irradiated at a dose of exposure at which images are obtained using 2 kW extra-high pressure mercury lamp apparatus (JP-2000G, commercial product of Oak Seisakusho).

Each of the compositions XXVII and XXVIII was irradiated with UV light with an appropriate dose shown in Table 17 below, and then developed under the conditions shown in Table 17. The coating layer after irradiation with UV light was dipped in this solution under the conditions shown in Table 17, washed with deionized water, dried with an infrared lamp, and the resolution was observed. The thickness of this polyimide layer after drying at 90° C. for 30 minutes was about 9 μm.

TABLE 17

| Composition | XXVII | XXVIII |
|---|---|---|
| Dose of Irradiated UV Light (mJ) | 300 | 220 |
| Dipping Time (second) | 210 | 150 |
| Composition of Dipping Solution | 3 | 3 |

(Composition 3: 20 g of aminoethanol, 10 g of glycerin and 50 g of water)

As for the through hole patterns in the coating polyimide layer, formation of through holes having sharp and circular sections having a diameter of 15 μm was confirmed. As for the line-and-space pattern, formation of images of lines having a width of 10 μm was confirmed.

EXAMPLE 54

A condenser tube with a ball, having a water separation trap, was mounted on a one-liter separable three-necked flask equipped with an anchor-shaped stirrer made of stainless steel. In the flask, 26.66 g (60 mmol) of 6FDA, 5.48 g (20 mmol) of 3,3'-dinitro-4,4'-diaminobiphenyl (commercial product of Tokyo Chemical Industry Co., Ltd.), 8.49 g (40 mmol) of 3,3'-dimethyl-4,4'-diaminobiphenyl (Wakayama Seika Co., Ltd.), 0.8 g (8 mmol) of γ-valerolactone, 1.6 g (16 mmol) of N-methylmorpholine, 154 g of N-methylpyrrolidone and 40 g of toluene were added. After stirring the mixture at 180 rpm at room temperature under nitrogen atmosphere for 30 minutes, the mixture was heated at 180° C. and stirred at 180 rpm for 7.50 hours. In the reaction, toluene-water azeotrope accumulated in the trap was removed.

The polymer concentration thus obtained was 20% by weight. The molecular weights based on polystyrene measured as in Example 1 were: Number Average Molecular Weight (Mn): 7100; Weight Average Molecular Weight (Mw): 10,000; Z Average Molecular Weight (Mz): 14,000; Mw/Mn=1.41; Mz/Mn=1.97.

EXAMPLE 55

The procedure was run the same way as Example 54.

26.66 g (60 mmol) of 6FDA, 5.48 g (20 mmol) of 3,3-dinitro-4,4-diaminobiphenyl, 4.25 g (20 mmol) of 3,3-dimethyl-4,4-diaminobiphenyl, 10.37 g (20 mmol) of 2,2-bis{4-(4-aminophenoxy)phenyl}hexafluoropropane, 0.8 g (8 mmol) of γ-valerolactone, 1.2 g (16 mmol) of pyridine, 178 g of N-methylpyrrolidone and 40 g of toluene were added. After stirring the mixture at 180 rpm at room temperature under nitrogen atmosphere for 30 minutes, the mixture was heated at 180° C. and stirred at 180 rpm for 4 hours. In the reaction, toluene-water azeotrope accumulated in the trap was removed.

The polymer concentration thus obtained was 20% by weight. The molecular weights based on polystyrene measured as in Example 1 were: Number Average Molecular Weight (Mn): 7400; Weight Average Molecular Weight (Mw): 9600; Z Average Molecular Weight (Mz): 12,400; Mw/Mn=1.29; Mz/Mn=1.66.

EXAMPLE 56

The procedure was run the same way as Example 54.

19.33 g (60 mol) of.BTDA, 5.48 g (20 mmol) of 3,3'-dinitro-4,4'-diaminobiphenyl, 2.44 g (20 mmol) of 2,4-diaminotoluene (commercial product of Mitsui Toatsu Chemicals, Inc.), 8.65 g (20 mmol) of bis{4-(3-aminophenoxy)phenyl}sulfone, 0.8 g (8 mmol) of γ-valerolactone, 1.2 g (16 mmol) of pyridine, 123 g of N-methylpyrrolidone and 40 g of toluene were added. After stirring the mixture at 180 rpm at room temperature under nitrogen atmosphere for 30 minutes, the mixture was heated at 180° C. and stirred at 180 rpm for 4.25 hours; In the reaction, toluene-water azeotrope accumulated in the trap was removed.

The polymer concentration thus obtained was 20% by weight. The molecular weights based on polystyrene measured as in Example 1 were: Number Average Molecular Weight (Mn): 5300; Weight Average Molecular Weight (Mw): 7200; Z.Average Molecular Weight (Mz):9600; Mw/Mn=1.37; Mz/Mn=1.81.

EXAMPLE 57

The procedure was run the same way as Example 54.

17.77 g (40 mol) of 6FDA, 5.48 g (20 mmol) of 3,3'-dinitro-4,4'-diaminobiphenyl, 10.37 g (20 mmol) of 2,2-bis{4-(4-aminophenoxy)phenyl}hexafluoropropane, 0.4 g (4 mmol) of γ-valerolactone, 0.8 g (8 mmol) of N-methylmorpholine, 129 g of N-methylpyrrolidone and 40 g of toluene were added. After stirring the mixture at 180 rpm at room temperature under nitrogen atmosphere for 30 minutes, the mixture was heated at 180° C. and stirred at 180 rpm for 5.5 hours. In the reaction, toluene-water azeotrope accumulated in the trap was removed. The polymer concentration thus obtained was 20% by weight. The molecular weights based on polystyrene measured by high performance liquid chromatography (commercial product of Tosoh Corporation) were: Number Average Molecular Weight (Mn): 4900; Weight Average Molecular Weight (Mw): 6700; Z Average Molecular Weight (Mz):9200; Mw/Mn=1.37; Mz/Mn=1.89.

EXAMPLE 58

The procedure was run the same way as Example 54.

16.11 g (50 mol) of BTDA, 6.86 g (25 mmol) of 3,3'-dinitro-4,4'-diaminobiphenyl, 10.81 g (25 mmol) of bis{4-(3-aminophenoxy)phenyl}sulfone, 0.5 g (5 mmol) of γ-valerolactone, 1.0 g (10 mmol) of N-methylmorpholine, 128 g of N-methylpyrrolidone and 40 g of toluene were added. After stirring the mixture at 180 rpm at room temperature under nitrogen atmosphere for 30 minutes, the mixture was heated at 180° C. and stirred at 180 rpm for 5.75 hours. In the reaction, toluene-water azeotrope was removed.

The polymer concentration thus obtained was 20% by weight. The molecular weights based on polystyrene measured as in Example 1 were: Number Average Molecular Weight (Mn): 4300; Weight Average Molecular Weight (Mw): 6100; Z Average Molecular Weight (Mz): 8500; Mw/Mn=1.40; Mz/Mn=1.95.

EXAMPLE 59

(1) Preparation of Photosensitive Compositions

Photosensitive compositions (XXIX–XXXIII) were prepared by mixing the polyimide solutions obtained in Examples 54 to 58 described above with other components shown in Table 18 below and filtering the mixtures through a filter having 3 µm diameter of pores.

TABLE 18

| Components | Composition | | | | |
|---|---|---|---|---|---|
| | XXIX | XXX | XXXI | XXXII | XXXIII |
| Polyimide Solution | Ex. 54 | Ex. 55 | Ex. 56 | Ex. 57 | Ex. 58 |
| Weight | 15 g | 15 g | 15 g | 15 g | 15 g |
| (Polyimide Content) | 3 g | 3 g | 3 g | 3 g | 3 g |
| 1,2-naphthoquinone-2-diazide-5-sulfonic acid-o-cresol ester | 0.9 g | 0.9 g | 0.9 g | 0.9 g | 0.9 g |

(2) Formation of Images

Each of the above-described photosensitive compositions (XXIX–XXXIII) was spin-coated on 5 cm diameter of surface-treated copper foil (commercial product of Nippon Denkai, 18 µm thickness). Thereafter, the coated layer was dried at 90° C. for 10 minutes in an infrared oven. The thickness of this photosensitive layer was about 10 µm.

On this photosensitive layer, a test pattern (through holes and line-and-space pattern having diameters and widths of 10, 15, 20, 25, - - - , and 200 µm, respectively) for positive-type photomask was placed, and the coating layer was irradiated at a dose of exposure at which images are obtained shown in Table 19 below using 2 kW extra-high pressure mercury lamp apparatus (JP-2000G, commercial product of Oak Seisakusho).

Each of the compositions (XXIX–XXXIII) was irradiated with UV light with the dose shown in Table 19 below, and then developed under the conditions shown in Table 19.

TABLE 19

| Composition | XXIX | XXX | XXXI | XXXII | XXXIII |
|---|---|---|---|---|---|
| Dose of Irradiated UV Light (mJ) | 500 | 600 | 500 | 300 | 500 |
| Dipping Time (minute) | 3 | 5 | 3 | | |
| (second) | | | | 54 | 37 |
| Composition of Developer | 1 | 1 | 1 | 2 | 2 |

Composition of Developer 1 was made of 30 g of potassium hydroxide and 100 g of water, and Composition of Developer 2 was made of 40 g of N-methylpyrrolidone, 10 g of aminoethanol, 10 g of methanol and 25 g of water. Each of the coating layer after irradiation with UV light was dipped in this solution for the time period mentioned above, washed with deionized water, dried with an infrared lamp, and the resolution was observed. The thickness of this polyimide layer after drying at 90° C. for 30 minutes was about 9 µm.

As for the through hole patterns in the coating polyimide layer, formation of through holes having sharp and circular sections having a diameter of 15 µm was confirmed. As for the line-and-space pattern, formation of images of lines having a width of 10 µm was confirmed.

EXAMPLE 60

The procedure was run the same way as Example 54.

22.21 g (50 mol) of 6FDA, 3.83 g (25 mmol) of 2-nitro-1,4-diaminobenzene, 12.96 g (25 mmol) of 2,2-bis{4-(4-aminophenoxy)phenyl}hexafluoropropane, 0.5 g (5 mmol) of γ-valerolactone, 1.0 g (10 mmol) of N-methylmorpholine, 149 g of N-methylpyrrolidone and 40 g of toluene were added. After stirring the mixture at 180 rpm at room temperature under nitrogen atmosphere for 30 minutes, the mixture was heated at 180° C. and stirred at 180 rpm for 4 hours. In the reaction, toluene-water azeotrope was removed.

The polymer concentration thus obtained was 20% by weight. The molecular weights based on polystyrene measured as in Example 1 were: Number Average Molecular Weight (Mn): 4800; Weight Average Molecular Weight (Mw): 6400; Z Average Molecular Weight (Mz): 9600; Mw/Mn=1.43; Mz/Mn=2.00.

EXAMPLE 61

The procedure was run the same way as Example 54.

14.71 g (50 mol) of 3,4,3',4'-biphenyltetracarboxylic dianhydride, 3.83 g (25 mmol) of 2-nitro-1,4-diaminobenzene, 5.01 g (25 mmol) of 3,4'-diaminodiphenyl ether, 0.5 g (5 mmol) of γ-valerolactone; 1.0 g (10 mmol) of N-methylmorpholine, 87 g of N-methylpyrrolidone and 40 g of toluene were added. After stirring the mixture at 180 rpm at room temperature under nitrogen atmosphere for 30 minutes, the mixture was heated at 180° C. and stirred at 180 rpm for 4 hours. In the reaction, toluene-water azeotrope was removed.

The polymer concentration thus obtained was 20% by weight. The molecular weights based on polystyrene measured by high performance liquid chromatography (commercial product of Tosoh Corporation) were: Number Average Molecular Weight (Mn): 2900; Weight Average Molecular Weight (Mw): 3700; Z Average Molecular Weight (Mz): 4900; Mw/Mn=1.25; Mz/Mn=1.69.

EXAMPLE 62

The procedure was run the same way as Example 54.

16.11 g (50 mol) of BTDA, 3.83 g (25 mmol) of 2-nitro-1,4-diaminotoluene, 10.81 g (25 mmol) of bis{4-(3-aminophenoxy)phenyl}sulfone, 5.01 g (25 mmol) of 3,4'-diaminodiphenyl ether, 0.5 g (5 mmol) of γ-valerolactone, 1.0 g (10 mmol) of N-methylmorpholine, 116 g of N-methylpyrrolidone and 40 g of toluene were added. After stirring the mixture at 180 rpm at room temperature under nitrogen atmosphere for 30 minutes, the mixture was heated at 180° C. and stirred at 180 rpm for 3 hours. In the reaction, toluene-water azeotrope was removed.

The polymer concentration thus obtained was 20% by weight. The molecular weights based on polystyrene measured as in Example 1 were: Number Average Molecular Weight (Mn): 4300; Weight Average Molecular Weight (Mw): 5800; Z Average Molecular Weight (Mz): 7700; Mw/Mn=1.34; Mz/Mn=1.78.

EXAMPLE 63

Using the polyimide solutions prepared in Examples 60 to 62, photosensitive compositions as in Example 59 were prepared, and images were formed with 2 kW extra-high pressure mercury lamp apparatus under the conditions shown in Table 20.

TABLE 20

| Polyimide Solution | Example 60 | Example 61 | Example 62 |
| --- | --- | --- | --- |
| Dose of Irradiated UV Light (mJ) | 500 | 550 | 350 |
| Dipping Time (second) | 130 | 180 | 30 |
| Composition of Developer | 3 | 3 | 3 |

Composition of Developer 3 was made of 40 g of N-methylpyrrolidone, 10 g of aminoethanol, 25 g of methanol and, 25 g of water. Each of the coating layer after irradiation with UV light was dipped in this solution for the time period shown in Table 20, washed with deionized water, dried with an infrared lamp, and the resolution was observed. The thickness of this polyimide layer after drying at 90° C. for 30 minutes was 9 μm.

As for the through hole patterns in the coating polyimide layer, formation of through holes having sharp and circular sections having a diameter of 15 μm was confirmed. As for the line-and-space pattern, formation of images of lines having a width of 10 μm was confirmed.

EXAMPLE 64

The procedure was run the same way as Example 54.

22.21 g (50 mol) of 6FDA, 5.96 g (25 mmol) of 1,5-diaminoanthraquinone (Tokyo Chemical Industry Co., Ltd.), 12.96 g (25 mmol) of 2,2-bis{4-(4-aminophenoxy)phenyl}hexafluoropropane (25 mmol), 0.5 g (5 mmol) of γ-valerolactone, 0.8 g (10 mmol) of pyridine, 157 g of N-methylpyrrolidone and 40 g of toluene were added. After stirring the mixture at 180 rpm at room temperature under nitrogen atmosphere for 30 minutes, the mixture was heated at 180° C. and stirred at 180 rpm for 7 hours. In the reaction, toluene-water azeotrope was removed.

The polymer concentration thus obtained was 20% by weight. The molecular weights based on polystyrene measured as in Example 1 were: Number Average Molecular Weight (Mn): 4600; Weight Average Molecular Weight (Mw): 6500; Z Average Molecular Weight (Mz): 8800; Mw/Mn=1.42; Mz/Mn=1.93.

EXAMPLE 65

The procedure was run the same way as Example 54.

19.33 g (60 mol) of BTDA, 7.14 g (30 mmol) of 1,5-diaminoanthraquinone, 12.98 g (30 mmol) of bis{4-(3-aminophenoxy)phenyl}sulfone, 0.6 g of γ-valerolactone, 1.0 g of pyridine, 149 g of N-methylpyrrolidone and 40 g of toluene were added. After stirring the mixture at 180 rpm at room temperature under nitrogen atmosphere for 30 minutes, the mixture was heated at 180° C. and stirred at 180 rpm for 3 hours. In the reaction, toluene-water azeotrope was removed.

The polymer concentration thus obtained was 20% by weight. The molecular weights based on polystyrene measured as in Example 1 were: Number Average Molecular Weight (Mn): 3800; Weight Average Molecular Weight (Mw): 5500; Z Average Molecular Weight (Mz): 7500; Mw/Mn=1.43; Mz/Mn=1.94.

EXAMPLE 66

The procedure was run the same way as Example 54.

17.65 g (60 mol) of 3,4,3',4'-biphenyltetracarboxylic dianhydride, 7.14 g (30 mmol) of 1,5-diaminoanthraquinone, 12.32 g (20 mmol) of 2,2-bis{4-(3-aminophenoxy)phenyl}propane, 0.6 g of γ-valerolactone; 1.0 g of pyridine, 140 g of N-methylpyrrolidone and 40 g of toluene were added. After stirring the mixture at 180 rpm at room temperature under nitrogen atmosphere for 30 minutes, the mixture was heated at 180° C. and stirred at 180 rpm for 7 hours. In the reaction, toluene-water azeotrope was removed.

The polymer concentration thus obtained was 20% by weight. The molecular weights based on polystyrene measured as in Example 1 were: Number Average Molecular Weight (Mn): 3300; Weight Average Molecular Weight (Mw): 4800; Z Average Molecular Weight (Mz): 6700; Mw/Mn=143; Mz/Mn=2.01.

EXAMPLE 67

Using the polyimide solutions prepared in Examples 64 to 66, photosensitive compositions as in Example 59 were prepared, and images were formed with 2kW extra-high pressure mercury lamp apparatus under the conditions shown in Table 21.

TABLE 21

| Polyimide Solution | Example 64 | Example 65 | Example 66 |
| --- | --- | --- | --- |
| Dose of Irradiated UV Light (mJ) | 500 | 300 | 300 |
| Dipping Time | 34 | 35 | 88 |

TABLE 21-continued

| Polyimide Solution | Example 64 | Example 65 | Example 66 |
|---|---|---|---|
| (second) | | | |
| Composition of Developer | 4 | 4 | 4 |

Composition of Developer 4 was made of 10 g of methanol, 40 g of water and 20 g of 15% tetramethylammonium hydroxide solution. Each of the coating layer after irradiation with UV light was dipped in this solution for the time period shown in Table 21, washed with deionized water, dried with an infrared lamp, and the resolution was observed. The thickness of this polyimide layer after drying at 90° C. for 30 minutes was 9 μm.

As for the through hole patterns in the coating polyimide layer, formation of through holes having sharp and circular sections having a diameter of 15 μm was confirmed. As for the line-and-space pattern, formation of images of lines having a width of 10 μm was confirmed.

EXAMPLE 68

A condenser tube with a ball, having a water separation trap, was mounted on a 1-liter separable three-necked flask equipped with an anchor-shaped stirrer made of stainless steel. In the flask, 26.66 g (60 mmol) of 6FDA, 4.33 g (20 mmol) of 4,4'-diaminodiphenyl sulfide, 20.74 g (40 mmol) of 2,2-bis{4-(4-aminophenoxy)phenyl}hexafluoropropane (commercial product of Wakayama Seika Co., Ltd.), 0.6 g (6 mmol) of γ-valerolactone, 1.0 g (12 mmol) of pyridine, 198 g of N-methylpyrrolidone and 40 g of toluene were added. After stirring the mixture at 200 rpm at room temperature under nitrogen atmosphere for 30 minutes, the mixture was heated at 180° C. and stirred at 180 rpm for 2.25 hours. In the reaction, toluene-water azeotrope was removed.

The polymer concentration thus obtained was 20% by weight. The molecular weights based on polystyrene measured as in Example 1 were: Number Average Molecular Weight (Mn): 33,900; Weight Average Molecular Weight (Mw): 57,200; Z Average Molecular Weight (Mz):94,200; Mw/Mn=1.75; Mz/Mn=2.78.

EXAMPLE 69

The procedure was run the same way as Example 68.

19.33 g (60 mmol) of BTDA, 4.33 g (20 mmol) of 4,4'-diaminodiphenyl sulfide, 17.3 g (40 mmol) of bis{4-(3-aminophenoxy)phenyl}sulfone (commercial product of Wakayama Seika Co., Ltd.), 0.6 g (6 mmol) of γ-valerolactone, 1.0 g (12 mmol) of pyridine, 155 g of N-methylpyrrolidone and 40 g of toluene were added. After stirring the mixture at 200 rpm at room temperature under nitrogen atmosphere for 30 minutes, the mixture was heated at 180° C. and stirred at 180 rpm for 2.24 hours. In the reaction, toluene-water azeotrope was removed.

The polymer concentration thus obtained was 20% by weight. The molecular weights based on polystyrene measured as in Example 1 were: Number Average Molecular Weight (Mn): 42,200; Weight Average Molecular Weight (Mw): 126,500; Z Average Molecular Weight (Mz): 334, 900; Mw/Mn=3.00; Mz/Mn=7.93.

EXAMPLE 70

The procedure was run the same way as Example 68.

17.65 g (60 mmol) of 3,4,3',4'-benzophenone tetracarboxylic dianhydride, 4.33 g (20 mmol) of 4,4'-diaminodiphenyl sulfide, 8.01 g (40 mmol) of 3,4'-diaminodiphenyl ether (commercial product of Mitsui Petrochemical Co., Ltd.), 0.6 g (6 mmol) of γ-valerolactone, 0.96 g of pyridine, 111 g of N-methylpyrrolidone and 40 g of toluene were added. After stirring the mixture at 200 rpm at room temperature under nitrogen atmosphere for 30 minutes, the mixture was heated at 180° C. and stirred at 180 rpm for 2.0 hours. In the reaction, toluene-water azeotrope was removed.

The polymer concentration thus obtained was 20% by weight. The molecular weights based on polystyrene measured as in Example 1 were: Number Average Molecular Weight (Mn): 44,000; Weight Average Molecular Weight (Mw): 136,200; Z Average Molecular Weight (Mz): 368, 800; Mw/Mn=3.10; Mz/Mn=8.38.

EXAMPLE 71

(1) Preparation of Photosensitive Compositions

Photosensitive compositions were prepared by mixing the components shown in Table 22 below and filtering the mixtures through a filter having 3 μm diameter of pores.

TABLE 22

| | Composition | | |
|---|---|---|---|
| Components | XL | XLI | XLII |
| Polyimide Solution | Example 68 | Example 69 | Example 70 |
| Weight | 15 g | 15 g | 15 g |
| (Polyimide Content) | 3 g | 3 g | 3 g |
| 1,2-naphthoquinone-2-diazide-5-sulfonic acid-o-cresol ester | 0.9 g | 0.9 g | 0.9 g |

(2) Formation of Images

Each of the above-described photosensitive compositions (XL, XLI and XLII) was spin-coated on 5 cm diameter of a surface-treated copper foil (commercial product of Nippon Denkai, 18 μm thickness). Thereafter, the coated layer was dried at 90° C. for 10 minutes in an infrared oven. The thickness of each of these photosensitive membranes was about 10 μm.

On this photosensitive layer, a test pattern (through holes and line-and-space pattern having diameters and widths of 10, 15, 20, 25, - - - , and 200 μm, respectively) for positive-type photomask was placed, and all of the coating layer were irradiated at a dose of exposure of at which images are obtained, that is with 300 mJ using 2 kW extra-high pressure mercury lamp apparatus (JP-2000G, commercial product of Oak Seisakusho). After irradiation, each coating layer was developed in the developer for 28 minutes (Composition IL), 8 minutes (Composition ILI) or 13 minutes (Composition ILII). The developer was a mixture of 40 g of N-methylpyrrolidone, 10 g of aminoethanol, 25 g of methanol and 25 g of water. Each of the coating layers after the irradiation was dipped in this solution for the time period mentioned above, washed with deionized water, dried with an infrared lamp, and the resolution was observed. The thickness of this polyimide layer after drying at 90° C. for 30 minutes was 9 μm.

As for the through hole patterns in the coating polyimide layer, formation of through holes having sharp and circular sections having a diameter of 15 μm was confirmed. As for the line-and-space pattern, formation of images of lines having a width of 10 μm was confirmed.

EXAMPLE 72

The procedure was run the same way as Example 68.

9.93 g (40 mol) of BCD, 12.98 g (60 mmol) of 4,4'-diaminodiphenyl sulfide, 1.2 g (12 mmol) of γ-valerolactone, 1.4 g (18 mmol) of pyridine, 150 g of N-methylpyrrolidone and 30 g of toluene were added. After stirring the mixture at 200 rpm at room temperature under nitrogen atmosphere for 30 minutes, the mixture was heated at 180° C. (bath temperature) and stirred at 180 rpm for 2 hours. While removing the toluene-water azeotrope accumulated in the trap, the reaction completed.

After cooling the mixture at room temperature, 23.53 g (80 mmol) of 3,4,3',4'-benzophenone tetracarboxylic dianhydride, 17.54 g (60 mmol) of 1,3-bis(4-aminophenoxy) benzene (Wakayama Seika Co., Ltd.), 89 g of N-methylpyrrolidone and 40 g of toluene were added. After stirring the mixture at 180 rpm at room temperature under nitrogen atmosphere for 30 minutes, the mixture was heated at 170° C. (bath temperature) and stirred at 180 rpm for 4 hours. While adding 100 g of N-methylpyrrolidone and while removing the toluene-water azeotrope (15 ml) accumulated in the trap, the reaction completed.

The polymer concentration thus obtained was 15% by weight. The molecular weights based on polystyrene measured by high performance liquid chromatography (commercial product of Tosoh Corporation) were: Number Average Molecular Weight (Mn): 22,700; Weight Average Molecular Weight (Mw): 40,800; Z Average Molecular Weight (Mz): 65,600; Mw/Mn=1.80; Mz/Mn=2.89.

EXAMPLE 73

The procedure was run the same way as Example 72.

19.86 g (80 mol) of BCD, 25.96 g (120 mmol) of 4,4'-diaminodiphenyl sulfide, 2.4 g (24 mmol) of γ-valerolactone, 4.86 g (48 mmol) of N-methylmorpholine, 250 g of N-methylpyrrolidone and 30 g of toluene were added. After stirring the mixture at 200 rpm at room temperature under nitrogen atmosphere for 30 minutes, the mixture was heated at 180° C. (bath temperature) and stirred at 180 rpm for 1 hour. While removing the toluene-water azeotrope accumulated in the trap, the reaction completed:

After cooling the mixture to room temperature, 47.08 g (160 mmol) of BPDA, 49.26 g (120 mmol) of bis{4-(3-aminophenoxy)phenyl}sulfone, 284 g of N-methylpyrrolidone and 30 g of toluene were added.

After stirring the mixture at 180 rpm at room temperature under nitrogen atmosphere for 30 minutes, the mixture was heated at 180° C. (bath temperature) and stirred at 180 rpm for 3.20 hours. While adding 223 g of N-methylpyrrolidone and while removing the toluene-water azeotrope accumulated in the trap, the reaction completed.

The polymer concentration thus obtained was 15% by weight. The molecular weights based on polystyrene measured as in Example 1 were: Number Average Molecular Weight (Mn): 3.9,600; Weight Average Molecular Weight (Mw): 61,500; Z Average Molecular Weight (Mz): 83,400; Mw/Mn=1.55; Mz/Mn=2.11.

EXAMPLE 74

(1) Preparation of Photosensitive Compositions

Photosensitive compositions were prepared by mixing the components shown in Table 23 below and filtering the mixtures through a filter having 3 μm diameter of pores.

TABLE 23

|  | Composition | |
| --- | --- | --- |
| Components | XLIII | XLIV |
| Polyimide Solution | Example 72 | Example 73 |
| Weight | 20 g | 20 g |
| (Polyimide Content) | 3 g | 3 g |
| 1,2-naphthoquinone-2-diazide-5-sulfonic acid-o-cresol ester | 0.9 g | 0.9 g |

(2) Formation of Images

Each of the above-described photosensitive compositions (XLIII and XLIV) was spin-coated on 5 cm diameter of a surface-treated copper foil (commercial product of Nippon Denkai, 18 μm thickness). Thereafter, the coated layer was dried at 90° C. for 10 minutes in an infrared oven. The thickness of this photosensitive layer was about 10 μm.

On this photosensitive layer, a test pattern (through holes and line-and-space pattern having diameters and widths of 10, 15, 20, 25, - - - , and 200 μm, respectively) for positive-type photomask was placed, and all of the coating layers were irradiated at a dose of exposure of at which images are obtained using 2 kW extra-high pressure mercury lamp apparatus (JP-2000G, commercial, product of Oak Seisakusho). The dose of irradiated UV was 300 mJ. After irradiation, each coating layer was developed with the developer for 24 minutes (Composition XLIII) or 5 minutes (Composition XLIV). The developing solution was a mixture of 40 g of N-methylpyrrolidone, 10 g of aminoethanol, 25 g of methanol and 25 g of water.

Each of the coating layer after the irradiation was dipped in this solution for the time period mentioned above, washed with deionized water, dried with an infrared lamp, and the resolution was observed. The thickness of each polyimide layer after drying at 90° C. for 30 minutes was about 9 μm.

As for the through hole patterns in the coating polyimide layer, formation of through holes having sharp and circular sections having a diameter of 20 μm was confirmed. As for the line-and-space pattern, formation of images of lines having a width of 15 μm was confirmed.

EXAMPLE 75

A condenser tube with a ball, having a water separation trap, was mounted on a 0.5-L separable three-necked flask equipped with an anchor-shaped stirrer made of stainless steel.

In the flask, 32.22 g (100 mmol) of BTDA, 10.01 g (50 mmol) of 1,4-bis(3-aminopropyl)piperazine (commercial product of Tokyo Chemical Industry Co., Ltd.), 21.6 g (50 mmol) of bis{4-(3-aminophenoxy)phenyl}sulfone (commercial product of Wakayama Seika Co., Ltd.), 1.0 g (10 mmol) of γ-valerolactone, 1.6 g (20 mmol) of pyridine, 240 g of N-methylpyrrolidone and 30 g of toluene were added. After stirring the mixture at 200 rpm at room temperature under nitrogen atmosphere for 30 minutes, the mixture was heated at 180° C. and stirred at 180 rpm for 3 hours. In the reaction, toluene-water azeotrope was removed.

The polymer concentration thus obtained was 20% by weight. The molecular weights based on polystyrene measured as in Example 1 were: Number Average Molecular Weight (Mn): 6100; Weight Average Molecular Weight (Mw): 8700; Z Average Molecular Weight (Mz): 11,600; Mw/Mn=1.42; Mz/Mn=1.90.

EXAMPLE 76

The procedure was run the same way as Example 75.

23.54 g (80 mmol) of BPDA, 4.01 g (20 mmol) of 1,3-bis(3-aminopropyl)piperazine, 24.63 g (60 mmol) of bis{4-(3-aminophenoxy)phenyl}sulfone, 0.8 g (8 mmol) of γ-valerolactone, 1.0 g (12 mmol) of pyridine, 262 g of N-methylpyrrolidone and 40 g of toluene were added. After stirring the mixture at 200 rpm at room temperature under nitrogen atmosphere for 30 minutes, the mixture was heated at 180° C. and stirred at 180 rpm for 2.3 hours. In the reaction, toluene-water azeotrope was removed.

The polymer concentration thus obtained was 15% by weight.

EXAMPLE 77

(1) Preparation of Photosensitive Compositions

Photosensitive compositions were prepared by mixing the components shown in Table 26 below and filtering the mixtures through a filter having 3 μm diameter of pores.

TABLE 26

| | Composition | |
|---|---|---|
| Components | XLVIII | XLIX |
| Polyimide Solution | Example 75 | Example 76 |
| Weight | 15 g | 20 g |
| (Polyimide Content) | 3 g | 3 g |
| 1,2-naphthoquinone-2-diazide-5-sulfonic acid-o-cresol ester | 0.9 g | 0.9 g |

(2) Formation of Images

Each of the above-described photosensitive compositions (XLVIII and XLIX) was spin-coated on 5 cm diameter of a surface-treated copper foil having a diameter of 5 cm (commercial product of Nippon Denkai, 18 μm thickness) by spin coating method. Thereafter, the coated composition was dried at 90° C. for 10 minutes in an infrared oven. The thickness of this photosensitive layer was about 10 μm.

On this photosensitive layer, a test pattern (through holes and line-and-space pattern having diameters and widths of 10, 15, 20, 25, - - - , and 200 μm, respectively) for positive-type photomask was placed, and the coating layer was irradiated at a dose of exposure at which images are obtained shown in Table 27 below using 2 kW extra-high pressure mercury lamp apparatus (JP-2000G, commercial product of Oak Seisakusho).

TABLE 27

| Composition | XLVIII | XLIX |
|---|---|---|
| Dose of Irradiated UV Light (mJ) | 300 | 500 |
| Development Time (minute) | 2.75 | 7.5 |

The developer was a mixture of 40 g of N-methylpyrrolidone, 10 g of aminoethanol, 25 g of methanol and 25 g of water. Each of the coating layer after irradiation with UV light was dipped in this solution for the time period mentioned above, washed with deionized water, dried with an infrared lamp, and the resolution was observed. The thickness of this polyimide layer after drying at 90° C. for 30 minutes was 9 μm.

As for the through hole patterns in the coating polyimide layer, formation of through holes having sharp and circular sections having a diameter of 15 μm was confirmed. As for the line-and-space pattern, formation of images of lines having a width of 10 μm was confirmed.

EXAMPLE 78

The procedure was run the same way as Example 75.

13.09 g (60 mmol) of pyromellitic dianhydride, 29.46 g (30 mmol) of diaminosilane (commercial product of Shinetsu Chemical Co., Ltd., amine equivalent: 416), 1.0 g (10 mmol) of γ-valerolactone, 1.6 g (20 mmol) of pyridine, 150 g of N-methylpyrrolidone and 70 g of toluene were added. After stirring the mixture at 200 rpm at room temperature under nitrogen atmosphere for 30 minutes, the mixture was heated at 180° C. and stirred at 180 rpm for 1 hour. In the reaction, toluene-water azeotrope was removed.

After cooling the mixture at room temperature, 8.83 g (30 mmol) of 3,4,3',4'-biphenyltetracarboxylic dianhydride, 6.01 g (30 mmol) of 1,3-bis(3-aminopropyl)piperazine, 12.32 g (30 mmol of 2,2-bis{4-(4-aminophenoxy)phenyl}propane, 98 g of N-methylpyrrolidone and 20 g of toluene were added. After stirring the mixture at 180 rpm at room temperature under nitrogen atmosphere for 30 minutes, the mixture was heated at 180° C. and stirred at 180 rpm for 4 hours. In the reaction, toluene-water azeotrope was removed.

The polymer concentration thus obtained was 20% by weight. The molecular weights based on polystyrene measured as in Example 1 were: Number Average Molecular Weight (Mn): 16,200; Weight Average Molecular Weight (Mw): 22,200; Z Average Molecular Weight (Mz): 29,200; Mw/Mn=1.37; Mz/Mn=1.80.

EXAMPLE 79

(1) Preparation of Photosensitive Composition

A photosensitive composition was prepared as in Example 78 using the polyimide solution obtained in Example 78.

(2) Formation of Images

The photosensitive composition was spin-coated on 5 cm diameter of surface-treated copper foil (commercial product of Nippon Denkai, 18 μm thickness). Thereafter, the, coated layer was dried at 90° C. for minutes in an infrared oven. The thickness of this photosensitive layer was about 10 μm.

On this photosensitive layer, a test pattern (through holes and line-and-space pattern having diameters and widths of 10, 15, 20, 25, - - - , and 200 μm, respectively) for positive-type photomask was placed, and the coating layer was irradiated at a dose of exposure at which images are obtained, that is, irradiated with 100 mJ of UV using 2 kW extra-high pressure mercury lamp apparatus (JP-2000G, commercial product of Oak Seisakusho). Then development was carried out for 22 seconds. The developer was a mixture of 30 g of aminoethanol, 50 g of ethanol and 15 g of water. The coating layer after irradiation with UV light was dipped in this solution for the time period mentioned above, washed with deionized water, dried with an infrared lamp, and the resolution was observed. The thickness of this polyimide layer after drying at 90° C. for 30 minutes was 9 μm.

As for the through hole patterns in the coating polyimide layer, formation of through holes having sharp and circular sections having a diameter of 15 μm was confirmed. As for the line-and-space pattern, formation of images of lines having a width of 10 μm was confirmed.

EXAMPLE 80

The procedure was run the same way as Example 75.

25.78 g (80 mmol) of BTDA, 10.97 g (40 mmol) of 3,9-bis(3-aminopropyl)-2,4,8,10-tetraoxaspiro-(5,5)-undecane, 17.3 g (40 mmol) of bis{4-(3-aminophenoxy)phenyl}sulfone, 0.8 g (8 mmol) of γ-valerolactone, 1.3 g (16 mmol) of pyridine, 205 g of N-methylpyrrolidone and 30 g of toluene were added. After stirring the mixture at 200 rpm at room temperature under nitrogen atmosphere for 30 minutes, the mixture was heated at 180° C. and stirred at 180 rpm for 3 hours. In the reaction, toluene-water azeotrope was removed.

The polymer concentration thus obtained was 20% by weight. The molecular weights based on polystyrene measured as in Example 1 were: Number Average Molecular Weight (Mn): 50,300; Weight Average Molecular Weight (Mw): 226,600; Z Average Molecular Weight (Mz): 712,900; Mw/Mn=4.42; Mz/Mn=14.15.

EXAMPLE 81

The procedure was run the same way as Example 80.

17.77 g (40 mmol) of 6FDA, 5.49 g (20 mmol) of 3,4-bis(3-aminopropyl)-2,4,8,10-tetraoxaspiro-(5,5)-undecane, 8.65 g (20 mmol) of bis{4-(3-aminophenoxy)phenyl}sulfone, 0.4 g (4 mmol) of γ-valerolactone, 0.6 g (8 mmol) of pyridine, 122 g of N-methylpyrrolidone and 30 g of toluene were added. After stirring the mixture at 200 rpm at room temperature under nitrogen atmosphere for 30 minutes, the mixture was heated at 180° C. and stirred at 180 rpm for 1.75 hours. In the reaction, toluene-water azeotrope was removed.

The polymer concentration thus obtained was 20% by weight. The molecular weights based on polystyrene measured by high performance liquid chromatography (commercial product of Tosoh Corporation) were: Number Average Molecular Weight (Mn): 21,200; Weight Average Molecular Weight (Mw): 33,500; Z Average Molecular Weight (Mz): 48,500; Mw/Mn=1.58; Mz/Mn=2.28.

EXAMPLE 82

The procedure was run the same way as Example 80.

35.45 g (80 mmol) of 6FDA, 10.97 g (40 mmol) of 3,9-bis(3-aminopropyl)-2,4,8,10-tetraoxaspiro-(5,5)-undecane, 20.74 g (40 mmol) of 2,2-bis{4-(4-aminophenoxy)phenyl}hexafluoropropane, 0.8 g (8 mmol) of γ-valerolactone, 1.2 g (16 mmol) of pyridine, 286 g of N-methylpyrrolidone and 30 g of toluene were added. After stirring the mixture at 180 rpm at room temperature under nitrogen atmosphere for 30 minutes, the mixture was heated at 180° C. and stirred at 180 rpm for 3 hours. In the reaction, toluene-water azeotrope was removed.

The polymer concentration thus obtained was 20% by weight. The molecular weights based on polystyrene measured by high performance liquid chromatography (commercial product of Tosoh Corporation) were: Number Average Molecular Weight (Mn): 64,300; Weight Average Molecular Weight (Mw): 129,100; Z Average Molecular Weight (Mz): 239,500; Mw/Mn=2.01; Mz/Mn=3.73.

EXAMPLE 83

(1) Preparation of Photosensitive Compositions

Photosensitive compositions were prepared by mixing the components shown in Table 28 below and filtering the mixtures through a filter having 3 μm diameter of pores.

TABLE 28

| | Composition | | |
|---|---|---|---|
| Components | L | LI | LII |
| Polyimide Solution Weight | Example 80 15 g | Example 81 15 g | Example 82 15 g |

TABLE 28-continued

| | Composition | | |
|---|---|---|---|
| Components | L | LI | LII |
| (Polyimide Content) | 3 g | 3 g | 3 g |
| 1,2-naphthoquinone-2-diazide-5-sulfonic acid-o-cresol ester | 0.9 g | 0.9 g | 0.9 g |

(2) Formation of Images

Each of the above-described photosensitive compositions (L, LI and LII) was spin-coated on 5 cm diameter of a surface-treated copper foil (commercial product of Nippon Denkai, 18 μm thickness). Thereafter, the coated layer was dried at 90° C. for 10 minutes in an infrared oven. The thickness of this photosensitive layer was about 10 μm.

On this photosensitive layer, a test pattern (through holes and line-and-space pattern having diameters and widths of 10, 15, 20, 25, - - - , and 200 μm, respectively) for positive-type photomask was placed, and all of the coating layers were irradiated at a dose of exposure of at which images are obtained, that is, irradiated with 300 mJ of UV using 2 kW extra-high pressure mercury lamp apparatus (JP-2000G, commercial product of Oak Seisakusho). After irradiation, each coating layer was developed with the developer for 3.0 minutes (Composition L), 1.0 minute (Composition LI) or 1.5 minutes (Composition LII). The developer was a mixture of 40 g of N-methylpyrrolidone, 10 g of aminoethanol, 25 g of methanol and 25 g of water. Each of the coating membrane after the irradiation was dipped in this solution for the time period mentioned above, washed with deionized water, dried with an infrared lamp, and the resolution was observed. The thickness of each polyimide layer after drying at 90° C. for 30 minutes was 9 μm.

As for the through hole patterns in the coating polyimide layer, formation of through holes having sharp and circular sections having a diameter of 15 μm was confirmed. As for the line-and-space pattern, formation of images of lines having a width of 10 μm was confirmed.

EXAMPLE 84

The procedure was run the same way as Example 78.

19.33 g (60 mmol) of BTDA, 3.67 g (30 mmol) of 2,4-diaminotoluene, 1.0 g (10 mmol) of γ-valerolactone, 1.2 g (15 mmol) of pyridine, 100 g of N-methylpyrrolidone and 30 g of toluene were added. After stirring the mixture at 200 rpm at room temperature under nitrogen atmosphere for 30 minutes, the mixture was heated at 180° C. and stirred at 180 rpm for 1 hour. In the reaction, toluene-water azeotrope was removed.

After cooling the mixture to room temperature, 9.67 g (30 mmol) of BTDA, 8.23 g (30 mmol) of 3,9-bis(3-aminopropyl)-2,4,8,10-tetraoxaspiro-(5,5)-undecane, 12.32 g (30 mmol) of 2,2-bis{4-(4-aminophenoxy)phenyl}propane, 100 g of N-methylpyrrolidone and 30 g of toluene were added. After stirring the mixture at 180 rpm at room temperature under nitrogen atmosphere for 30 minutes, the mixture was heated at 180° C. and stirred at 180 rpm for 2 hours. Then 60 g of N-methylpyrrolidone was added and the mixture was heated for another one hour, followed by addition of 2.5 g of morpholine. In the reaction, toluene-water azeotrope was removed.

The polymer concentration thus obtained was 10% by weight. The molecular weights based on polystyrene measured as in Example 1 were: Number Average Molecular Weight (Mn): 41,800; Weight Average Molecular Weight (Mw): 155,200; Z Average Molecular Weight (Mz): 414,100; Mw/Mn=3.71; Mz/Mn=9.90.

EXAMPLE 85

The procedure was run the same way as Example 78.

13.09 g (60 mmol) of pyromellitic dianhydride, 24.96 g (30 mmol) of diaminosilane (amine equivalent: 416), 1.0 g (10 mmol) of γ-valerolactone, 1.2 g (15 mmol) of pyridine, 160 g of N-methylpyrrolidone and 60 g of toluene were added. After stirring the mixture at 200 rpm at room temperature under nitrogen atmosphere for 30 minutes, the mixture was heated at 180° C. and stirred at 180 rpm for 1 hour. In the reaction, toluene-water azeotrope was removed.

After cooling the mixture at room temperature, 9.67 g (30 mmol) of BTDA, 8.23 g (30 mmol) of 3,9-bis(3-aminopropyl)-2,4,8,10-tetraoxaspiro-(5,5)-undecane, 12.32 g (30 mmol) of 2,2-bis{4-(4-aminophenoxy)phenyl}propane, 100 g of N-methylpyrrolidone and 30 g of toluene were added. After stirring the mixture at 180 rpm at room temperature under nitrogen atmosphere for 30 minutes, the mixture was heated at 180° C. and stirred at 180 rpm for 3.15 hours. In the reaction, toluene-water azeotrope was removed.

The polymer concentration thus obtained was 20% by weight. The molecular weights based on polystyrene measured as in Example 1 were: Number Average Molecular Weight (Mn): 37,600; Weight Average Molecular Weight (Mw): 83,200; Z Average Molecular Weight (Mz): 156,000; Mw/Mn=2.11; Mz/Mn=4.14.

EXAMPLE 86

(1) Preparation of Photosensitive Compositions

Photosensitive compositions were prepared by mixing the components shown in Table 29 below and filtering the mixtures through a filter having 3 μm diameter of pores.

TABLE 29

|  | Composition | |
| --- | --- | --- |
| Components | LIII | LIV |
| Polyimide Solution | Example 84 | Example 85 |
| Weight | 30 g | 15 g |
| (Polyimide Content) | 3 g | 3 g |
| 1,2-naphthoquinone-2-diazide-5-sulfonic acid-o-cresol ester | 0.9 g | 0.9 g |

(2) Formation of Images

Each of the above-described photosensitive compositions (LIII and LIV) was spin-coated on 5 cm diameter of a surface-treated copper foil (commercial product of Nippon Denkai, 18 μm thickness). Thereafter, the coated layer was dried at 90° C. for 10 minutes in an infrared oven. The thickness of this photosensitive layer was about 10 μm.

On this photosensitive layer, a test pattern (through holes and line-and-space pattern having diameters and widths of 10, 15, 20, 25, - - - , and 200 μm, respectively) for positive-type photomask was placed, and all of the coating layers were irradiated at a dose of exposure of at which images are obtained, that is, irradiated with 200 mJ of UV using 2 kW extra-high pressure mercury lamp apparatus (JP-2000G, commercial product of Oak Seisakusho). After irradiation, each coating layer was developed with the developer for 90 seconds (Composition LIII) or 50 seconds (Composition LIV). The developer was a mixture of 40 g of N-methylpyrrolidone, 10 g of aminoethanol, 25 g of methanol and 25 g of water. Each of the coating layer after the irradiation was dipped in this solution for the time period mentioned above, washed with deionized water, dried with an infrared lamp, and the resolution was observed. The thickness of each polyimide layer after drying at 90° C. for 30 minutes was 9 μm.

As for the through hole patterns in the coating polyimide layer, formation of through holes having sharp and circular sections having a diameter of 15 μm was confirmed. As for the line-and-space pattern, formation of images of lines having a width of 10 μm was confirmed.

EXAMPLE 87

The procedure was run the same way as Example 75.

32.22 g (100 mmol) of BTDA, 13.72 g (50 mmol) of 3,7-bis(3-aminopropyl)-2,4,8,10-tetraoxaspiro-(5,5)-undecane, 13.72 g (50 mmol) of 1,4-bis(3-aminopropyl)piperazine, 1.0 g (10 mmol) of γ-valerolactone, 1.6 g (20 mmol) of pyridine, 309 g of N-methylpyrrolidone and 30 g of toluene were added. After stirring the mixture at 200rpm at room temperature under nitrogen atmosphere for 30 minutes, the mixture was heated at 180° C. and stirred at 180 rpm for 1.5 hours. In the reaction, toluene-water azeotrope was removed.

The polymer concentration thus obtained was 15.4% by weight.

EXAMPLE 88

The procedure was run the same way as Example 78.

9.67 g (30 mmol) of BTDA, 8.23 g (30 mmol) of 3,9-bis(3-aminopropyl)-2,4,8,10-tetraoxaspiro-(5,5)-undecane, 12.32 g (30 mmol) of 2,2-bis{4-(4-aminophenoxy)phenyl}propane, 1.0 g (10 mmol) of γ-valerolactone, 1.6 g (20 mmol) of pyridine, 103 g of N-methylpyrrolidone and 30 g of toluene were added. After stirring the mixture at 200 rpm at room temperature under nitrogen atmosphere for 30 minutes, the mixture was heated at 180° C. and stirred at 180 rpm for 1 hour. In the reaction, toluene-water azeotrope was removed.

After cooling the mixture at room temperature, 89 g of N-methylpyrrolidone and 2.0 g of morpholine were added, and then 19.32 g (60 mmol) of BTDA, 3.0 g (15 mmol) of 1,4-bis(3-aminopropyl)piperazine, 6.16 g (15 mmol) of 2,2-bis{4-(4-aminophenoxy)phenyl}propane, 119 g of N-methylpyrrolidone and 30 g of toluene were added. After stirring the mixture at 180 rpm at room temperature under nitrogen atmosphere for 30 minutes, the mixture was heated at 180° C. and stirred at 180 rpm for 2.45 hours. In the reaction, toluene-water azeotrope was removed.

The polymer concentration thus obtained was 15% by weight. The molecular weights based on polystyrene measured by high performance liquid chromatography (commercial product of Tosoh Corporation) were: Number Average Molecular Weight (Mn): 19,700; Weight Average Molecular Weight (Mw): 30,700; Z Average Molecular Weight (Mz): 45,400; Mw/Mn=155; Mz/Mn=2.30.

EXAMPLE 89

(1) Preparation of Photosensitive Compositions

Photosensitive compositions were prepared by mixing the components shown in Table 30 below and filtering the mixtures through a filter having 3 μm diameter of pores.

TABLE 30

|  | Composition | |
|---|---|---|
| Components | LV | LVI |
| Polyimide Solution | Example 87 | Example 88 |
| Weight | 20 g | 20 g |
| (Polyimide Content) | 3 g | 3 g |
| 1,2-naphthoquinone-2-diazide-5-sulfonic acid-o-cresol ester | 0.9 g | 0.9 g |

(2) Formation of Images

Each of the above-described photosensitive compositions (LV and LVI) was spin-coated on 5 cm diameter of surface-treated copper foil (commercial product of Nippon Denkai, 18 µm thickness). Thereafter, the coated layer was dried at 90° C. for 10 minutes in an infrared oven. The thickness of this photosensitive layer was about 10 µm.

On this photosensitive layer, a test pattern (through holes and line-and-space pattern having diameters and widths of 10, 15, 20, 25, - - - , and 200 µm, respectively) for positive-type photomask was placed and all of the coating layer were irradiated at a dose of exposure of at which images are obtained, that is, irradiated with 100 mJ (Composition LV) or with 200 mJ (Composition LVI) of UV using 2 kW extra-high pressure mercury lamp apparatus (JP-2000G, commercial product of Oak Seisakusho). After irradiation, each coating layer was developed with the developer for 35 seconds. The developer was a mixture of 40 g of N-methylpyrrolidone, 10 g of aminoethanol, 25 g of methanol and 25 g of water. Each of the coating layer after the irradiation was dipped in this solution for the time period mentioned above, washed with deionized water, dried with an infrared lamp, and the resolution was observed. The thickness of each polyimide layer after drying at 90° C. for 30 minutes was 9 µm.

As for the through hole patterns in the coating polyimide layer, formation of through holes having sharp and circular sections having a diameter of 15 µm was confirmed. As for the line-and-space pattern, formation of images of lines having a width of 10 µm was confirmed.

EXAMPLE 90

A condenser tube with a ball, having a water separation trap, was mounted on a 1-liter separable three-necked flask equipped with an anchor-shaped stirrer made of stainless steel 26.66 g (60 mmol) of 6FDA, 17.3 g (40 mmol) of bis{4-(3-aminophenoxy)phenyl}sulfone, 7.21 g (20 mmol) of 9,10-bis(4-aminophenyl)anthraquinone (Wakayama Seika Co., Ltd., hereinafter referred to as "ADA"), 0.6 g (6 mmol) of γ-valerolactone, 1.0 g (12 mmol) of pyridine, 196 g of N-methylpyrrolidone and 30 g of toluene were added. After stirring the mixture at 180 rpm at room temperature under nitrogen atmosphere for 30 µminutes, the mixture was heated at 180° C. and stirred at 180 rpm for 2.50 hours. In the reaction, toluene-water azeotrope was removed.

The polymer concentration thus obtained was 20% by weight. The molecular weights based on polystyrene measured as in Example 1 were: Number Average Molecular Weight (Mn): 31,700; Weight Average Molecular Weight (Mw): 49,400; Z Average Molecular Weight (Mz): 72,400; Mw/Mn=1.56; Mz/Mn=2.29.

EXAMPLE 91

The procedure was run the same way as Example 90. 19.33 g (60 mmol) of BTDA, 17.3 g (40 mmol) of bis(4-(3-aminophenoxy)phenyl}sulfone, 7.21 g (20 mmol) of ADA, 0.6 g (6 mmol) of γ-valerolactone, 1.0 g (12 mmol) of pyridine, 236 g of N-methylpyrrolidone and 30 g of toluene were added. After stirring the mixture at 180 rpm at room temperature under nitrogen atmosphere for 30 minutes, the mixture was heated at 180° C. and stirred at 180 rpm for 2.5 hours. In the reaction, toluene-water azeotrope was removed.

The polymer concentration thus obtained was 15% by weight. The molecular weights based on polystyrene measured as in Example 1 were: Number Average Molecular Weight (Mn): 47,100; Weight. Average Molecular Weight (Mw): 135,600; Z Average Molecular Weight (Mz): 347,000; Mw/Mn=2.88; Mz/Mn=7.28.

EXAMPLE 92

(1) Preparation of Photosensitive Compositions

Photosensitive compositions were prepared by mixing the components shown in Table 31 below and filtering the mixtures through a filter having 3 µm diameter of

TABLE 31

|  | Composition | |
|---|---|---|
| Components | LVII | LVIII |
| Polyimide Solution | Example 90 | Example 91 |
| Weight | 15 g | 20 g |
| (Polyimide Content) | 3 g | 3 g |
| 1,2-naphthoquinone-2-diazide-5-sulfonic acid-o-cresol ester | 0.9 g | 0.9 g |

(2) Formation of Images

Each of the above-described photosensitive compositions (LVII and LVIII) was spin-coated on 5 cm diameter of a surface-treated copper foil (commercial product of Nippon Denkai, 18 µm thickness). Thereafter, the coated layer was dried at 90° C. for 10 minutes in an infrared oven. The thickness of this photosensitive layer was about 10 µm.

On this photosensitive layer, a test pattern (through holes and line-and-space pattern having diameters and widths of 10, 15, 20, 25, - - - , and 200 µm, respectively) for positive-type photomask was placed, and all of the layers were irradiated at a dose of exposure of at which images are obtained using 2 kW extra-high pressure mercury lamp apparatus (JP-2000G, commercial product of Oak Seisakusho). After irradiating the coating layer under the conditions shown in Table 32, each coating layer was developed with the developer under the conditions shown in Table 32.

TABLE 32

| Composition | LVII | LVIII |
|---|---|---|
| Dose of Irradiated UV Light (mJ) | 500 | 300 |
| Development Time (minute) | 3 | 6.3 |

The developer was a mixture of 40 g of N-methylpyrrolidone, 10 g of aminoethanol, 25 g of methanol and 25 g of water. Each of the coating layer after the irradiation was dipped in this solution for the time period mentioned above, washed with deionized water, dried with an infrared lamp, and the resolution was observed. The thickness of each polyimide coating membrane after drying at 90° C. for 30 minutes was 9 µm.

As for the through hole patterns in the coating polyimide layer, formation of through holes having sharp and circular sections having a diameter of 15 µm was confirmed. As for the line-and-space pattern, formation of images of lines having a width of 10 µm was confirmed.

EXAMPLE 93

The procedure was run as the same way as Example 90.

14.89 g (60 mol) of BTDA, 3.67 g (30 mmol) of 2,6-diaminotoluene, 0.9 g (9 mmol) of γ-valerolactone; 1.0 g (12 mmol) of pyridine, 100 g of N-methylpyrrolidone and 30 g of toluene were added. After stirring the mixture at 180 rpm at room temperature under nitrogen atmosphere for 30 minutes, the mixture was heated at 180° C. and stirred at 180 rpm for 1 hour. In the reaction, toluene-water azeotrope was removed.

After cooling the mixture at room temperature, 9.67 g (30 mmol) of BTDA, 12.98 g (30 mmol) of bis{4-(3-aminophenoxy)phenyl}sulfone, 10.82 g (30 mmol) of ADA, 95 g of N-methylpyrrolidone and 10 g of toluene were added. After stirring the mixture at 180 rpm at room temperature under nitrogen atmosphere for 60 minutes, the mixture was heated at 180° C. and stirred at 180 rpm for 2.15 hours; In the reaction, toluene-water azeotrope was removed. After the reaction, 100 g of N-methylpyrrolidone was added.

The polymer concentration thus obtained was 14% by weight. The molecular weights based on polystyrene measured as in Example 1 were: Number Average Molecular Weight (Mn): 18,600; Weight Average Molecular Weight (Mw): 80,700; Z Average Molecular Weight (Mz): 342,200; Mw/Mn=4.34; Mz/Mn=18.42.

EXAMPLE 94

(1) Preparation of Photosensitive Composition

A photosensitive composition was prepared by mixing 19 g of the polyimide solution obtained in Example 93 (polyimide content: 2.7 g) and 0.8 g of 1,2-naphthoquinone-2-diazide-5-sulfonic acid-o-cresol ester.

(2) Formation of Images

Images were formed using the photosensitive composition in the same manner as in Example 92 except that the dose of irradiated UV light was 300 mJ, the development time was 6 minutes, and that the developer was a mixture of 40 g of N-methylpyrrolidone, 10 g of aminoethanol, 25 of methanol and 25 of water. The coating layer after irradiation with UV light was dipped in this solution for the time period mentioned above, washed with deionized water, dried with an infrared lamp, and the resolution was observed. The thickness of this polyimide layer after drying at 90° C. for 30 minutes was 9 μm.

As for the through hole patterns in the coating polyimide layer, formation of through holes having sharp and circular sections having a diameter of 15 μm was confirmed. As for the line-and-space pattern, formation of images of lines having a width of 10 μm was confirmed.

EXAMPLE 95

The procedure was run the same way as Example 93.

14.89 g (40 mmol) of bicyclo(2,2,2)-oct-7-ene-2,3,5,6-tetracarboxylic dianhydride, 6.01 g (30 mmol) of 3,4'-diamino-biphenyl ether, 0.6 g (6 mmol) of γ-valerolactone, 1.0 g (12 mmol) of pyridine, 100 g of N-methylpyrrolidone and 30 g of toluene were added. After stirring the mixture at 180 rpm at room temperature under nitrogen atmosphere for 30 minutes, the mixture was heated at 180° C. and stirred at 180 rpm for 1 hour. In the reaction, toluene-water azeotrope was removed.

After cooling the mixture at room temperature, 13.33 g (30 mmol) of 6FDA, 21.26 g (41 mmol) of 2,2-bis{4-(3-aminophenoxy)phenyl}hexafluoropropane, 6.96 g (19 mmol) of ADA, 137 g of N-methylpyrrolidone and 10 g of toluene were added. After stirring the mixture at 180 rpm at room temperature under nitrogen atmosphere for 60 minutes, the mixture was heated at 180° C. and stirred at 180 rpm for 2.15 hours. In the reaction, toluene-water azeotrope was removed.

The polymer concentration thus obtained was 20% by weight. The molecular weights based on polystyrene measured by high performance liquid chromatography (commercial product of Tosoh Corporation) were: Number Average Molecular Weight (Mn): 62,100; Weight Average Molecular Weight (Mw): 35,000; Z Average Molecular Weight (Mz): 123,300; Mw/Mn=2.00; Mz/Mn=13.53.

EXAMPLE 96

(1) Preparation of Photosensitive Composition

A photosensitive composition was prepared as in Example 92 using the polyimide solution obtained in Example 95.

(2) Formation of Images

Images were formed using the photosensitive layer in the same manner as in Example 92 except that the dose of irradiated UV light was 300 mJ, the development time was 8.45 minutes, and that the developer was a mixture of 40 g of N-methylpyrrolidone, 10 g of aminoethanol, 25 of methanol and 25 of water. The photosensitive layer after irradiation with UV light was dipped in this solution for the time period mentioned above, washed with deionized water, dried with an infrared lamp, and the resolution was observed: The thickness of this polyimide layer after drying at 90° C. for 30 minutes was 9 μm.

As for the through hole patterns in the coating polyimide layer, formation of through holes having sharp and circular sections having a diameter of 15 μm was confirmed. As for the line-and-space pattern, formation of images of lines having a width of 10 μm was confirmed.

EXAMPLE 97

A condenser tube with a ball, having a water separation trap, was mounted on a one-liter separable three-necked flask equipped with an anchor-shaped stirrer made of stainless steel. The flask was dipped in a silicone bath to heat the flask under stirring and under nitrogen gas flow, 58.845 g (200 mol) of BPDA, 43.25 g (100 mmol) of bis-{4-(3-aminophenoxy)phenylsulfone (commercial product of Wakayama Seika Co., Ltd.), 51.85 g (100 mmol) of 2,2-bis{4-(3-aminophenoxy)phenyl}hexafluoropropane (commercial product of Wakayama Seika Co., Ltd.), 2.0 g (20 mmol) of γ-valerolactone, 3.2 g (40 mmol) of pyridine, 587 g of N-methylpyrrolidone and 50 g of toluene were added. After stirring the mixture at 200 rpm at room temperature under nitrogen atmosphere for 30 minutes, the mixture was heated at 180° C. (bath temperature) and stirred at 180 rpm for 3 hours. While removing the toluene-water azeotrope accumulated in the trap, the reaction completed.

The polymer concentration thus obtained was 20% by weight. The molecular weights based on polystyrene measured as in Example 1 were: Number Average Molecular Weight (Mn): 52,600; Weight Average Molecular Weight (Mw): 80,300; Z Average Molecular Weight (Mz): 105,800; Mw/Mn=1.53; Mz/Mn=2.01.

EXAMPLE 98

The procedure was run the same way as Example 1.

A condenser tube with a ball, having a water separation trap, was mounted on a 0.5L separable three-necked flask equipped with an anchor-shaped stirrer made of stainless steel. In the flask, 26.48 g (90 mmol) of BPDA, 12.98 g (30 mmol) of bis{4-(4-aminophenoxy)phenyl}sulfone, 14.90 g (60 mmol) of 4,4'-diaminodiphenylsulfone, 1.0 g (10 mmol) of γ-valerolactone, 1.7 g (20 mmol) of pyridine, 205 g of N-methylpyrrolidone and 50 g of toluene were added. After stirring the mixture at 180 rpm at room temperature under nitrogen atmosphere for 30 minutes, the mixture was heated at 180° C. and stirred at 180 rpm for 3 hours. In the reaction, toluene-water azeotrope was removed., The polymer concentration thus obtained was 20% by weight. The molecular weights based on polystyrene measured as in Example 1 were: Number Average Molecular Weight (Mn): 18,700; Weight Average Molecular Weight (Mw): 29,300; Z Average Molecular Weight.(Mz): 39,700; Mw/Mn=1.52; Mz/Mn=2.13.

EXAMPLE 99

The procedure was run the same way as Example 97.

26.48 g (90 mmol) of BPDA, 12.32 g (30 mmol) of 2,2-bis-4(4'-aminophenoxy)phenylpropane (commercial product of Wakayama Seika Co., Ltd.), 14.90 g (60 mmol) of 4,4'-diaminodiphenylsulfone, 1.0 g (10 mmol) of γ-valerolactone, 1.2 g (15 mmol) of pyridine, 182 g of N-methylpyrrolidone and 40 g of toluene were added. After stirring the mixture at 180 rpm at room temperature under nitrogen atmosphere for 30 minutes, the mixture was heated at 180° C. and stirred at 180 rpm for 3 hours. In the reaction, toluene-water azeotrope was removed.

The polymer concentration thus obtained was 20% by weight. The molecular weights based on polystyrene measured as in Example 1 were: Number Average Molecular Weight (Mn): 33,300; Weight Average Molecular Weight (Mw): 43,400; Z Average Molecular Weight (Mz): 55,400; Mw/Mn=1.30; Mz/Mn=1.66.

EXAMPLE 100

The procedure was run the same way as Example 97.

96.67 g (300 mmol) of BPDA, 47.58 g (110 mmol) of bis{4-(3-aminophenoxy)phenyl}sulfone, 178 g (200 mmol) of bis(3,3'-diaminopropyl)silane (commercial product of Shin-etsu Chemical Co., Ltd., amine equivalent: 890), 3.28 g (20 mmol) of 5-norbornane-2,3-dicarboxylic dianhydride, 3.0 g (30 mmol) of γ-valerolactone, 4.0 g (50 mmol) of pyridine, 473 g of N-methylpyrrolidone and 100 g of toluene were added. After stirring the mixture at 180 rpm at room temperature under nitrogen atmosphere for 30 minutes, the mixture was heated at 180° C. and stirred at 180rpm for 5.5 hours. In the reaction, toluene-water azeotrope was removed. After the reaction, 73 g of benzyl alcohol was added.

The polymer concentration thus obtained was 40% by; weight. The molecular weights based on polystyrene measured as in Example 1 were: Number Average Molecular Weight (Mn): 22,800; Weight Average Molecular Weight (Mw): 41,400; Z Average Molecular Weight (Mz): 67,000; Mw/Mn=1.81; Mz/Mn=2.44.

EXAMPLE 101

The procedure was run the same way as Example 1.

13.09 g (60 mmol) of pyromellitic dianhydride, 14.89 g (60 mmol) of bicyclo(2,2,2)-oct-7-ene-2,3,5,6-tetracarboxylic dianhydride (commercial product of Aldrich), 61.9 g (120 mmol) of bis-4-{(3-aminophenoxy) phenyl}sulfone, 1.2 g (12 mmol) of γ-valerolactone, 1.12 g (24 mmol) of pyridine, 302 g of N-methylpyrrolidone and 50 g of toluene were added. After stirring the mixture at 180 rpm at room temperature under nitrogen atmosphere for 30 minutes, the mixture was heated at 180° C. and stirred at 180 rpm for 3.75 hours. In the reaction, toluene-water azeotrope was removed.

The polymer concentration thus obtained was 20% by weight. The molecular weights based on polystyrene measured as in Example 1 were: Number Average Molecular Weight (Mn): 71,100; Weight Average Molecular Weight (Mw): 113,600; Z Average Molecular Weight (Mz): 167,200; Mw/Mn=1.60; Mz/Mn=2.35.

EXAMPLE 102

(1) Preparation of Photosensitive Compositions

Photosensitive compositions were prepared by mixing the components shown in Table 33 below and filtering the mixtures through a filter having 3 μm diameter of pores.

TABLE 33

| Components | Composition | | | | |
|---|---|---|---|---|---|
| | LIX | LX | LXI | LXII | LXIII |
| Polyimide Solution | Ex. 97 | Ex. 98 | Ex. 99 | Ex. 100 | Ex. 101 |
| Weight | 15 g | 15 g | 15 g | 7.5 g | 15 g |
| (Polyimide Content) | 3 g | 3 g | 3 g | 3 g | 3 g |
| naphthoquinone diazide-1,2,5-o-cresol ester | 0.9 g | 0.9 g | 0.9 g | 0.9 g | 0.9 g |

(2) Formation of Images

Each of the above-described 5 photosensitive compositions was spin-coated on 5 cm diameter of a surface-treated copper foil (commercial product of Nippon Denkai, 18 μm thickness). Thereafter, the coated layer was dried at 90° C. for 10 minutes in an infrared oven. The thickness of this photosensitive layer was about 10 μm.

On this photosensitive coating layer, a test pattern (through holes and line-and-space pattern having diameters and widths of 10, 15, 20, 25, - - -, and 200 μm, respectively) for positive-type photomask was placed, and the coating layer was irradiated at a dose of exposure at which images are obtained shown in Table 34 below using 2 kW extra-high pressure mercury lamp apparatus (JP-2000G, commercial product of Oak Seisakusho).

TABLE 34

| Composition | LIX | LX | LXI | LXII | LXIII |
|---|---|---|---|---|---|
| Dose of Irradiated UV Light (mJ) | 300 | 500 | 500 | 300 | 200 |
| Development Time (minute) | 4.5 | 3.15 | 2.3 | 6.3 | 1.1 |

The developer was a mixture of 40 g of N-methylpyrrolidone, 10 g of aminoethanol, 25 g of methanol and 25 g of water. Each of the coating layer after irradiation with UV light was dipped in this solution for the time period mentioned above, washed with deionized water, dried with an infrared lamp, and the resolution was observed. The thickness of this polyimide layer after drying at 90° C. for 30 minutes was 9 μm.

As for the through hole patterns in the coating polyimide layer, formation of through holes having sharp and circular sections having a diameter of 15 μm was confirmed. As for the line-and-space pattern, formation of images of lines having a width of 10 μm was confirmed.

This polyimide coating layer was heated with infrared light at 150° C. for 30 minutes. After this heat treatment, the thickness of the membrane was 8 μm, so that the thickness was not substantially changed. The polyimide coating layer was then heated with infrared light at 260° C. for 30 minutes, and the thickness of the layer became 6 μm. The adhesion between the polyimide layer and the copper foil was evaluated by cross cut test. The coating layer was cross cut with a knife such that each lattice had a size of 1 mm×1 mm and was tried to peeled off with a cellophane-tape. As a result, 100/100 lattices remained adhered (no lattices peeled off), so that the adhesion between the polyimide layer and the copper foil was sufficiently high, which can be used in practice.

EXAMPLE 103

The procedure was run the same way as Example 97.

38.62 g (120 mmol) of BTDA, 7.33 g (60 mmol) of diaminotoluene, 1.8 g (18 mmol) of γ-valerolactone, 2.4 g (36 mmol) of pyridine, 100 g of N-methylpyrrolidone and 30 g of toluene were added. After stirring the mixture at 180 rpm at room temperature under nitrogen atmosphere for 30 minutes, the mixture was heated at 180° C. and stirred at 80 rpm for 1 hour. In the reaction, toluene-water azeotrope was removed.

After cooling the mixture at room temperature, 12.32 g (30 mmol) of bis-4-{(3-aminophenoxy)phenyl}sulfone, 12.96 g (30 mmol) of 2,2-bis-4(4'-aminophenoxy) phenylpropane, 94 g of N-methylpyrrolidone and 20 g of toluene were added. After stirring the mixture at 180 rpm at room temperature under nitrogen atmosphere for 30 minutes, the mixture was heated at 180° C. and stirred at 180 rpm for 2.8 hours. In the reaction, toluene-water azeotrope was removed.

The polymer concentration thus obtained was 25% by weight. The molecular weights based on polystyrene measured as in Example 1 were: Number Average Molecular Weight (Mn): 36,000; Weight Average Molecular Weight (Mw): 158,800; Z Average Molecular Weight (Mz): 559,200; Mw/Mn=4.40; Mz/Mn=15.52.

EXAMPLE 104

The procedure was run the same way as Example 103.

Under nitrogen gas flow, 38.67 g (120 mmol) of BTDA, 25.95 g (60 mmol) of bis-4-{(3-aminophenoxy)phenyl}sulfone, 1.8 g (18 mmol) of γ-valerolactone, 2.9 g (36 mmol) of pyridine, 200 g of N-methylpyrrolidone and 40 g of toluene were added to the flask. After stirring the mixture at 180 rpm at room temperature under nitrogen atmosphere for 30 minutes, the mixture was heated at 180° C. and stirred at 180 rpm for 1 hour. In the reaction, toluene-water azeotrope was removed.

After cooling the mixture at room temperature, 17.65 g (60 mmol) of BPDA, 12.01 g (60 mmol) of 3,4'-diaminodiphenyl ether, 24.63 g (60 mmol) of 2,2-bis-4(4'-aminophenoxy)phenylpropane, 250 g of N-methylpyrrolidone and 20 g of toluene were added. After stirring the mixture at 180 rpm at room temperature under nitrogen atmosphere for 30 minutes, the mixture was heated at 180° C. and stirred at 180 rpm for 3 hours. In the reaction, toluene-water azeotrope was removed.

The polymer concentration thus obtained was 25% by weight. The molecular weights based on polystyrene measured by high performance liquid chromatography (commercial product of Tosoh. Corporation) were: Number Average Molecular Weight (Mn): 39,700; Weight Average Molecular Weight (Mw): 113,800; Z Average Molecular Weight (Mz): 270,000; Mw/Mn=2.86; Mz/Mn=6.80.

EXAMPLE 105

The procedure was run the same way as Example 103.

Under nitrogen gas flow, 48.34 g (150 mmol) of BTDA, 9.165 g (75 mmol) of 2,4-diaminotoluene, 1.5 g (15 mmol) of γ-valerolactone, 1.78 g (30 mmol) of pyridine, 130 g of N-methylpyrrolidone and 70 g of toluene were added to the flask. After stirring the mixture at 180 rpm at room temperature under nitrogen atmosphere for 30 minutes, the mixture was heated at 180° C. and stirred at 180 rpm for 1.3 hours. In the reaction, toluene-water azeotrope was removed.

After cooling the mixture at room temperature, 32.44 g (75 mmol) of bis-4-{(3-aminophenoxy)phenyl}sulfone, 67 g of N-methylpyrrolidone and 40 g of toluene were added. After stirring the mixture at 180 rpm at room temperature under nitrogen atmosphere for 30 minutes, the mixture was heated at 180° C. and stirred at 180 rpm for 4.5 hours. In the reaction, toluene-water azeotrope was removed. After the reaction, 52 g of N-methylpyrrolidone was added.

The polymer concentration thus obtained was 25% by weight. The molecular weights based on polystyrene measured by high performance liquid chromatography (commercial product of Tosoh Corporation) were: Number Average Molecular Weight (Mn): 21,900; Weight Average Molecular Weight (Mw): 59,000; Z Average Molecular Weight (Mz): 146,600; Mw/Mn=2.70; Mz/Mn=6.71.

EXAMPLE 106

(1) Preparation of Photosensitive Compositions

Photosensitive compositions were prepared by mixing the components shown in Table 35 below and filtering the mixtures through a filter having 3 μm diameter of pores.

TABLE 35

| | Composition | | |
|---|---|---|---|
| Components | LXIV | LXV | LXVI |
| Polyimide Solution | Example 103 | Example 104 | Example 105 |
| Weight | 20 g | 20 g | 20 g |
| (Polyimide Content) | 5 g | 5 g | 5 g |
| naphthoquinone diazide-1,2,5-o-cresol ester | 1.5 g | 1.5 g | 1.5 g |

(2) Formation of Images

Each of the above-described 3 photosensitive compositions was spin-coated on 5 cm diameter of a surface-treated copper foil (commercial product of Nippon Denkai, 18 μm thickness). Thereafter, the coated layer was dried at 90° C. for 10 minutes in an infrared oven. The thickness of this photosensitive layer was about 10 μm.

On this photosensitive coating layer, a test pattern (through holes and line-and-space pattern having diameters and widths of 10, 15, 20, 25, - - - , and 200 μm, respectively) for positive-type photomask was placed, and all of the coating layers were irradiated at a dose of exposure of at which images are obtained, that is, irradiated with 300 mJ of UV using 2 kW extra-high pressure mercury lamp apparatus (JP-2000G, commercial product of Oak Seisakusho). Thereafter, each coating layer was developed in the developer for 2.0 minutes (Composition LXIV), 2.8 minutes (Composition LXV) and 0.15 minutes (Composition LXVI). The developer was a mixture of 40 g of N-methylpyrrolidone, 25 g of aminoethanol, 25 g of methanol and 10 g of water. Each of the coating layer after the irradiation was dipped in this solution for the time period mentioned above, washed with deionized water, dried with an infrared lamp, and the resolution was observed. The thickness of each polyimide layer after drying at 90° C. for 30 minutes was 9 μm.

As for the through hole patterns in the coating polyimide layer, formation of through holes having sharp and circular sections having a diameter of 15 μm was confirmed. As for the line-and-space pattern, formation of images of lines having a width of 10 μm was confirmed with Compositions F and G, and formation of images of lines having a width of 15 μm was confirmed with Composition H.

EXAMPLE 107

A condenser tube with a ball, having a water separation trap, was mounted on a one-liter separable three-necked flask equipped with an anchor-shaped stirrer made of stainless steel. Under nitrogen gas flow, in the flask, 6.44 g (20 mmol) of BTDA, 6.09 g (40 mmol) of 3,5-diaminobenzoic acid (hereinafter referred to as "DABZ"), 0.6 g (6 mmol) of γ-valerolactone, 3.2 g (40 mmol) of pyridine, 60 g of, N-methylpyrrolidone and 30 g of toluene were added. After stirring the mixture at 200 rpm at room temperature under nitrogen atmosphere for 30 minutes, the mixture was heated at 180° C. and stirred at 180 rpm for 3 hours. In the reaction, toluene-water azeotrope was removed. Then 192 g of N-methylpyrrolidone was added.

After cooling the mixture at room temperature, 17.77g (40 mmol) of 6FDA, 10.37 g (20 mmol) of 2,2-bis{4-(4-aminophenoxy)phenyl}hexafluoropropane, 94 g of N-methylpyrrolidone and 10 g of toluene were added. After stirring the mixture at 180 rpm at room temperature under nitrogen atmosphere for 0.5 hours, the mixture was heated at 180° C. and stirred at 180 rpm for 2.7 hours. In the reaction, toluene-water azeotrope was removed.

Further, after cooling the mixture at room temperature, 3.8 g (40 mmol) of morpholine and 10 g of N-methylpyrrolidone were added and the mixture was stirred for 30 minutes, followed by stirring the mixture at 130° C. at 130 rpm for 1 hour to carry out the reaction.

The polymer concentration thus obtained was 10% by weight. The molecular weights based on polystyrene measured by high performance liquid chromatography (commercial product of.Tosoh Corporation) were: Number Average Molecular Weight (Mn): 13,400; Weight Average Molecular Weight (Mw): 23,700; Z Average Molecular Weight (Mz): 37,300; Mw/Mn=1.77; Mz/Mn=2.79.

By making the reaction time of the second step longer than 2.7 hours, the Mw became not less than 50,000.

EXAMPLE 108

The procedure was run the same way as Example 107.

6.44 g (20 mmol) of BTDA, 6.09 g (40 mmol) of DABZ, 0.6 g (6 mmol) of γ-valerolactone, 3.2 g (40 mmol) of pyridine, 60 g of N-methylpyrrolidone and 30 g of toluene were added. After stirring the mixture at 180 rpm at room temperature under nitrogen atmosphere for 30 minutes, the mixture was heated at 180° C. and stirred at 180 rpm for 1 hour. In the reaction, toluene-water azeotrope was removed.

After cooling the mixture at room temperature, 12.89 (40 mmol) of BTDA, 8.21 g (20 mmol) of2,2-bis{4-(4-aminophenoxy)phenyl}propane, 223 g of N-methylpyrrolidone and 10 g of toluene were added. After stirring the mixture at 180 rpm at room temperature under nitrogen atmosphere for 0.5 hours, the mixture was heated at 180° C. and stirred at 180 rpm for 2.7 hours. In the reaction, toluene-water azeotrope was removed.

Further, after cooling the mixture at room temperature, 4.41 g (44 mmol) of N-methylpiperazine and 10 g of N-methylpyrrolidone were added and the mixture was stirred for 30 minutes, followed by stirring the mixture at 120° C. at 120 rpm for 1 hour to carry out the reaction.

The polymer concentration thus obtained was 10% by weight. Since this polyimide was not soluble in dimethylformamide, the molecular weight thereof could not be measured.

EXAMPLE 109

(1) Preparation of Photosensitive Compositions

A photosensitive composition LXVII (Example 107) and a photosensitive composition LXVIII (Example 108) were prepared by mixing 30 g of the polyimide solution obtained in Example 107 or 108 (the polyimide content in both solutions was 3 g) with 0.9 g of 1,2-naphthoquinone-2-diazide-5-sulfonic acid-o-cresol ester.

(2) Formation of Images

Each of the above-described 2 photosensitive compositions was spin-coated on 5 cm diameter of a surface-treated copper foil (commercial product of Nippon Denkai, 18 μm thickness). Thereafter, the coated layer was dried at 90° C. for 10 minutes in an infrared hot air dryer., The thickness of this photosensitive layer was about 10 μm.

On this photosensitive coating layer, a test pattern (through holes and line-and-space pattern having diameters and widths of 10, 15, 20, 25, - - -, and 200 μm, respectively) for positive-type photomask was placed, and all of the coating layers were irradiated at a dose of exposure of at which images are obtained using 2 kW extra-high pressure mercury lamp apparatus (JP-2000G, commercial product of Oak Seisakusho).

Composition LXVII was irradiated with 500 mJ and then developed under the following conditions. The developer was a mixture of 40 g of N-methylpyrrolidone, 10 g of aminoethanol, 25 g of methanol and 25 g of water. The coating layer after the irradiation was dipped in this solution for 3 minutes, washed with deionized water, dried with an infrared lamp, and the resolution was observed. The thickness of each polyimide layer after drying at 90° C. for 30 minutes was 9 μm.

As for the through hole patterns in the coating polyimide layer, formation of through holes having sharp and circular sections having a diameter of 15 μm was confirmed. As for the line-and-space pattern, formation of images of lines having a width of 10 μm was confirmed.

Composition LXVIII was irradiated with 500 mJ and then developed under the following conditions. The developer was a mixture of 40 g of N-methylpyrrolidone, 10 g of aminoethanol, 25 g of methanol and 25 g of water. The coating layer after the irradiation was dipped in this solution for 1.5 minutes, washed with deionized water, dried with an infrared lamp, and the resolution was observed. The thickness of each polyimide layer after drying at 90° C. for 30 minutes was 9 μm.

As for the through hole patterns in the coating polyimide layer, formation of through holes having sharp and circular sections having a diameter of 10 μm was confirmed. As for the line-and-space pattern, formation of images of lines having a width of 10 μm was confirmed.

EXAMPLE 110

The procedure was run the same way as Example 107.

17.77 g (40 mmol) of 6FDA, 3.04 g (20 mmol) of DABZ, 6.01 g (30 mmol) of 4,4'-diaminodiphenyl ether, 0.8 g (8 mmol) of γ-valerolactone, 1.3 g (16 mmol) of pyridine, 107 g of N-methylpyrrolidone and 25 g of toluene were added. After stirring the mixture at 180 rpm at room temperature under nitrogen atmosphere for 30 minutes, the mixture was heated at 180° C. and stirred at 180 rpm for 2 hours: In the reaction, toluene-water azeotrope was removed.

The polymer concentration thus obtained was 20% by weight. The molecular weights based on polystyrene measured as in Example 1 were: Number Average Molecular Weight (Mn): 14,800; Weight Average Molecular Weight (Mw): 25,400; Z Average Molecular Weight (Mz): 62,500; Mw/Mn=1.71; Mz/Mn=4.21.

EXAMPLE 111

(1) Preparation of Photosensitive Composition

A photosensitive composition was prepared by mixing; 15 g of the polyimide solution obtained in Example 110 (polyimide content: 3 g) with 0.9 g of 1,2-naphthoquinone-2-diazide-5-sulfonic acid-o-cresol ester.

(2) Formation of Images

The photosensitive composition prepared in (1) was spin-coated on 5 cm diameter of a surface-treated copper foil (commercial product of.Nippon Denkai, 18 m thickness). Thereafter, the coated layer was dried at 90° C. for 10 minutes in an infrared oven. The thickness of this photosensitive layer was about 10 $\mu$m.

On this photosensitive layer, a test pattern (through holes and line-and-space pattern having diameters and widths of 10, 15, 20, 25, - - - , and 200 $\mu$m, respectively) for positive-type photomask was placed, and all of the coating layers were irradiated at a dose of exposure of at which images are obtained using 2 kW extra-high pressure mercury lamp apparatus (JP-2000G, commercial product of Oak Seisakusho).

The photosensitive layer was irradiated with 300 mJ and then developed under the following conditions. The developer was a mixture of 30 g of aminoethanol, 50 g of ethanol and 15 g of water. The coating layer after the, irradiation was dipped in this solution for 1.25 minutes, washed with deionized water, dried with an infrared lamp, and the resolution was observed. As a result, although the sharpness was little bit poor, images corresponding to the pattern were observed.

The photosensitive layer was also irradiated with 500 mJ and then developed under the following conditions. The developer was a mixture of 40 g of N-methylpyrrolidone, 10 g of aminoethanol, 25 g of ethanol and 1.5 g of water. The coating layer after the irradiation was dipped in this solution for 2.5 minutes, washed with deionized water, dried with an infrared lamp, and the resolution was observed. As a result, although the sharpness was little bit poor, images corresponding to the pattern were observed.

EXAMPLE 112

The procedure was run the same way as Example 107.

24.82 g (100 mmol) of bicyclo-(2,2,2)-oct-7-ene-2,3,5,6-tetracarboxylic dianhydride, 7.61 g (50 mmol) of DABZ; 1.5 g (15 mmol) of γ-valerolactone, 2.4 g (30 mmol) of pyridine, 120 g of N-methylpyrrolidone and 30 g of toluene were added. After stirring the mixture at 180 rpm at room temperature under nitrogen atmosphere for 30 minutes, the mixture was heated at 180° C. and stirred at 180 rpm for 1 hour. In the reaction, toluene-water azeotrope was removed.

After cooling the mixture at room temperature, 14.71 g (50 mmol) of 3,4,3',4'-biphenyltetracarboxylic dianhydride, 10.01 g (50 mmol) of 3,4'-diaminodiphenyl ether, 20.53 g (50 m mol) of 2,2-bis-{4-(4-aminophenoxy)phenylpropane, 109 g of N-methylpyrrolidone and 30 g of toluene were added. After stirring the mixture at 180 rpm at room temperature under nitrogen atmosphere for 0.5 hours, the mixture was heated at 180° C. and stirred at 180 rpm for 2 hours. In the reaction, toluene-water azeotrope was removed.

The polymer concentration thus obtained was 20% by weight. The molecular weights based on polystyrene measured as in Example 1 were: Number Average Molecular Weight (Mn): 46,700; Weight Average Molecular Weight (Mw): 102,600; Z Average Molecular Weight (Mz): 82,400; Mw/Mn=2.20; Mz/Mn=3.90.

EXAMPLE 113

(1) Preparation of Photosensitive Composition

A photosensitive composition was prepared by mixing 15 g of the polyimide solution obtained in Example 112 (polyimide, content: 3 g) with 0.9 g of 1,2-naphthoquinone-2-diazide-5-sulfonic acid-o-cresol ester.

(2) Formation of Images

The photosensitive composition prepared in (1) was spin-coated on 5 cm diameter of a surface-treated copper foil (commercial product of Nippon Denkai, 18 $\mu$m thickness). Thereafter, the coated layer was dried at 90° C. for 10 minutes in an infrared oven. The thickness of this photosensitive layer was about 10 $\mu$m.

On this photosensitive layer, a test pattern (through holes and line-and-space pattern having diameters and widths of 10, 15, 20, 25, - - - , and 200 $\mu$m, respectively) for positive-type photomask was placed, and all of the coating layers were irradiated at a dose of exposure of at which images are obtained using 2 kW extra-high pressure mercury lamp apparatus (JP-2000G, commercial product of Oak Seisakusho).

The photosensitive layer was irradiated with 300 mJ and then developed under the following conditions. The developer was a mixture of 30 g of aminoethanol, 50 g of ethanol and 15 g of water. The coating layer after the irradiation was dipped in this solution for 6 minutes, washed with deionized water, dried with an infrared lamp, and the resolution was observed. As a result, although the sharpness was little bit poor, images corresponding to the pattern were observed.

EXAMPLE 114

The procedure was run the same way as Example 110.

11.11 g (50 mmol) of BTDA, 3.80 g of DABZ, 10.81 g (25 mmol) of bis{4-(3-aminophenoxy)phenyl}sulfone, 1.0 g (10 mmol) of γ-valerolactone, 2.9 g (30 mmol) of pyridine, 106 g of N-methylpyrrolidone and 30 g of toluene were added. After stirring the mixture at 180 rpm at room temperature under nitrogen atmosphere for30 minutes, the mixture was heated at 180° C. and stirred at 180 rpm for 3 hours. In the reaction, toluene-water azeotrope was removed.

After cooling the mixture at room temperature, 2.61 g (30 mmol) of morpholine and 210 g of N-methylpyrrolidone were added. After stirring the mixture at 180 rpm at room temperature under nitrogen atmosphere for 0.5 hours, the mixture was heated at 160° C. and stirred at 180 rpm for 1 hour. In the reaction, toluene-water azeotrope was removed.

The polymer concentration thus obtained was 20% by weight. The molecular weights based on polystyrene measured as in Example 1 were: Number Average Molecular Weight (Mn): 13,100; Weight Average Molecular Weight (Mw): 22,400; Z Average Molecular Weight (Mz): 36,700; Mw/Mn=1.71; Mz/Mn=2.65.

EXAMPLE 115

The procedure was run the same way as Example 1.

29.00 g (90 mmol) of BTDA, 6.85 g (45 mmol) of DABZ, 19.46 g (45 mmol) of bis{4-(3-aminophenoxy)phenyl}sulfone, 0.9 g (9 mmol) of γ-valerolactone, 3.6 g (45 mmol) of pyridine, 208 g of N-methylpyrrolidone and 30 g of toluene were added. After stirring the mixture at 180 rpm at room temperature under nitrogen atmosphere for 30 minutes, the mixture was heated at 180° C. and stirred at 180 rpm for 2 hours. In the reaction, toluene-water azeotrope was removed.

After cooling the mixture at room temperature, 5.41 g (54 mmol) of N-methylpiperizine and 10 g of toluene were added. The mixture was stirred at 160 rpm at room temperature under nitrogen atmosphere for 1.3 hours. In the reaction, toluene-water azeotrope was removed.

The polymer concentration thus obtained was 20% by weight. The molecular weights based on polystyrene measured as in Example 1 were: Number Average Molecular Weight (Mn): 5200; Weight Average Molecular Weight (Mw): 8900; Z Average Molecular Weight (Mz): 13,000; Mw/Mn=1.71; Mz/Mn=2.50.

EXAMPLE 116

(1) Preparation of Photosensitive Compositions

A photosensitive composition LXIX (Example 114) and a photosensitive composition LXX (Example 115) were prepared by mixing 15 g of the polyimide solution obtained in Example 114 or 115 (the polyimide content in both solutions was 3 g) with 0.9 g of 1,2-naphthoquinone-2-diazide-5-sulfonic acid-o-cresol ester.

(2) Formation of Images

Each of the above-described 2 photosensitive compositions was spin-coated on 5 cm diameter of a surface-treated copper foil (commercial product of Nippon Denkai, 18 μm thickness). Thereafter, the coated layer was dried at 90° C. for 10 minutes in an infrared oven. The thickness of this photosensitive layer was about 10 μm.

On this photosensitive layer, a test pattern (through holes and line-and-space pattern having diameters and widths of 10, 15, 20, 25, - - - , and 200 μm, respectively) for positive-type photomask was placed, and all of the coating layer were irradiated at a dose of exposure of at which images are obtained using 2 kW extra-high pressure mercury lamp apparatus (JP-2000G, commercial product of Oak Seisakusho).

Each of these layers was irradiated with 300 mJ and then developed under the following conditions. The developer was a mixture of 30 g of aminoethanol, 50 g of ethanol and 15 g of water. The coating layers made of Composition LXIX after the irradiation was dipped in this solution for 15 seconds, and Composition LXX after the irradiation was dipped in this solution for 2.5 minutes. Each of the coating layers was then washed with deionized water, dried with an infrared lamp, and the resolution was observed.

As for the through hole patterns in the coating polyimide layer, formation of through holes having sharp and circular sections having a diameter of 15 μm was confirmed. As for the line-and-space pattern, formation of images of lines having a width of 15 μm was confirmed.

EXAMPLE 117

The procedure was run the same way as Example 107.

96.67 g (300 mmol) of BTDA, 22.82 g (150 mmol) of DABZ, 64.88 g (150 mmol) of bis{4-(3-aminophenoxy)phenyl}sulfone, 3.0 g (30 mmol) of γ-valerolactone, 12 g (150 mmol) of pyridine, 405 g of N-methylpyrrolidone and 50 g of toluene were added. After stirring the mixture at 180 rpm at room temperature under nitrogen atmosphere for 30 minutes, the mixture was heated at 180° C. and stirred at 180 rpm for 2.7 hours. In the reaction, toluene-water azeotrope was removed.

The polymer concentration thus obtained was 30% by weight. The molecular weights based on polystyrene measured as in Example 1 were: Number Average Molecular Weight (Mn): 20,100; Weight Average Molecular Weight (Mw): 42,700; Z Average Molecular Weight (Mz): 19,800; Mw/Mn=2.12; Mz/Mn=3.97.

EXAMPLE 118

(1) Preparation of Photosensitive Composition

A photosensitive composition was prepared by mixing 10 g of the polyimide solution obtained in Example 117 (polyimide content: 3 g) with 0.9 g of 1,2-naphthoquinone-2-diazide-5-sulfonic acid-o-cresol ester.

(2) Formation of Images

The photosensitive composition prepared in (1) was spin-coated on 5 cm diameter of a surface-treated copper foil (commercial product of Nippon Denkai, 18 μm thickness). Thereafter, the coated layer was dried at 90° C. for 10 minutes in an infrared oven. The thickness of this photosensitive layer was about 10 μm.

On this photosensitive layer, a test pattern (through holes and line-and-space pattern having diameters and widths of 10, 15, 20, 25, - - - , and 200 μm, respectively) for positive-type photomask was placed, and all of the coating membranes were irradiated at a dose of exposure of at which images are obtained using 2 kW extra-high pressure mercury lamp apparatus (JP-2000G, commercial product of Oak Seisakusho).

The photosensitive layer was irradiated with 300 mJ and then developed under the following conditions. The developer was a mixture of 30 g of aminoethanol, 50 g of ethanol and 15 g of water. The coating layer after the irradiation was dipped in this solution for 6.5 minutes, washed with deionized water, dried with an infrared lamp, and the resolution was observed.

The through hole pattern obtained with this polyimide coating layer was little bit poor in contrast, but images corresponding to the pattern were observed.

INDUSTRIAL AVAILABILITY

As described above, according to the present invention, the solvent-soluble polyimides obtained by the direct polycondensation of aromatic dianhydrides and aromatic diamines in the presence of an acid catalyst gave very good image resolutions by irradiating the polyimides in the presence of a photoacid generator. In cases where the photosensitive polyimide of the present invention is used as a heat resistant insulative membrane, the polyimide having a molecular weight of 25,000 to 200,000 is made into insulative membranes having high temperature heat resistance, electric insulation and adhesiveness, so that it can be widely used in the field of production of semiconductors and electronic parts.

What is claimed is:

1. Positive-type photosensitive polyimide compositions comprising a photoacid generator and a solvent-soluble polyimide (excluding those having phenolic hydroxyl group, carboxyl group, thiophenol group, or sulfonic acid group, or a derivative of any of said groups which yields any of said groups by action of said photoacid generator) which shows positive photosensitivity in the presence of said photoacid generator, wherein said polyimide is formed by polycondensation between one or more tetracarboxylic dianhydrides and one or more aromatic diamines, wherein one of the aromatic diamine components is dialkyl-diamino-biphenyl sulfone.

2. The composition according to claim 1, wherein said polyimide contains a photosensitive aromatic diamine and/or an aromatic diamine which is made soluble in an alkali by an acid generated by photolysis.

3. The composition according to claim 2, wherein said photosensitive aromatic diamine is at least one selected from the group consisting of 4,4'-diaminodiphenyl sulfone, 3,3'-diaminodiphenyl sulfone, bis{4,4-aminophenoxy)phenyl}sulfone, bis{4-(3-aminophenoxy)phenyl}sulfone, o-tolidine sulfone, 4,4'-diaminodiphenyl sulfide, 4,4'-diaminodiphenyl disulfide, 4,4'-diaminobenzophenone 3,3'-diaminobenzophenone, 1,5-diaminoanthraquinone, 2-nitro-1,4-diaminobenzene, 3,3'-dinitro-4,4'-diaminobiphenyl, 1,5-diaminonaphthalene, 9,9-bis(4-aminophenyl)fluorene and 9,10-bis(4-aminophenyl)anthracene.

4. The composition according to any one or claims 1 to 3, wherein said polyimide contains at least one aromatic diamine component selected from the group consisting of 4,4'-diaminodiphenyl ether, 3,4'-diaminodiphenyl ether, bis(4-phenoxy)1,4-benzene, bis(3-phenoxy)1,4-benzene, bis(3-phenoxy)1,3-benzene, 2,2-bis(4-aminophenyl)propane, 1,1,1,3,3,3-hexafluoro-2-bis(4-aminophenyl)propane, 4,4'-diaminodiphenylmethane, bis(4-aminophenoxy)4,4'-diphenyl, 2,2-bis{(4-aminophenoxy)phenyl}propane 2,2-bis{(4-aminophenoxy)phenyl}hexafluoropropane, 1,3-diaminobenzene, 1,4-diaminobenzene, 2,4-diaminotoluene, 3,3'-dimethyl-4,4'-diaminobiphenyl, 2,2'-bis(trifluoromethyl)benzidine, α,α-bis(4-aminophenyl)-1,4-diisopropylbenzene, bis(4-aminophenoxy)-1,3-(2,2-dimethyl)propane and diaminosiloxane.

5. The composition according to claim 4, wherein said polyimide contains as an acid component at least one acid component selected from the group consisting of 3,4,3',4'-benzophenone tetracarboxylic dianhydride, 3,4,3',4,-biphenyltetracarboxylic dianhydride, pyromellitic dianhydride 2,3,3',4'-biphenyl ether tetracarboxylic dianhydride, 1,2,5,6-naphthalene carboxylic dianhydride, 2,3,5,6-pyridine tetracarboxylic dianhydride, biphenyl sulfone tetracarboxylic dianhydride, bicyclo(2,2,2)-oct-ene-2,3,5,6-tetracarboxylic dianhydride and 4,4'-{2,2,2-trifluoro-1-(trifluoromethyl)ethylidene}bis(1,2-benzenedicarboxylic dianhydride).

6. The composition according to any one of claims 1 to 3, wherein said polyimide contains at least one acid component selected from the group consisting of 3,4,3',4'-benzophenone tetracarboxylic dianhydride, 3,4,3',4'-biphenyltetracarboxylic dianhydride, pyromellitic dianhydride 2,3,3',4'-biphenyl ether tetracarboxylic dianhydride, 1,2,5,6-naphthalene carboxylic dianhydride, 2,3,5,6-pyridine tetracarboxylic dianhydride, 3,4,3',4'-biphenyl sulfone tetracarboxylic dianhydride, bicyclo(2,2,2)-oct-7-ene-2,3,5,6-tetracarboxylic dianhydride and 4,4'-{2,2,2-trifluoro-1-(trifluoromethyl)ethylidene}bis(1,2-benzenedicarboxylic dianhydride).

7. The composition according to claim 1, wherein said dialkyl-diamino-biphenyl sulfone is 3,3'-dimethyl-4,4'-diamino-biphenyl sulfone.

8. The composition according to any one of claims 1 to 3, wherein said polyimide contains 9,9-bis(aminophenyl) fluorene and/or 9,9-bis(aminoalkyl-phenyl)fluorene as one of the aromatic diamine components.

9. The composition according to claim 8, wherein said 9,9-bis(aminophenyl)fluorene and/or 9,9-bis(aminoalkyl-phenyl)fluorene is 9,9-bis(4-aminophenyl)fluorene and/or 9,9-bis(3-methyl-4-aminophenyl)fluorene.

10. The composition according to any one of claims 1 to 3, wherein said polyimide contains diaminopyridine and/or diaminoacridinium as one of the aromatic diamine components.

11. The composition according to claim 10, wherein said diaminopyridine and/or diaminoacridinium is 2,6-diaminopyridine and/or acriflavine.

12. The composition according to any one of claims 1 to 3, wherein said polyimide contains 1,5-diaminoanthraquinone as one of the aromatic diamines.

13. The composition according to any one of claims 1 to 3, wherein said polyimide contains one or more diphenyl sulfide groups in its polyimide main chain.

14. The composition according to claim 13, wherein said diphenyl sulfide group is the diphenyl sulfide group in 4,4'-diaminodiphenyl sulfide.

15. The composition according to any one of claims 1 to 3, wherein said polyimide contains one or more diphenyl disulfide groups in its polyimide main chain.

16. The composition according to claim 15, wherein said diphenyl disulphide group is the diphenyl disulphide group in 4,4'-diaminodiphenyl disulfide.

17. The composition according to any one of claims 1 to 3, wherein said polyimide contains as one of aromatic diamine components, 9,10-bis(4-aminophenyl)anthracene in its polyimide chain.

18. The composition according to any one of claims 1 to 3, wherein said polyimide contains an aromatic diamine having one or more biphenyl sulfone groups in its polyimide chain.

19. The composition according to claim 18, wherein said aromatic diamine having one or more biphenyl sulfone groups is at least one selected from the group consisting of 3,3'-diaminodiphenyl sulfone, 4,4'-diaminodiphenyl sulfone, bis-{4-(3-aminophenoxy)biphenyl}sulfone and bis-{4-(4-aminophenoxy)-biphenyl}sulfone.

20. The composition according to claim 2 or 3, wherein said polyimide is composed of not less than 3 components.

21. The composition according to any one of claims 1 to 3, wherein said photoacid generator is a quinone diazide compound.

22. The composition according to any one of claims 1 to 3, which is in the form of a solution of said polyimide dissolved in a solvent, which solution contains said polyimide at a concentration of not less than 5% by weight.

23. A positive-type photosensitive resin film prepared by making said composition according to claim 22 in the form of film.

24. The polyimide contained in said composition according to any one of claims 2 to 3.

25. The composition according to claim 1, wherein said polyimide contains as an aromatic diamine component one aromatic diamine component selected from the group consisting of 4,4'-diaminodiphenyl ether, 3,4'-diaminodiphenyl ether, bis(4-phenoxy)1,4-benzene, bis(3-phenoxy)1,4-benzene, bis(3-phenoxy)1,3-benzene, 2,2-bis(4-aminophenyl)propane, 1,1,1,3,3,3-hexafluoro-2-bis(4-aminophenyl)propane, 4,4'-diaminodiphenylmethane, bis(4-aminophenoxy)4,4'-diphenyl, 2,2-bis{(4-aminophenoxy)phenyl}propane, 2,2-bis{(4-aminophenoxy)phenyl}hexafluoropropane, 1,3-diaminobenzene, 1,4-diaminobenzene, 2,4-diaminotoluene, 3,3'-dimethyl-4,4'-diaminobiphenyl, 2,2'-bis(trifluoromethyl)benzidine, α,α'-bis(4-aminophenyl)-1,4-diisopropylbenzene, bis(4-aminophenoxy)-1,3-(2,2-dimethyl)propane and diaminosiloxane;

wherein said polyimide has a weight average molecular weight in terms of polystyrene of 25,000 to 400,000, and has a thermal decomposition-starting temperature of not lower than 450° C.

26. The composition according to claim 25, wherein said polyimide contains as an acid component at least one selected from the group consisting of 3,4,3',4'-benzophenone tetracarboxylic dianhydride, 3,4,3',4'-biphenyltetracarboxylic dianhydride, pyromellitic dianhydride 2,3,3',4'-biphenyl ether tetracarboxylic dianhydride, 1,2,5,6-naphthalene carboxylic dianhydride, 2,3,5,6-pyridine tetracarboxylic dianhydride, 3,4,3',4'-biphenyl sulfone tetracarboxylic dianhydride, bicyclo(2,2,2)-oct-7-ene-2,3,5,6-tetracarboxylic dianhydride and 4,4'-{2,2,2-trifluoro-1-(trifluoromethyl)ethylidene}bis(1,2-benzenedicarboxylic dianhydride).

27. The composition according to claim 25 or 26, wherein said weight average molecular weight is, 30,000 to 200,000.

28. The composition according to claim 25 or 26, wherein said photoacid generator is a quinone diazide compound.

29. The composition according to claim 25 or 26, which is in the form of a solution of said polyimide dissolved in a solvent, which solution contains said polyimide at a concentration of not less than 5% by weight.

30. Positive-type photosensitive polyimide compositions comprising a photoacid generator and a solvent-soluble polyimide (excluding those having phenolic hydroxyl group, carboxyl group, thiophenol group, or sulfonic acid group, or a derivative of any of said groups which yields any of said groups by action of said photoacid generator) which shows positive photosensitivity in the presence of said photoacid generator, wherein said polyimide is formed by polycondensation between one or more tetracarboxylic dianhydrides and one or more aromatic diamines, wherein one of the aromatic diamine components is a nitro aromatic diamine.

31. The composition according to claim 30, wherein said nitro aromatic diamine component is 1,4-diamino-2-nitrobenzene and/or 3,3'-dinitro-4,4'-diaminobiphenyl.

32. Positive-type photosensitive polyimide compositions comprising a photoacid generator and a solvent-soluble polyimide (excluding those having phenolic hydroxyl group, carboxyl group, thiophenol group, or sulfonic acid group, or a derivative of any of said groups which yields any of said groups by action of said photoacid generator) which shows positive photosensitivity in the presence of said photoacid generator, wherein said polyimide is formed by polycondensation between one or more tetracarboxylic dianhydrides and one or more aromatic diamines, wherein said polyimide contains 1,4-bis-(3-aminopropyl)piperazine together with an aromatic diamine in its polyimide main chain.

33. Positive-type photosensitive polyimide compositions comprising a photoacid generator and a solvent-soluble polyimide (excluding those having phenolic hydroxyl group, carboxyl group, thiophenol group, or sulfonic acid group, or a derivative of any of said groups which yields any of said groups by action of said photoacid generator) which shows positive photosensitivity in the presence of said photoacid generator, wherein said polyimide is formed by polycondensation between one or more tetracarboxylic dianhydrides and one or more aromatic diamines, wherein said polyimide contains 3,9-bis(3-aminopropyl)-2,4,8,10-tetraoxaspiro-(5, 5)-undecane together with an aromatic diamine in its polyimide main chain.

34. Positive-type photosensitive polyimide compositions comprising a photoacid generator and a solvent-soluble polyimide (excluding those having phenolic hydroxyl group, carboxyl group, thiophenol group, or sulfonic acid group, or a derivative of any of said groups which yields any of said groups by action of said photoacid generator) which shows positive photosensitivity in the presence of said photoacid generator,
wherein said polyimide is formed by polycondensation between one or more tetracarboxylic dianhydrides and one or more aromatic diamines, and
said composition is obtained by heating and dehydrating an acid dianhydride and an aromatic diamine at a molar ratio of 1.05 to 0.95 in a polar solvent in the presence of an acid catalyst generated by reaction between a lactone and a base.

35. The composition according to claim 34, wherein said lactone is γ-valerolactone and said base is pyridine and/or methylmorpholine.

36. The composition according to claim 34, wherein said polyimide is a block copolymer having a molar ratio of total aromatic diamines to total tetracarboxylic anhydrides of 1.05 to 0.95, which is obtained by two-step polycondensation including preparing a polyimide oligomer by reaction between an aromatic diamine as a diamine component and a tetracarboxylic anhydride as an acid component wherein one of said aromatic diamine or said tetracarboxylic anhydride is used in excess, and when preparing said polyimide by adding said aromatic diamine and/or said tetracarboxylic anhydride.

37. The composition according to claim 36, wherein said block copolymer polyimide is formed by polycondensation using lactone-base as a catalyst, which polyimide is in the form of a solution dissolved in a polar solvent at a concentration of not less than 5% by weight, which polyimide has an average molecular weight of 25,000 to 400,000.

38. Positive-type photosensitive polyimide compositions comprising a photoacid generator and a solvent-soluble polyimide (excluding those having phenolic hydroxyl group, carboxyl group, thiophenol group, or sulfonic acid group, or a derivative of any of said groups which yields any of said groups by action of said photoacid generator) which shows positive photosensitivity in the presence of said photoacid generator, wherein said polyimide is formed by polycondensation between one or more tetracarboxylic dianhydrides and one or more aromatic diamines, and said polyimide has a weight average molecular weight in terms of polystyrene of 25,000 to 400,000, and has a thermal decomposition-starting temperature of not lower than 450° C.

39. The composition according to claim 38, wherein said weight average molecular weight is 30,000 to 200,000.

40. Positive-type photosensitive polyimide compositions comprising a photoacid generator and a solvent-soluble polyimide (excluding those having phenolic hydroxyl group, carboxyl group, thiophenol group, Or sulfonic acid group, or a derivative of any of said groups which yields any of said groups by action of said photoacid generator) which shows positive photosensitivity in the presence of said photoacid generator, wherein said polyimide is formed by polycondensation between one or more tetracarboxylic dianhydrides and one or more aromatic diamines, wherein one of the aromatic diamine components is dialkyl-diamino-biphenyl sulfone, and wherein said positive-type photosensitive polyimide compositions contains said photoacid generator in an amount of 10 to 50% by weight based on the weight of said polyimide.

41. A polyimide insulation film having a pattern which is prepared by:
coating said composition according to claim 22 on a substrate,
drying the composition, exposing an image pattern on the composition to irradiation of light or electron beam, and removing the exposed regions with an alkaline developing solution.

42. A method for forming a polyimide insulation film pattern comprising:

coating said composition according to claim 22 on a substrate, drying the composition, exposing an image pattern on the composition to irradiation of light or electron beam having a wavelength of 250 to 450 nm, and removing the exposed regions with an alkaline developing solution.

43. The method according to claim 4, wherein said alkaline solution is aminoalcohol.

44. A positive-type photosensitive resin film prepared by making said composition according to claim 37 in the form of film.

45. A polyimide insulation film having a pattern, which is prepared by:

coating said composition according to claim 37 on a substrate, drying the composition, exposing an image pattern on the composition to irradiation of light or electron beam, and removing the exposed regions with an alkaline developing solution.

46. A method for forming a polyimide insulation film pattern comprising:

coating said composition according to claim 37 on a substrate, drying the composition, exposing an image pattern on the composition to irradiation of light or electron beam, and removing the exposed regions with an alkaline developing solution.

* * * * *

UNITED STATES PATENT AND TRADEMARK OFFICE
CERTIFICATE OF CORRECTION

PATENT NO. : 6,627,377 B1  Page 1 of 1
DATED : September 30, 2003
INVENTOR(S) : Itatani et al.

It is certified that error appears in the above-identified patent and that said Letters Patent is hereby corrected as shown below:

<u>Title page,</u>
Item [30], should read ,

-- [30]  Foreign Application Priority Data,
Oct 13, 1997    (JP)………………….09-315781
Oct. 16, 1997   (JP)………………….09-320266
Dec. 2, 1997    (JP)………………….09-365491
Dec. 22, 1997   (JP)………………….09-370187
Nov. 17, 1997   (JP)…..“09-352987” -- 09-353987 --
Nov. 17, 1997   (JP)……………….....09-353988
Nov. 25, 1997   (JP)……………….. 09-363044
Nov. 25, 1997   (JP)………………. 09-363045
Nov. 26, 1997   (JP)………………...09-363378
Jan. 5, 1998    (JP)………………..10-31933
Mar. 16, 1998   (JP)………………..10-108410 --

Signed and Sealed this

Twenty-third Day of March, 2004

JON W. DUDAS
*Acting Director of the United States Patent and Trademark Office*